United States Patent
Oshima et al.

(10) Patent No.: US 9,537,081 B2
(45) Date of Patent: Jan. 3, 2017

(54) PIEZOELECTRIC MATERIAL, PIEZOELECTRIC ELEMENT, MULTILAYERED PIEZOELECTRIC ELEMENT, LIQUID DISCHARGE HEAD, LIQUID DISCHARGE APPARATUS, ULTRASONIC MOTOR, OPTICAL APPARATUS, VIBRATORY APPARATUS, DUST REMOVING DEVICE, IMAGE PICKUP APPARATUS, AND ELECTRONIC EQUIPMENT

(71) Applicant: CANON KABUSHIKI KAISHA, Tokyo (JP)

(72) Inventors: Kanako Oshima, Tokyo (JP); Hiroshi Saito, Kawasaki (JP); Tatsuo Furuta, Machida (JP); Takanori Matsuda, Chofu (JP); Shunsuke Murakami, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/439,342

(22) PCT Filed: Oct. 23, 2013

(86) PCT No.: PCT/JP2013/079335
§ 371 (c)(1),
(2) Date: Apr. 29, 2015

(87) PCT Pub. No.: WO2014/069493
PCT Pub. Date: May 8, 2014

(65) Prior Publication Data
US 2015/0295160 A1    Oct. 15, 2015

(30) Foreign Application Priority Data
Nov. 2, 2012 (JP) ................. 2012-242895

(51) Int. Cl.
*H01L 41/18* (2006.01)
*B32B 18/00* (2006.01)
(Continued)

(52) U.S. Cl.
CPC ............. *H01L 41/18* (2013.01); *B06B 1/06* (2013.01); *B32B 18/00* (2013.01); *B41J 2/14072* (2013.01);
(Continued)

(58) Field of Classification Search
CPC .... H01L 41/18; C04B 35/49; C04B 35/63416; C04B 35/6342; C04B 35/63424
(Continued)

(56) References Cited

U.S. PATENT DOCUMENTS

2005/0095851 A1*  5/2005  Watanabe ............. C04B 35/465
                                                438/663
2009/0207551 A1*  8/2009  Suzuki ................. C01G 23/002
                                                361/301.4
(Continued)

FOREIGN PATENT DOCUMENTS

EP      734031 A2    9/1996
EP      2178131 A2   4/2010
(Continued)

OTHER PUBLICATIONS

M. Jiang, et al., Effects of MnO2 and sintering temperature on microstructure, ferroelectric, and piezoelectric properties of Ba0.85Ca0.15Ti0.90Zr0.10O3 lead-free ceramics. Journal of Materials (2013) 48:1035-1041.*

*Primary Examiner* — Jaydi San Martin
(74) *Attorney, Agent, or Firm* — Canon U.S.A. Inc., IP Division

(57) ABSTRACT

To provide a lead-free piezoelectric material having a high and stable piezoelectric constant in a wide operating tem-
(Continued)

perature range. The piezoelectric material contains a perovskite type metal oxide having the general formula (1), Mn, Mg, $$(Ba_{1-x}Ca_x)_a(Ti_{1-y-z}Sn_yZr_z)O_3 \quad (1)$$

(wherein x is in the range of $0.050 \leq x \leq 0.200$, y is in the range of $0.010 \leq y \leq 0.040$, and z is in the range of $0 \leq z \leq 0.040$, provided that $x \geq 0.375(y+z)+0.050$, and a is in the range of $0.9925+b \leq a \leq 1.0025+b$)

wherein the amount b (mol) of Mn on a metal basis per mole of the metal oxide is in the range of $0.0048 \leq b \leq 0.0400$, and the Mg content on a metal basis per 100 parts by weight of the metal oxide is 0.100 parts by weight or less.

29 Claims, 15 Drawing Sheets

(51) Int. Cl.

| | |
|---|---|
| *C04B 35/468* | (2006.01) |
| *C04B 35/49* | (2006.01) |
| *C04B 35/634* | (2006.01) |
| *H01L 41/43* | (2013.01) |
| *H01L 41/083* | (2006.01) |
| *H01L 41/09* | (2006.01) |
| *H01L 41/187* | (2006.01) |
| *H01L 41/273* | (2013.01) |
| *H02N 2/10* | (2006.01) |
| *H02N 2/16* | (2006.01) |
| *B41J 2/14* | (2006.01) |
| *B06B 1/06* | (2006.01) |
| *G02B 7/04* | (2006.01) |
| *G02B 27/00* | (2006.01) |
| *H01L 41/047* | (2006.01) |
| *H02N 2/00* | (2006.01) |
| *B08B 7/02* | (2006.01) |

(52) U.S. Cl.
CPC ........ *B41J 2/14201* (2013.01); *C04B 35/4682* (2013.01); *C04B 35/49* (2013.01); *C04B 35/6342* (2013.01); *C04B 35/63416* (2013.01); *C04B 35/63424* (2013.01); *G02B 7/04* (2013.01); *G02B 27/0006* (2013.01); *H01L 41/0477* (2013.01); *H01L 41/083* (2013.01); *H01L 41/0973* (2013.01); *H01L 41/1871* (2013.01); *H01L 41/273* (2013.01); *H01L 41/43* (2013.01); *H02N 2/001* (2013.01); *H02N 2/106* (2013.01); *H02N 2/163* (2013.01); *B08B 7/028* (2013.01); *C04B 2235/3206* (2013.01); *C04B 2235/3208* (2013.01); *C04B 2235/3215* (2013.01); *C04B 2235/3236* (2013.01); *C04B 2235/3248* (2013.01); *C04B 2235/3267* (2013.01); *C04B 2235/3281* (2013.01); *C04B 2235/3293* (2013.01); *C04B 2235/3418* (2013.01); *C04B 2235/421* (2013.01); *C04B 2235/444* (2013.01); *C04B 2235/449* (2013.01); *C04B 2235/5445* (2013.01); *C04B 2235/604* (2013.01); *C04B 2235/6025* (2013.01); *C04B 2235/662* (2013.01); *C04B 2235/72* (2013.01); *C04B 2235/768* (2013.01); *C04B 2235/77* (2013.01); *C04B 2235/782* (2013.01); *C04B 2235/786* (2013.01); *C04B 2235/79* (2013.01); *C04B 2237/346* (2013.01); *C04B 2237/348* (2013.01)

(58) Field of Classification Search
USPC .................................. 310/358; 252/62.9 PZ
See application file for complete search history.

(56) References Cited

U.S. PATENT DOCUMENTS

| | | | |
|---|---|---|---|
| 2010/0220427 A1 | 9/2010 | Symes, Jr. | |
| 2013/0088120 A1* | 4/2013 | Hayashi | B08B 7/026 310/311 |
| 2013/0250417 A1* | 9/2013 | Ohashi | H01L 41/43 359/507 |
| 2013/0278681 A1* | 10/2013 | Saito | H01L 41/1871 347/68 |
| 2014/0184876 A1* | 7/2014 | Tanaka | B41J 2/14233 348/335 |
| 2014/0184878 A1* | 7/2014 | Watanabe | B41J 2/14201 348/340 |
| 2015/0015121 A1* | 1/2015 | Watanabe | B41J 2/14233 310/365 |
| 2015/0015643 A1* | 1/2015 | Oshima | B41J 2/14233 347/44 |
| 2015/0349236 A1* | 12/2015 | Furuta | B41J 2/14233 348/208.11 |
| 2015/0349666 A1* | 12/2015 | Ifuku | H01L 41/257 310/323.06 |

FOREIGN PATENT DOCUMENTS

| | | | |
|---|---|---|---|
| JP | 4039029 B2 | | 5/2003 |
| JP | 2010120835 A | | 6/2010 |
| JP | 2013032267 A | * | 2/2013 |
| JP | 2013241326 A | * | 12/2013 |
| WO | 2009/061627 A1 | | 5/2009 |
| WO | 2012/070667 A1 | | 5/2012 |
| WO | 2013/005701 A1 | | 1/2013 |

* cited by examiner

PIEZOELECTRIC MATERIAL, PIEZOELECTRIC ELEMENT, MULTILAYERED PIEZOELECTRIC ELEMENT, LIQUID DISCHARGE HEAD, LIQUID DISCHARGE APPARATUS, ULTRASONIC MOTOR, OPTICAL APPARATUS, VIBRATORY APPARATUS, DUST REMOVING DEVICE, IMAGE PICKUP APPARATUS, AND ELECTRONIC EQUIPMENT

TECHNICAL FIELD

The present invention relates to a piezoelectric material and more particularly to a lead-free piezoelectric material and a method for manufacturing the lead-free piezoelectric material. The present invention also relates to a piezoelectric element, a multilayered piezoelectric element, a liquid discharge head, a liquid discharge apparatus, an ultrasonic motor, an optical apparatus, a vibratory apparatus, a dust removing device, an image pickup apparatus, and electronic equipment, each including the piezoelectric material.

BACKGROUND ART

In general, piezoelectric materials are $ABO_3$ perovskite type metal oxides, such as lead zirconate titanate (hereinafter referred to as "PZT"). However, PZT contains lead as an A site element, and its effect on the environment is regarded as a problem. Thus, there is a demand for piezoelectric materials of lead-free perovskite type metal oxides.

One known piezoelectric material of a lead-free perovskite type metal oxide is barium titanate. In order to improve the characteristics of barium titanate, materials based on barium titanate are being developed.

PTL 1 discloses a piezoelectric material containing barium titanate, wherein the A site of the barium titanate is partly substituted by Ca. PTL 2 discloses a material containing the piezoelectric material and Mn, Fe, or Cu, wherein the A site of the barium titanate is partly substituted by Ca. These materials have a higher mechanical quality factor than barium titanate but disadvantageously have a poor piezoelectric property.

CITATION LIST

Patent Literature

PTL 1 Japanese Patent No. 4039029
PTL 2 Japanese Patent Laid-Open No. 2010-120835

SUMMARY OF INVENTION

Technical Problem

The present invention addresses these problems and provides a lead-free piezoelectric material having a high and stable piezoelectric constant and a high mechanical quality factor in a wide operating temperature range.

The present invention also provides a piezoelectric element, a multilayered piezoelectric element, a liquid discharge head, a liquid discharge apparatus, an ultrasonic motor, an optical apparatus, a vibratory apparatus, a dust removing device, an image pickup apparatus, and electronic equipment, each including the piezoelectric material.

A piezoelectric material according to one aspect of the present invention contains a perovskite type metal oxide having the following general formula (1), a first auxiliary component Mn, and a second auxiliary component Mg, wherein the amount b (mol) of Mn on a metal basis per mole of the perovskite type metal oxide is in the range of $0.0048 \leq b \leq 0.0400$, and the Mg content on a metal basis per 100 parts by weight of the perovskite type metal oxide is 0.100 parts by weight or less (except 0 parts by weight).

$(Ba_{1-x}Ca_x)_a(Ti_{1-y-z}Sn_yZr_z)O_3$       (1)

(wherein x is in the range of $0.050 \leq x \leq 0.200$, y is in the range of $0.010 \leq y \leq 0.040$, and z is in the range of $0 \leq z \leq 0.040$, provided that $x \geq 0.375(y+z)+0.050$, and a is in the range of $0.9925+b \leq a \leq 1.0025+b$, provided that b is in the range of $0.0048 \leq b \leq 0.0400$)

A piezoelectric element according to one aspect of the present invention includes a first electrode, a piezoelectric material, and a second electrode, wherein the piezoelectric material is the piezoelectric material described above.

A multilayered piezoelectric element according to one aspect of the present invention includes piezoelectric material layers and electrode layers alternately stacked on top of one another. The electrode layers include an internal electrode. The piezoelectric material layers are formed of the piezoelectric material described above.

A liquid discharge head according to one aspect of the present invention includes a liquid chamber and a discharge port in communication with the liquid chamber. The liquid chamber has a vibrating unit that includes the piezoelectric element or the multilayered piezoelectric element described above.

A liquid discharge apparatus according to one aspect of the present invention includes a recording medium conveying unit and the liquid discharge head described above.

An ultrasonic motor according to an embodiment of the present invention includes a vibrating member and a moving body in contact with the vibrating member. The vibrating member includes a piezoelectric element or a multilayered piezoelectric element according to an embodiment of the present invention.

An optical apparatus according to one aspect of the present invention includes a drive unit that includes the ultrasonic motor described above.

A vibratory apparatus according to one aspect of the present invention includes a vibrating member that includes the piezoelectric element or the multilayered piezoelectric element described above.

A dust removing device according to one aspect of the present invention includes a vibrating unit that includes the vibratory apparatus described above disposed on a diaphragm.

An image pickup apparatus according to one aspect of the present invention includes the dust removing device described above and an image pickup element unit, wherein the diaphragm of the dust removing device and a light-receiving surface of the image pickup element unit are disposed on the same axis, and the dust removing device faces the light-receiving surface of the image pickup element unit.

Electronic equipment according to one aspect of the present invention includes a piezoelectric acoustic component that includes the piezoelectric element or the multilayered piezoelectric element described above.

DESCRIPTION OF EMBODIMENTS

Figure 1:
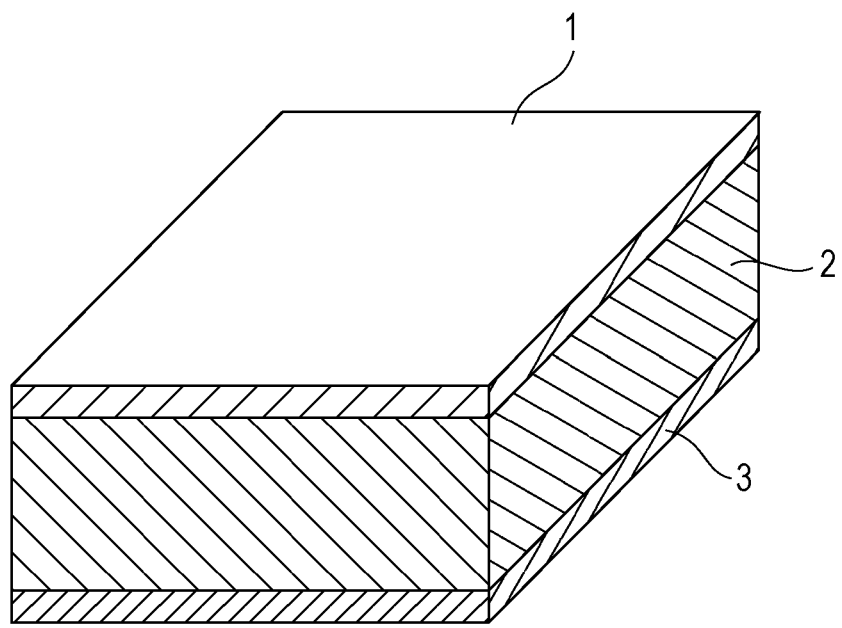
FIG. 1 is a schematic view of a piezoelectric element according to an embodiment of the present invention.

Embodiments of the present invention will be described below.

A piezoelectric material according to one aspect of the present invention contains a perovskite type metal oxide having the following general formula (1), a first auxiliary component Mn, and a second auxiliary component Mg, wherein the amount b (mol) of Mn on a metal basis per mole of the perovskite type metal oxide is in the range of $0.0048 \leq b \leq 0.0400$, and the Mg content on a metal basis per 100 parts by weight of the perovskite type metal oxide is 0.100 parts by weight or less (except 0 parts by weight).

$$(Ba_{1-x}Ca_x)_a(Ti_{1-y-z}Sn_yZr_z)O_3 \quad (1)$$

(wherein x is in the range of $0.050 \leq x \leq 0.200$, y is in the range of $0.010 \leq y \leq 0.040$, and z is in the range of $0 \leq z \leq 0.040$, provided that $x \geq 0.375(y+z)+0.050$, and a is in the range of $0.9925+b \leq a \leq 1.0025+b$, provided that b is in the range of $0.0048 \leq b \leq 0.0400$)

(Perovskite Type Metal Oxide)

The term "perovskite type metal oxide", as used herein, refers to a metal oxide having a perovskite structure, which is ideally a cubic structure, as described in Iwanami Rika-gaku Jiten, 5th edition (Iwanami Shoten, published on Feb. 20, 1998). A metal oxide having a perovskite structure is generally represented by the chemical formula $ABO_3$. In a perovskite type metal oxide, elements A and B in the form of ions occupy particular positions of a unit cell referred to as the A site and the B site, respectively. For a cubic unit cell, the element A occupies the vertexes of the cube, and the element B occupies the body-centered position of the cube. The element O as an oxygen anion occupies the face-centered positions of the cube.

In the metal oxide having the general formula (1), the metallic elements at the A site are Ba and Ca, and the metallic elements at the B site are Ti, Zr, and Sn. Part of Ba and Ca may occupy the B site. Likewise, part of Ti and Zr may occupy the A site. However, Sn should not occupy the A site because this impairs the piezoelectric property.

In the general formula (1), although the molar ratio of the B site element to the element O is 1:3, small variations in the molar ratio (for example, 1.00:2.94 to 1.00:3.06) are within the scope of the present invention, provided that the metal oxide has the perovskite structure as the primary phase.

The perovskite structure of the metal oxide can be determined by structural analysis using X-ray diffraction or electron diffraction.

(Main Component of Piezoelectric Material)

In a piezoelectric material according to an embodiment of the present invention, the value a of the general formula (1), which represents the ratio of the number of moles of Ba and Ca at the A site to the number of moles of Ti, Zr, and Sn at the B site, is in the range of $0.9925+b \leq a \leq 1.0025+b$. b denotes the number of moles of the first auxiliary component Mn on a metal basis per mole of the perovskite type metal oxide. b is in the range of $0.0048 \leq b \leq 0.0400$. When the value a is smaller than $0.9925+b$, this tends to result in abnormal grain growth in the piezoelectric material and a decrease in the mechanical strength of the material. When the value a is larger than $1.0025+b$, this results in an excessively high grain growth temperature, making sintering of the material impossible in common furnaces. The phrase "making sintering of the material impossible" means that the piezoelectric material has a low density or contains many pores and defects. Most of the first auxiliary component Mn occupies the B site. An increase in the value b representing the Mn content results in an increase in the total amount of metallic element(s) at the B site, which requires a corresponding increase in the value a.

The value y of the general formula (1), which represents the molar ratio of Sn at the B site, is in the range of $0.010 \leq y \leq 0.040$. A value y of less than 0.010 results in a reduced piezoelectric property. A value y of more than 0.040 results in a low Curie temperature ($T_c$) of less than 100° C. and a reduced piezoelectric property at high temperatures. $0.015 \leq y \leq 0.035$ is more preferred.

The value z of the general formula (1), which represents the molar ratio of Zr at the B site, is in the range of $0 \leq z \leq 0.040$. A value z of more than 0.040 undesirably results in high sintering temperature.

The value z of the general formula (1), which represents the molar ratio of Zr at the B site, may be zero. The following general formula (2) represents a perovskite type metal oxide having the general formula (1) in which z=0, that is, containing no Zr.

  (2)

(wherein x is in the range of 0.050≤x≤0.200, and y is in the range of 0.010≤y≤0.040, provided that x≥0.375y+0.050, and a is in the range of 0.9925+b≤a≤1.0025+b, provided that b is in the range of 0.0048≤b≤0.0400)

A value z of zero results in a high grain growth rate during sintering. This can advantageously reduce the sintering temperature. A piezoelectric material according to an embodiment of the present invention may contain Zr inevitably contained in a commercially available raw material for Ti.

The value x of the general formula (1), which represents the molar ratio of Ca at the A site, is in the range of 0.050≤x≤0.200. A value x of less than 0.050 results in structural phase transition at an operating temperature, thereby adversely affecting the durability of the piezoelectric material in operation. A value x of more than 0.200 results in a reduced piezoelectric property. 0.080≤x≤0.170 is more preferred.

The value x of the general formula (1), which represents the molar ratio of Ca at the A site, satisfies x≥0.375(y+z)+ 0.050. An increase in the sum of the Sn molar ratio y and the Zr molar ratio z at the B site results in a high occurrence of structural phase transition at an operating temperature. Thus, x must be increased with an increase in (y+z). A value x of less than 0.375(y+z)+0.050 results in structural phase transition at an operating temperature, thereby adversely affecting the durability of the piezoelectric material in operation.

The value x of the general formula (2), which represents the molar ratio of Ca at the A site, satisfies x≥0.375y+0.050. A higher Sn molar ratio y at the B site results in a higher occurrence of structural phase transition at an operating temperature. Thus, x must be increased with increasing y. A value x of less than 0.375y+0.050 results in structural phase transition at an operating temperature, thereby adversely affecting the durability of the piezoelectric material in operation.

The composition of a piezoelectric material according to an embodiment of the present invention may be determined by any method, such as X-ray fluorescence spectroscopy, ICP spectroscopy, or atomic absorption spectrometry. The weight ratio and the composition ratio of the elements of the piezoelectric material can be determined by using any of these methods.

(First Auxiliary Component of Piezoelectric Material)

The first auxiliary component is Mn. The amount b (mol) of Mn on a metal basis per mole of the perovskite type metal oxide is in the range of 0.0048≤b≤0.0400, preferably 0.01≤b≤0.03. A piezoelectric material according to an embodiment of the present invention containing Mn in this range has an improved mechanical quality factor without reduction in the piezoelectric constant. The term "mechanical quality factor", as used herein, refers to a coefficient that represents elastic loss resulting from vibration in the evaluation of a piezoelectric material as an oscillator. The mechanical quality factor is observed as the sharpness of a resonance curve in impedance measurement. Thus, the mechanical quality factor is a coefficient that represents the sharpness of resonance of an oscillator. An improvement in insulation property or mechanical quality factor ensures long-term reliability of the piezoelectric material when the piezoelectric material is driven as a piezoelectric element by the application of a voltage.

A value b of less than 0.0048 results in a low mechanical quality factor of less than 400. A low mechanical quality factor disadvantageously results in an increase in the power consumption of a resonance device that includes a piezoelectric element composed of the piezoelectric material and a pair of electrodes. The mechanical quality factor is preferably 400 or more, more preferably 600 or more. In this range, no excessive increase in power consumption occurs in practical operation. A value b of more than 0.0400 may unfavorably result in a reduced piezoelectric property or the occurrence of hexagonal crystals, which do not contribute to the piezoelectric property.

Mn can occupy only the B site. Mn can have a valence of 4+. In general, Mn can have a valence of 4+, 2+, or 3+. In the presence of conduction electrons in crystals (for example, in the presence of oxygen vacancies in crystals or in the presence of donor elements occupying the A site), Mn having a valence of 4+ can trap the conduction electrons and improve insulation resistance by reducing its valence to 3+ or 2+. In terms of the ionic radius, Mn having a valence of 4+ can easily substitute for the main component Ti of the B site.

Mn having a valence of less than 4+, such as 2+, acts as an acceptor. The presence of Mn as an acceptor in perovskite crystals results in the formation of holes or oxygen vacancies in the crystals.

When most of Mn in the piezoelectric material has a valence of 2+ or 3+, holes cannot be compensated for with oxygen vacancies alone, and the insulation resistance decreases. Thus, Mn can mostly have a valence of 4+. A minor proportion of Mn may have a valence of less than 4+ and occupy the B site of the perovskite structure as an acceptor or form oxygen vacancies. Mn having a valence of 2+ or 3+ and oxygen vacancies can form defect dipoles and thereby improve the mechanical quality factor of a piezoelectric material.

(Second Auxiliary Component of Piezoelectric Material)

The second auxiliary component is Mg. The Mg content on a metal basis is 0.100 parts by weight or less (except 0 parts by weight) per 100 parts by weight of the metal oxide.

A piezoelectric material according to an embodiment of the present invention containing Mg in this range has a significantly improved mechanical quality factor without reduction in the piezoelectric constant. When the Mg content is more than 0.100 parts by weight on a metal basis per 100 parts by weight of the metal oxide, this unfavorably results in a mechanical quality factor as low as less than 400. A piezoelectric material containing no Mg also unfavorably has a poor piezoelectric property. In order to improve the mechanical quality factor and the piezoelectric constant, the Mg content is preferably 0.050 parts by weight or less (except 0 parts by weight), more preferably 0.010 parts by weight or less.

Mg is not limited to metal Mg and may be contained in the piezoelectric material as a Mg component of any form. For example, Mg may be dissolved in the A or B site or may be contained in grain boundaries. The piezoelectric material may contain a Mg component in the form of metal, ion, oxide, metal salt, or complex.

(Third Auxiliary Component of Piezoelectric Material)

A piezoelectric material according to an embodiment of the present invention contains a third auxiliary component containing at least one selected from Cu, B, and Si. The third auxiliary component content is preferably 0.001 parts by weight or more and 4.000 parts by weight or less, more preferably 0.003 parts by weight or more and 2.000 parts by weight or less, on a metal basis per 100 parts by weight of the perovskite type metal oxide.

The third auxiliary component content is the weight ratio of the third auxiliary component to 100 parts by weight of the constituent elements of the metal oxide having the general formula (1) on an oxide basis, which is calculated from the amounts of Ba, Ca, Ti, Sn, Zr, Mn, Mg, and metals of the third auxiliary component of the piezoelectric material measured, for example, by X-ray fluorescence spectroscopy (XRF), ICP spectroscopy, or atomic absorption spectrometry.

The third auxiliary component is at least one selected from Cu, B, and Si. B and Si segregate at interfaces between crystal grains of the piezoelectric material. This reduces a leakage current flowing through the interfaces between crystal grains and increases insulation resistance. Cu can dissolve in crystal grains and increase insulation resistance. A piezoelectric material containing 0.001 parts by weight or more of the third auxiliary component advantageously has high insulation resistance. A third auxiliary component content of less than 0.001 parts by weight undesirably results in low insulation resistance. More than 4.000 parts by weight of the third auxiliary component in the piezoelectric material undesirably results in a reduced dielectric constant and a reduced piezoelectric property.

The weight ratio G1/G2 of the weight G1 of Si to the weight G2 of B may be in the range of $2.0 \leq G1/G2 \leq 3.8$. This range results in particularly suitable insulation resistance. The Si content may be 0.003 parts by weight or more and 1.000 part by weight or less per 100 parts by weight of the metal oxide. The Cu content may be 0.100 parts by weight or more and 2.000 parts by weight or less. The B content may be 0.001 parts by weight or more and 1.000 part by weight or less.

A multilayered piezoelectric element has a thin piezoelectric material layer between electrodes and therefore requires durability in a high electric field. Because of its particularly high insulation resistance, a piezoelectric material according to an embodiment of the present invention is suitable for a multilayered piezoelectric element.

(Fourth Auxiliary Component of Piezoelectric Material)

A piezoelectric material according to an embodiment of the present invention may contain a metal oxide having the general formula (1) and a fourth auxiliary component, which is different from the first auxiliary component, the second auxiliary component, and the third auxiliary component, without variations in characteristics. The fourth auxiliary component may be an element, such as Li, Na, Al, Zn, Sr, K, Y, or V.

The amount of fourth auxiliary component may be 1.2 parts by weight or less per 100 parts by weight of the metal oxide having the general formula (1). More than 1.2 parts by weight of the fourth auxiliary component may result in a reduced piezoelectric property or insulation property of the piezoelectric material. The amount of metallic elements of the fourth auxiliary component other than Ba, Ca, Ti, Zr, Sn, Mn, Mg, Cu, B, and Si may be 1.0 part by weight or less on an oxide basis or 0.9 parts by weight or less on a metal basis per 100 parts by weight of the piezoelectric material. The term "metallic element", as used herein, includes metalloid elements such as Ge and Sb. When the amount of metallic elements of the fourth auxiliary component other than Ba, Ca, Ti, Zr, Sn, Mn, Mg, Cu, B, and Si is more than 1.0 part by weight on an oxide basis or more than 0.9 parts by weight on a metal basis per 100 parts by weight of the piezoelectric material, this may result in a markedly reduced piezoelectric property or insulation property of the piezoelectric material.

The total amount of Li, Na, Al, Zn, Sr, and K of the fourth auxiliary component may be 0.5 parts by weight or less on a metal basis per 100 parts by weight of the piezoelectric material. When the total amount of Li, Na, Al, Zn, Sr, and K of the fourth auxiliary component is more than 0.5 parts by weight on a metal basis per 100 parts by weight of the piezoelectric material, this may result in insufficient sintering. The total amount of Y and V elements of the fourth auxiliary component may be 0.2 parts by weight or less on a metal basis per 100 parts by weight of the piezoelectric material. When the total amount of Y and V of the fourth auxiliary component is more than 0.2 parts by weight on a metal basis per 100 parts by weight of the piezoelectric material, this may make polarization treatment difficult.

A piezoelectric material according to an embodiment of the present invention may contain Nb inevitably contained in a commercially available raw material for Ti and Hf inevitably contained in a commercially available raw material for Zr.

The perovskite type metal oxide having the general formula (1), the first auxiliary component, the second auxiliary component, and the third auxiliary component can constitute 98.5% by mol or more of a piezoelectric material according to an embodiment of the present invention. The perovskite type metal oxide having the general formula (1) preferably constitutes 90% by mol or more, more preferably 95% by mol or more, of the piezoelectric material.

(Phase Transition Temperature)

A piezoelectric material according to an embodiment of the present invention may have no structural phase transition temperature in the range of 0° C. to 90° C.

Generally known barium titanate has an orthorhombic-to-tetragonal transition temperature (hereinafter referred to as $T_{o \to t}$) of approximately 17° C. and a tetragonal-to-orthorhombic transition temperature ($T_{t \to o}$) of approximately 5° C. The transition temperature of the crystal structure is referred to as a structural phase transition temperature. While repeatedly passing through these transition temperatures of the crystal structure because of ambient temperature changes, the piezoelectric material may gradually become depolarized because of repeated variations in the unit cell volume and polarization axial direction, resulting in a reduced piezoelectric property. Thus, barium titanate is difficult to use in a wide temperature range. A piezoelectric material according to an embodiment of the present invention has $T_{o \to t}$ of less than 0° C. and does not have the problem described above. A piezoelectric material according to an embodiment of the present invention has a Curie temperature ($T_c$) for tetragonal-to-cubic transition higher than 90° C. and can maintain piezoelectricity even at an excessively high temperature of 80° C. as in a car in summer. Furthermore, having the tetragonal structure at a temperature in the range of 0° C. to 90° C., the piezoelectric material can avoid its use in an orthorhombic crystal region having a low mechanical quality factor. Thus, the piezoelectric material can have a high and stable piezoelectric constant and mechanical quality factor in a wide operating temperature range.

(Curie Temperature)

The term "Curie temperature ($T_c$)", as used herein, refers to a temperature at which the ferroelectricity of a material is lost. In general, the piezoelectric property of a piezoelectric material is also lost at $T_c$ or higher. $T_c$ may be determined by directly measuring the temperature at which ferroelectricity is lost or measuring the temperature at which the relative dielectric constant reaches its maximum in a very small alternating electric field.

(Crystal Grain Size and Equivalent Circular Diameter)

The average equivalent circular diameter of crystal grains of a piezoelectric material according to an embodiment of the present invention is preferably 1 μm or more and 10 μm or less. The average equivalent circular diameter refers to the mean value of equivalent circular diameters of crystal grains. A piezoelectric material according to an embodiment of the present invention can have a satisfactory piezoelectric property and mechanical strength if it has an average equivalent circular diameter of crystal grains in this range. An average equivalent circular diameter of less than 1 μm may result in a reduced piezoelectric property. An average equivalent circular diameter of more than 10 μm may result in reduced mechanical strength. The average equivalent circular diameter is more preferably 1 μm or more and 4.5 μm or less.

In a piezoelectric material according to an embodiment of the present invention, crystal grains having an equivalent circular diameter of 25 μm or less may constitute 99 percent by number or more of the crystal grains of the piezoelectric material. When the percentage by number of crystal grains having an equivalent circular diameter of 25 μm or less is in this range, the piezoelectric material can have satisfactory mechanical strength. The mechanical strength has a high negative correlation with the percentage of crystal grains having a large equivalent circular diameter. When the percentage by number of crystal grains having an equivalent circular diameter of 25 μm or less is less than 99 percent by number, this results in an increase in the number of crystal grains having an equivalent circular diameter of more than 25 μm, possibly resulting in reduced mechanical strength.

The term "equivalent circular diameter", as used herein, refers to a "projected area equivalent circular diameter" generally referred to in microscopy and refers to the diameter of a perfect circle having the same area as the projected area of a crystal grain. In the present invention, the equivalent circular diameter may be determined by any method. For example, the equivalent circular diameter may be determined by the image processing of an image of a surface of the piezoelectric material taken with a polarizing microscope or a scanning electron microscope. Since the optimum magnification depends on the particle size to be measured, an optical microscope or an electron microscope may be selected in accordance with the particle size. The equivalent circular diameter may be determined from an image of a polished surface or a cross section rather than the material surface.

(Relative Density)

A piezoelectric material according to an embodiment of the present invention may have a relative density of 90% or more and 100% or less.

The relative density is the ratio of the measured density to the theoretical density, which is calculated from the lattice constant of the piezoelectric material and the atomic weights of the constituent elements of the piezoelectric material. The lattice constant can be measured by X-ray diffraction analysis. The density can be determined in accordance with Archimedes' principle.

A relative density of less than 90% may result in a reduced piezoelectric property, mechanical quality factor, or mechanical strength.

A piezoelectric material according to an embodiment of the present invention preferably has a relative density of 92% or more and 95% or less.

(Method for Producing Piezoelectric Material)

A method for producing a piezoelectric material according to an embodiment of the present invention is not particularly limited. A typical production method will be described below.

(Raw Materials of Piezoelectric Material)

A piezoelectric material can be produced by a common method by forming a compact from an oxide, carbonate, nitrate, or oxalate solid powder containing the constituent elements of the piezoelectric material and sintering the compact at atmospheric pressure. The raw materials include a metallic compound, such as a Ba compound, a Ca compound, a Ti compound, a Sn compound, a Zr compound, a Mn compound, a Mg compound, a Cu compound, a B compound, and/or a Si compound.

Examples of the Ba compound include barium oxide, barium carbonate, barium oxalate, barium acetate, barium nitrate, barium titanate, barium zirconate, and barium zirconate titanate. The Ba compound may be of a commercially available high purity type (for example, a purity of 99.99% or more). A low-purity Ba compound contains a large amount of Mg, and a piezoelectric material according to an embodiment of the present invention sometimes cannot be produced.

Examples of the Ca compound include calcium oxide, calcium carbonate, calcium oxalate, calcium acetate, calcium titanate, and calcium zirconate. The Ca compound may be of a commercially available high purity type (for example, a purity of 99.99% or more). A low-purity Ca compound contains a large amount of Mg, and a piezoelectric material according to an embodiment of the present invention sometimes cannot be produced.

Examples of the Ti compound include titanium oxide, barium titanate, barium zirconate titanate, and calcium titanate. In the case that the Ti compound contains an alkaline-earth metal, such as barium or calcium, a commercially available compound of a high purity type (for example, a purity of 99.99% or more) may be used. A low-purity Ti compound contains a large amount of Mg, and a piezoelectric material according to an embodiment of the present invention sometimes cannot be produced.

Examples of the Zr compound include zirconium oxide, barium zirconate, barium zirconate titanate, and calcium zirconate. In the case that the Zr compound contains an alkaline-earth metal, such as barium or calcium, a commercially available compound of a high purity type (for example, a purity of 99.99% or more) may be used. A low-purity Zr compound contains a large amount of Mg, and a piezoelectric material according to an embodiment of the present invention sometimes cannot be produced.

Examples of the Sn compound include tin oxide, barium stannate, barium stannate titanate, and calcium stannate. In the case that the Sn compound contains an alkaline-earth metal, such as barium or calcium, a commercially available compound of a high purity type (for example, a purity of 99.99% or more) may be used. A low-purity Sn compound contains a large amount of Mg, and a piezoelectric material according to an embodiment of the present invention sometimes cannot be produced.

Examples of the Mn compound include manganese carbonate, manganese oxide, manganese dioxide, manganese acetate, and trimanganese tetroxide.

Examples of the Mg compound include magnesium carbonate, magnesium oxide, magnesium peroxide, and magnesium acetate.

Examples of the Cu compound include copper (I) oxide, copper (II) oxide, copper carbonate, copper (II) acetate, and copper oxalate.

Examples of the B compound include boron oxide.

Examples of the Si compound include silicon oxide.

A raw material for controlling the ratio a of the number of moles of Ba and Ca at the A site to the number of moles of Ti, Sn, and Zr at the B site of a piezoelectric material according to an embodiment of the present invention is not particularly limited. A Ba compound, a Ca compound, a Ti compound, a Sn compound, and a Zr compound have the same effect.

(Granulated Powder and Compact)

The term "compact", as used herein, refers to a solid formed of a solid powder. A compact can be formed by uniaxial pressing, cold hydrostatic pressing, hot hydrostatic pressing, casting, or extrusion molding. A compact may be formed from a granulated powder. Sintering of a compact formed from a granulated powder has an advantage that the grain size distribution of the sintered body tends to become uniform. In order to increase the insulation resistance of the sintered body, the compact may contain a third auxiliary component containing at least one selected from Cu, B, and Si.

The raw material powder of a piezoelectric material according to an embodiment of the present invention may be granulated by any method. Spray drying can make the particle size of the granulated powder more uniform.

A binder for use in granulation may be polyvinyl alcohol (PVA), polyvinyl butyral (PVB), or an acrylic resin. The amount of binder is preferably in the range of 1 to 10 parts by weight per 100 parts by weight of the raw material powder of a piezoelectric material, more preferably 2 to 5 parts by weight in order to increase the compact density.

(Sintering)

The compact may be sintered by any method.

Examples of the sintering method include sintering in an electric furnace, sintering in a gas furnace, electric heating, microwave sintering, millimeter-wave sintering, and hot isostatic pressing (HIP). Sintering in an electric furnace or a gas furnace may be performed in a continuous furnace or a batch furnace.

The sintering temperature of a piezoelectric material in the sintering method is not particularly limited and may be a temperature at which the compounds can react to sufficiently grow crystals. The sintering temperature is preferably 1100° C. or more and 1400° C. or less, more preferably 1100° C. or more and 1350° C. or less, such that the particle size of the piezoelectric material is in the range of 1 to 10 μm. A piezoelectric material sintered in the temperature range described above has satisfactory piezoelectric performance. In order to ensure the reproducibility and stability of the characteristics of a piezoelectric material produced by sintering, sintering may be performed at a constant temperature within the range described above for two hours or more and 48 hours or less. Although two-step sintering may also be performed, a sintering method without an abrupt temperature change can improve productivity.

A piezoelectric material produced by sintering may be polished and then heat-treated at a temperature of 1000° C. or more. Heat treatment of the piezoelectric material at a temperature of 1000° C. or more can relieve the residual stress of the piezoelectric material resulting from mechanically polishing and thereby improves the piezoelectric property of the piezoelectric material. Heat treatment of the piezoelectric material can also remove the raw material powder, such as barium carbonate, precipitated at grain boundaries. The heat-treatment time may be, but is not limited to, one hour or more.

(Piezoelectric Element)

FIG. 1 is a schematic view of a piezoelectric element according to an embodiment of the present invention. The piezoelectric element includes a first electrode 1, a piezoelectric material 2, and a second electrode 3. The piezoelectric material 2 is a piezoelectric material according to an embodiment of the present invention.

The piezoelectric property of the piezoelectric material can be evaluated by at least attaching the first electrode and the second electrode to the piezoelectric material to form the piezoelectric element. Each of the first electrode and the second electrode is an electrically conductive layer having a thickness in the range of approximately 5 nm to 10 μm. The materials of the first electrode 1 and the second electrode 3 are not particularly limited and may be any materials that are commonly used for piezoelectric elements. Examples of such materials include metals, such as Ti, Pt, Ta, Ir, Sr, In, Sn, Au, Al, Fe, Cr, Ni, Pd, Ag, and Cu, and compounds thereof.

Each of the first electrode and the second electrode may be made of one of these materials or may be a multilayer made of two or more of the materials. The material(s) of the first electrode may be different from the material(s) of the second electrode.

The first electrode and the second electrode may be manufactured by any method, for example, by baking of a metal paste, sputtering, or vapor deposition. The first electrode and the second electrode may have a desired pattern.

(Polarization Treatment) The piezoelectric element may have a unidirectional spontaneous polarization axis. Having the unidirectional spontaneous polarization axis can increase the piezoelectric constant of the piezoelectric element.

The polarization method for the piezoelectric element is not particularly limited. Polarization treatment may be performed in the ambient atmosphere or in a silicone oil. The polarization temperature may be in the range of 60° C. to 150° C. The optimum conditions for polarization may vary with the composition of the piezoelectric material of the piezoelectric element. The electric field applied in polarization treatment may be in the range of 800 V/mm to 2.0 kV/mm.

(Measurement of Piezoelectric Constant and Mechanical Quality Factor) The piezoelectric constant and the mechanical quality factor of the piezoelectric element can be calculated from the resonance frequency and the antiresonant frequency measured with a commercially available impedance analyzer in accordance with a standard of Japan Electronics and Information Technology Industries Association (JEITA EM-4501). This method is hereinafter referred to as a resonance-antiresonance method.

(Multilayered Piezoelectric Element)

A multilayered piezoelectric element manufactured using a piezoelectric material according to an embodiment of the present invention will be described below.

The multilayered piezoelectric element includes a multilayered body including piezoelectric material layers and internal electrodes alternately stacked on top of one another, a first electrode, and a second electrode, wherein the piezoelectric material layers are formed of a piezoelectric material according to an embodiment of the present invention.

Figure 2A:
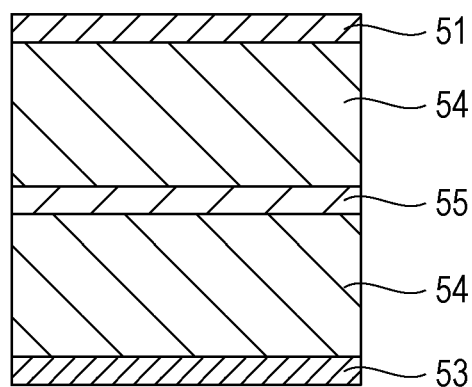
FIG. 2A is a schematic cross-sectional view of a multi-layered piezoelectric element according to an embodiment of the present invention.
Figure 2B:
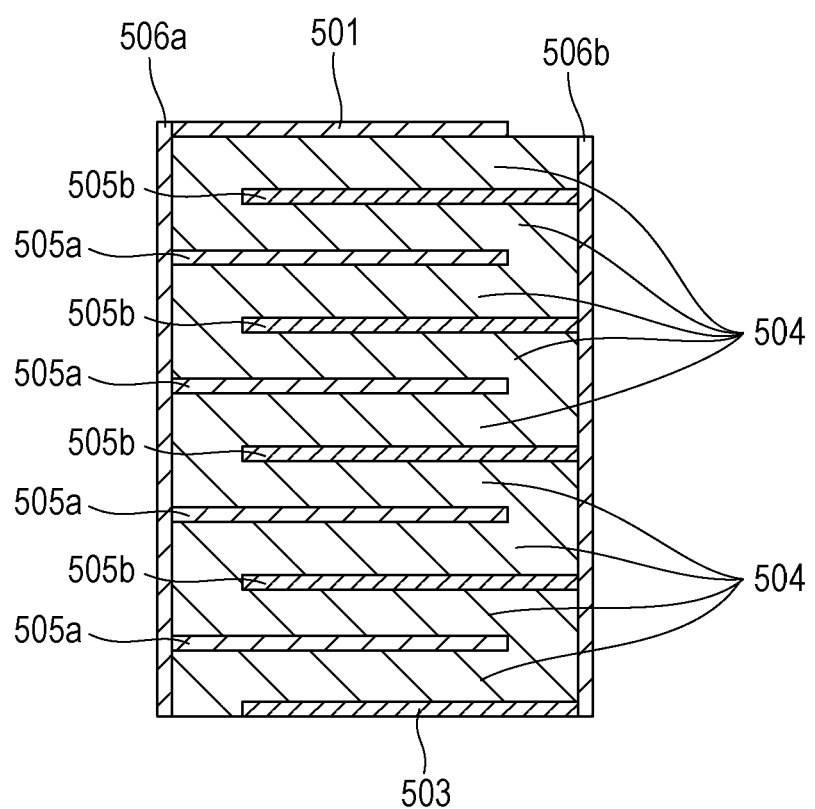
FIG. 2B is a schematic cross-sectional view of a multilayered piezoelectric element according to another embodiment of the present invention.

FIG. 2A is a schematic cross-sectional view of a multilayered piezoelectric element according to an embodiment of the present invention. FIG. 2B is a schematic cross-sectional view of a multilayered piezoelectric element according to another embodiment of the present invention. A multilayered piezoelectric element according to an embodiment of the present invention includes the piezoelectric material layers 54 and electrode layers alternately stacked on top of one another. The electrode layers include the internal electrode 55. The piezoelectric material layers 54 are formed of the piezoelectric material described above. The electrode layers may include external electrodes, such as a first electrode 51 and a second electrode 53, as well as the internal electrode 55.

FIG. 2A illustrates a multilayered piezoelectric element according to an embodiment of the present invention that includes a multilayered body between a first electrode 51 and a second electrode 53, wherein the multilayered body includes two piezoelectric material layers 54 with one internal electrode 55 interposed therebetween. As illustrated in FIG. 2B, the number of piezoelectric material layers and the number of internal electrodes of a multilayered piezoelectric element according to an embodiment of the present invention may be increased without limitation. The multilayered piezoelectric element illustrated in FIG. 2B includes a multilayered body between a first electrode 501 and a second electrode 503. The multilayered body includes nine piezoelectric material layers 504 and eight internal electrodes 505 (505a and 505b) alternately stacked on top of one another. The multilayered piezoelectric element further includes an external electrode 506a and an external electrode 506b for connecting the internal electrodes to each other.

The size and shape of the internal electrodes 55 and 505 and the external electrodes 506a and 506b may be different from the size and shape of the piezoelectric material layers 54 and 504. Each of the internal electrodes 55 and 505 and the external electrodes 506a and 506b may be composed of a plurality of portions.

Each of the internal electrodes 55 and 505, the external electrodes 506a and 506b, the first electrodes 51 and 501, and the second electrodes 53 and 503 is an electrically conductive layer having a thickness in the range of approximately 5 nm to 10 μm. The material of each of the electrodes is not particularly limited and may be any material that is commonly used for piezoelectric elements. Examples of such a material include metals, such as Ti, Pt, Ta, Ir, Sr, In, Sn, Au, Al, Fe, Cr, Ni, Pd, Ag, and Cu, and compounds thereof. Each of the internal electrodes 55 and 505 and the external electrodes 506a and 506b may be made of one of these materials or a mixture or an alloy thereof or may be a multilayer made of two or more of the materials. These electrodes may be made of different materials. The internal electrodes 55 and 505 may be mainly composed of Ni, which is an inexpensive electrode material.

A multilayered piezoelectric element according to an embodiment of the present invention includes an internal electrode containing Ag and Pd. The weight ratio M1/M2 of the weight M1 of Ag to the weight M2 of Pd is preferably in the range of $1.5 \leq M1/M2 \leq 9.0$, more preferably $2.3 \leq M1/M2 \leq 4.0$. A weight ratio M1/M2 of less than 1.5 is undesirable because of a high sintering temperature of the internal electrode. A weight ratio M1/M2 of more than 9.0 is also undesirable because the internal electrode has an island structure and a heterogeneous surface.

As illustrated in FIG. 2B, the plurality of electrodes including the internal electrodes 505 may be connected to each other in order to synchronize the driving voltage phases. For example, internal electrodes 505a may be connected to the first electrode 501 through the external electrode 506a. The internal electrodes 505b may be connected to the second electrode 503 through the external electrode 506b. The internal electrodes 505a and the internal electrodes 505b may be alternately disposed. The electrodes may be connected by any method. For example, an electrode or an electric wire for connection may be disposed on a side surface of the multilayered piezoelectric element, or a through hole passing through the piezoelectric material layers 504 may be formed and coated with an electrically conductive material to connect the electrodes.

(Method for Manufacturing Multilayered Piezoelectric Element)

A method for manufacturing a multilayered piezoelectric element using a piezoelectric material according to an embodiment of the present invention will be described below.

The method for manufacturing a multilayered piezoelectric element includes (A) dispersing a metallic compound powder containing at least Ba, Ca, Ti, Sn, Zr, Mn, and Mg to produce a slurry, (B) forming a compact from the slurry, (C) forming an electrode on the compact, and (D) sintering a compact that includes the compacts containing the metallic compound and the electrodes alternately stacked on top of one another to manufacture the multilayered piezoelectric element. The sintering temperature in (D) is 1200° C. or less. The metal oxide powder may contain no Zr. The term "powder", as used herein, refers to an aggregate of solid particles. The aggregate may be composed of particles containing Ba, Ca, Ti, Sn, Zr, Mn, and Mg or different particles each containing a certain element.

The metallic compound powder in (A) may be a powder of a Ba compound, a Ca compound, a Ti compound, a Sn compound, a Zr compound, a Mn compound, a Mg compound, a Cu compound, a B compound, and a Si compound.

An exemplary method for preparing the slurry in (A) will be described below. The metallic compound powder is mixed with a solvent. The weight of the solvent is 1.6 to 1.7 times the weight of the metallic compound powder. The solvent may be toluene, ethanol, a mixed solvent of toluene and ethanol, n-butyl acetate, or water. After mixing in a ball mill for 24 hours, a binder and a plasticizer are added to the mixture. The binder may be polyvinyl alcohol (PVA), polyvinyl butyral (PVB), or an acrylic resin. When the binder is PVB, the weight ratio of the solvent to PVB may be 88:12. The plasticizer may be dioctyl sebacate, dioctyl phthalate, or dibutyl phthalate. When the plasticizer is dibutyl phthalate, the weight of dibutyl phthalate is the same as the weight of the binder. The mixture is again mixed in the ball mill overnight. The amount of solvent or binder is controlled such that the slurry viscosity is in the range of 300 to 500 mPa·s.

The compact in (B) is a sheet of the mixture of the metallic compound powder, the binder, and the plasticizer. The compact in (B) may be formed by a sheet forming method. The sheet forming method may be a doctor blade method. In accordance with the doctor blade method, the slurry is applied to a substrate with a doctor blade and is dried to form a sheet of the compact. The substrate may be a polyethylene terephthalate (PET) film. A surface of the PET film on which the slurry is to be applied may be coated with a fluorine compound in order to facilitate the removal of the compact. The slurry may be dried by natural drying or hot-air drying. The thickness of the compact is not particularly limited and may be adjusted to the thickness of the multilayered piezoelectric element. The thickness of the compact can be increased with increasing viscosity of the slurry.

The electrodes in (C), more specifically, the internal electrodes 505 and the external electrodes 506a and 506b may be manufactured by any method, for example, baking of a metal paste, a sputtering process, a vapor deposition method, or a printing method. In order to reduce the driving voltage, the thickness and the intervals of the piezoelectric material layers 504 may be reduced. In such a case, a multilayered body containing precursors of the piezoelectric material layers 504 and the internal electrodes 505a and 505b is fired. The material of the internal electrodes should not change its shape or cause a deterioration in electrical conductivity at the sintering temperature of the piezoelectric material layers 504. A metal that has a lower melting point and is more inexpensive than Pt, such as Ag, Pd, Au, Cu, or Ni, or an alloy thereof may be used for the internal electrodes 505a and 505b and the external electrodes 506a and 506b. The external electrodes 506a and 506b may be formed after firing the multilayered body. In this case, the external electrodes 506a and 506b may be made of Al or a carbonaceous electrode material, as well as Ag, Pd, Cu, or Ni.

These electrodes may be formed by screen printing. In accordance with screen printing, a metal paste is applied to the compact disposed on a substrate through a screen printing plate using a blade. The screen printing plate has a screen mesh. The metal paste is applied to the compact through the screen mesh. The screen mesh of the screen printing plate may have a pattern. The pattern can be transferred to the compact using the metal paste, thereby patterning an electrode on the compact.

After the electrode is formed in (C), one or a plurality of compacts removed from the substrate are stacked and press-bonded, for example, by uniaxial pressing, cold hydrostatic pressing, or hot hydrostatic pressing. Hot hydrostatic pressing can apply isotropically uniform pressure. Heating the compacts to approximately the glass transition point of the binder can enhance press bonding. A plurality of compacts can be press-bonded in order to achieve the desired thickness. For example, 10 to 100 layers of the compacts can be heat-pressed at a temperature in the range of 50° C. to 80° C. at a pressure in the range of 10 to 60 MPa for 10 seconds to 10 minutes. The electrodes may have an alignment mark in order to accurately stack the compacts. The compacts may have a positioning through hole in order to accurately stack the compacts.

A sintering temperature of 1200° C. or less in (D) allows the use of a metal that has a lower melting point and is more inexpensive than Pt, such as Ag, Pd, Au, Cu, or Ni, or an alloy thereof.

In a method for manufacturing a multilayered piezoelectric element according to an embodiment of the present invention, the slurry may contain a perovskite type metal oxide containing at least one of Ba and Ca and at least one of Ti and Sn. Examples of the perovskite type metal oxide include barium titanate, barium stannate, barium zirconate titanate, barium stannate titanate, calcium titanate, calcium stannate, calcium zirconate titanate, and calcium stannate titanate. The slurry may contain Zr. In this case, the perovskite type metal oxide may be barium zirconate or calcium zirconate.

When the slurry contains the perovskite type metal oxide, this advantageously promotes grain growth and increases the density of the compact.

(Liquid Discharge Head)

A liquid discharge head according to an embodiment of the present invention will be described below.

The liquid discharge head includes a liquid chamber and a discharge port in communication with the liquid chamber. The liquid chamber has a vibrating unit that includes a piezoelectric element or a multilayered piezoelectric element according to an embodiment of the present invention.

Figure 3A:
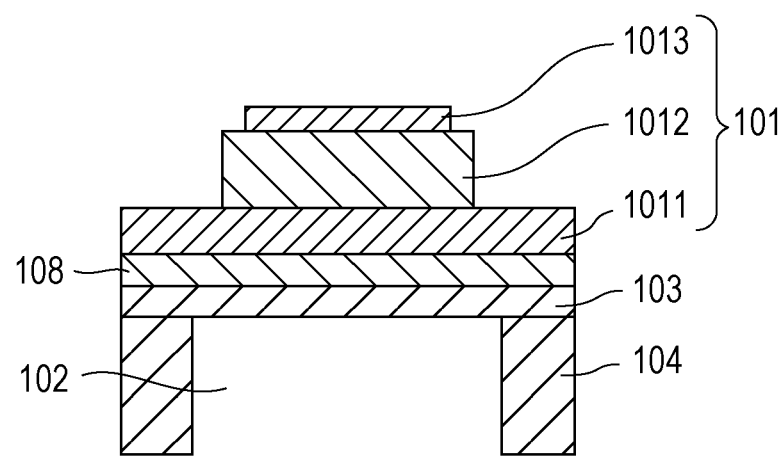
FIG. 3A is a schematic view of a liquid discharge head according to an embodiment of the present invention.
Figure 3B:
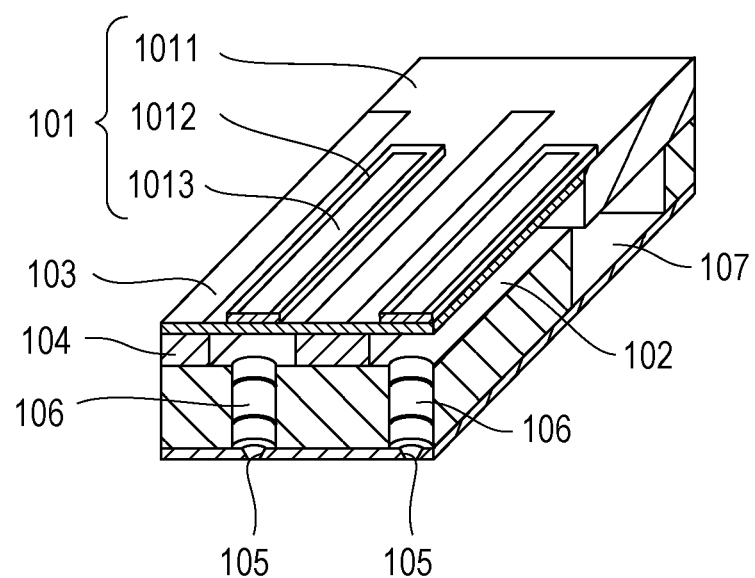
FIG. 3B is a schematic perspective view of the liquid discharge head illustrated in FIG. 3A.

FIG. 3A is a schematic view of a liquid discharge head according to an embodiment of the present invention. FIG. 3B is a schematic perspective view of the liquid discharge head illustrated in FIG. 3A. As illustrated in FIGS. 3A and 3B, the liquid discharge head includes a piezoelectric element 101 according to an embodiment of the present invention. The piezoelectric element 101 includes a first electrode 1011, a piezoelectric material 1012, and a second electrode 1013. As illustrated in FIG. 3B, the piezoelectric material 1012 may be patterned.

FIG. 3B is a schematic view of a liquid discharge head. The liquid discharge head includes a discharge port 105, an individual liquid chamber 102, a communicating hole 106 that connects the individual liquid chamber 102 to the discharge port 105, a liquid chamber partition wall 104, a common liquid chamber 107, a diaphragm 103, and the piezoelectric element 101. Although the piezoelectric element 101 is rectangular in FIG. 3B, the piezoelectric element 101 may be of another shape, such as elliptical, circular, or parallelogrammic. In general, the piezoelectric material 1012 has a shape corresponding to the shape of the individual liquid chamber 102.

The piezoelectric element 101 of the liquid discharge head will be described in detail below with reference to FIG. 3A. FIG. 3A is a cross-sectional view of FIG. 3B in the width direction of the piezoelectric element. Although the piezoelectric element 101 has a rectangular cross section in FIG. 3A, the piezoelectric element 101 may have a trapezoidal or inverted trapezoidal cross section.

In FIG. 3A, the first electrode 1011 is a lower electrode, and the second electrode 1013 is an upper electrode. The first electrode 1011 and the second electrode 1013 may be arranged differently. For example, the first electrode 1011 may be a lower electrode or an upper electrode. Likewise, the second electrode 1013 may be an upper electrode or a lower electrode. A buffer layer 108 may be disposed between the diaphragm 103 and the lower electrode. These different designations result from variations in the method for manufacturing the device, and each of the cases has the advantages of the present invention.

In the liquid discharge head, the diaphragm 103 bends upward and downward with the expansion and contraction of the piezoelectric material 1012, thereby applying pressure to a liquid in the individual liquid chamber 102. This allows the liquid to be discharged from the discharge port 105. A liquid discharge head according to an embodiment of the present invention can be used in printers and in the manufacture of electronic equipment.

The thickness of the diaphragm 103 is 1.0 μm or more and 15 μm or less, preferably 1.5 μm or more and 8 μm or less. The material of the diaphragm is not particularly limited and may be Si. Si of the diaphragm may be doped with boron or phosphorus. The buffer layer and the electrode on the diaphragm may constitute the diaphragm. The buffer layer 108 has a thickness of 5 nm or more and 300 nm or less, preferably 10 nm or more and 200 nm or less. The discharge port 105 has an equivalent circular diameter of 5 μm or more and 40 μm or less. The discharge port 105 may be circular, star-shaped, square, or triangular.

(Liquid Discharge Apparatus)

A liquid discharge apparatus according to an embodiment of the present invention will be described below. The liquid discharge apparatus includes a recording medium conveying unit and the liquid discharge head described above.

Figure 4:
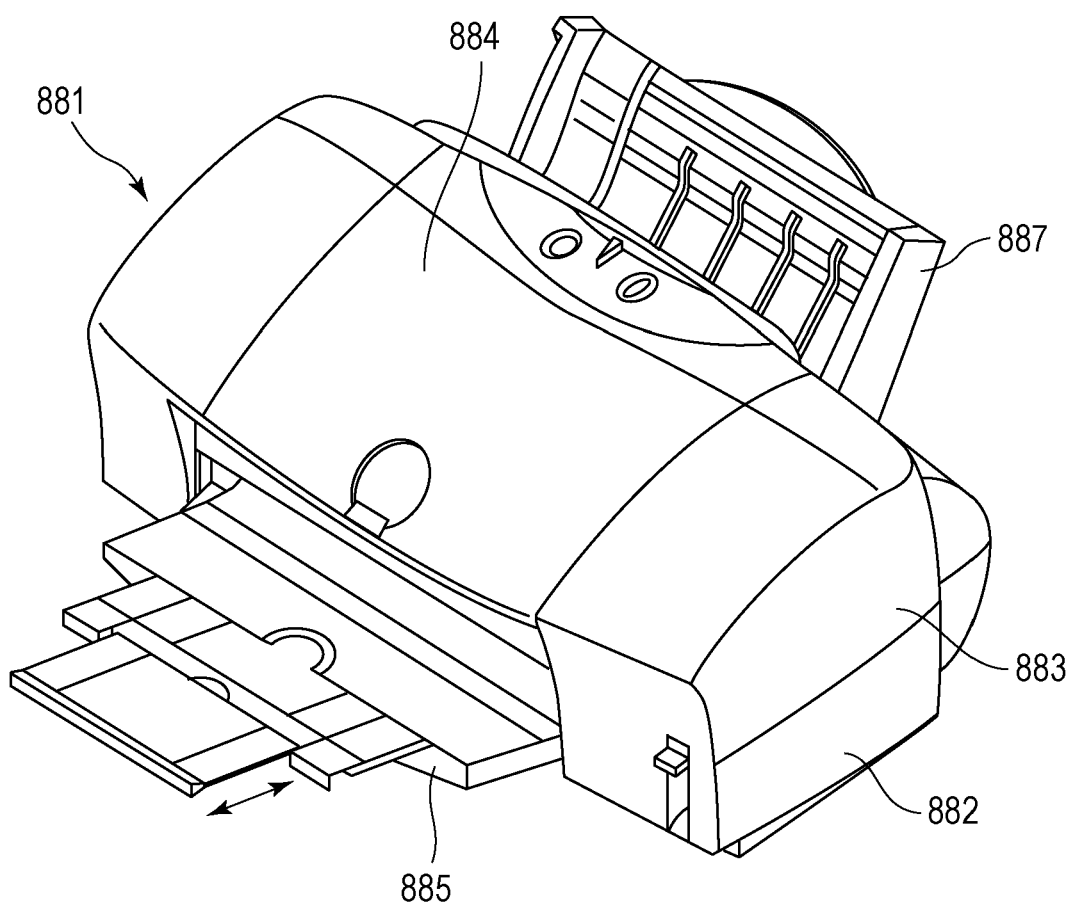
FIG. 4 is a schematic view of a liquid discharge apparatus according to an embodiment of the present invention.
Figure 5:
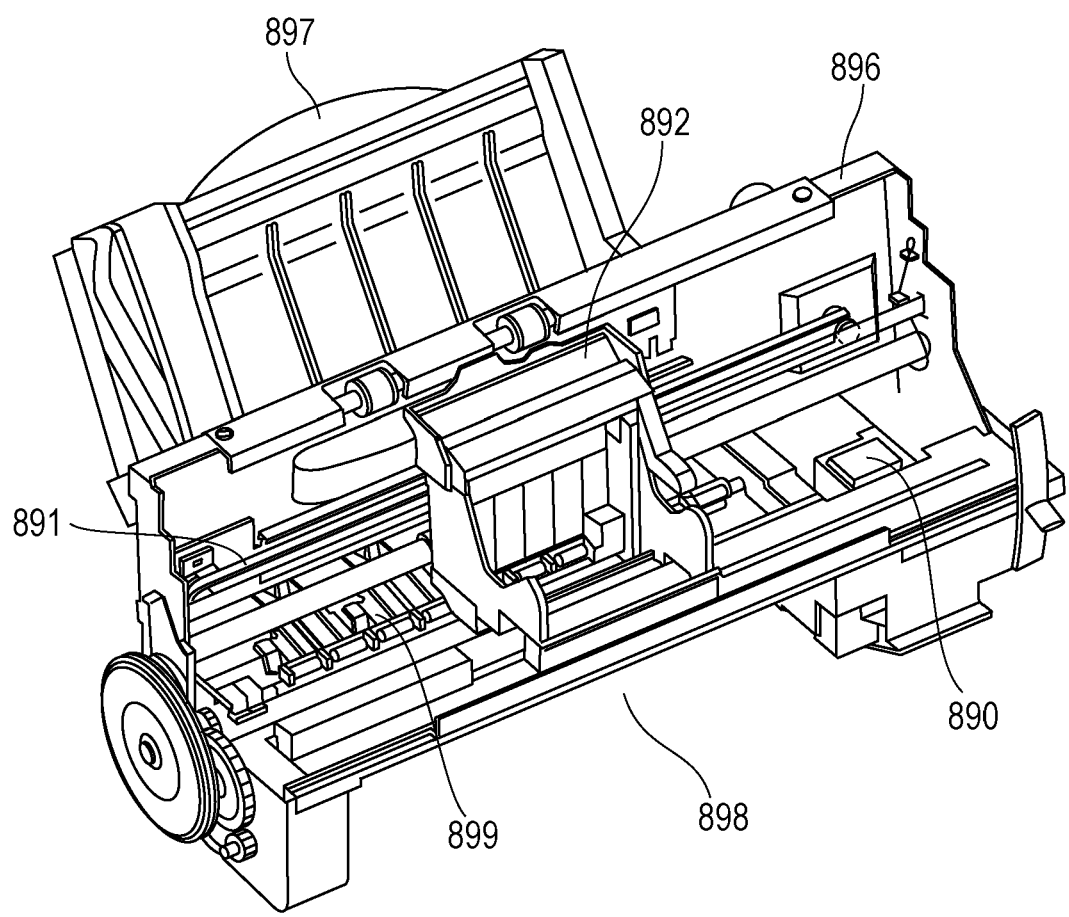
FIG. 5 is a schematic view of a liquid discharge apparatus according to an embodiment of the present invention.

The liquid discharge apparatus may be an ink jet recording apparatus, as illustrated in FIGS. 4 and 5. FIG. 5 illustrates the liquid discharge apparatus (ink jet recording apparatus) 881 illustrated in FIG. 4 without exteriors 882 to 885 and 887. The ink jet recording apparatus 881 includes an automatic feeder 897 for automatically feeding a recording paper sheet as a recording medium to the main body 896 of the apparatus. The ink jet recording apparatus 881 further includes a conveying unit 899 for conveying a recording paper sheet from the automatic feeder 897 to a predetermined recording position and from the recording position to an outlet 898, a recording unit 891 for recording to the recording paper at the recording position, and a recovering unit 890 for recovering the recording unit 891. The recording unit 891 includes a carriage 892 for housing a liquid discharge head according to an embodiment of the present invention. The carriage 892 travels along a rail.

In such an ink jet recording apparatus, the carriage 892 travels along a rail in response to electric signals sent from a computer. Upon the application of a driving voltage to electrodes disposed on a piezoelectric material, the piezoelectric material is deformed. Upon the deformation, the piezoelectric material presses the individual liquid chamber 102 via the diaphragm 103 illustrated in FIG. 3B, thereby discharging an ink from the discharge port 105 to print characters.

A liquid discharge apparatus according to an embodiment of the present invention can uniformly discharge a liquid at a high speed and can be reduced in size.

In addition to the printer described above, a liquid discharge apparatus according to an embodiment of the present invention can be used in printing apparatuses, for example, ink jet recording apparatuses, such as facsimile machines, multifunction devices, and copying machines, industrial liquid discharge apparatuses, and apparatuses for drawing objects.

(Ultrasonic Motor)

An ultrasonic motor according to an embodiment of the present invention will be described below. The ultrasonic motor includes a vibrating member and a moving body in contact with the vibrating member. The vibrating member includes a piezoelectric element or a multilayered piezoelectric element according to an embodiment of the present invention.

Figure 6A:
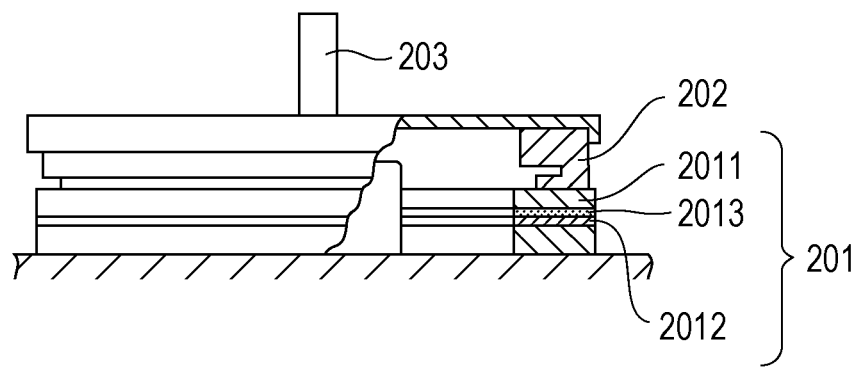
FIG. 6A is a schematic view of an ultrasonic motor according to an embodiment of the present invention.
Figure 6B:
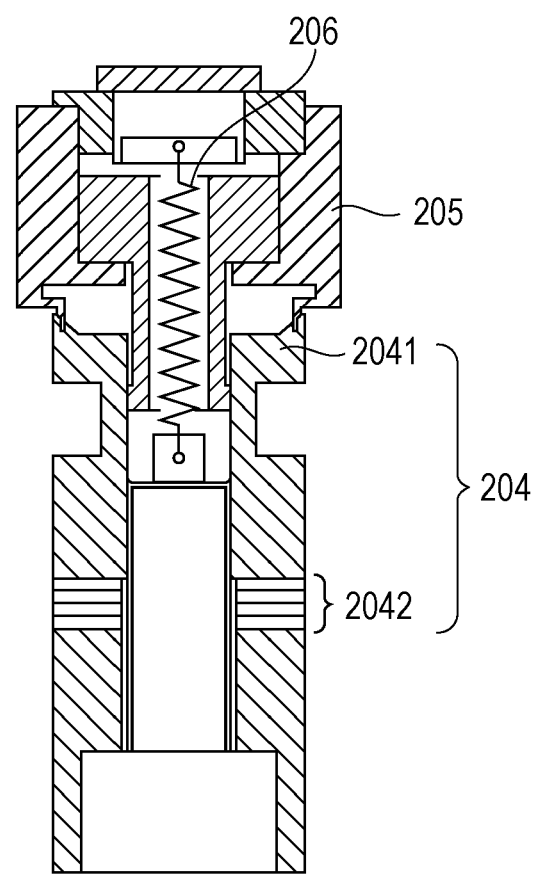
FIG. 6B is a schematic view of an ultrasonic motor according to another embodiment of the present invention.

FIG. 6A is a schematic view of an ultrasonic motor according to an embodiment of the present invention. FIG. 6B is a schematic view of an ultrasonic motor according to another embodiment of the present invention. The ultrasonic motor illustrated in FIG. 6A includes a single plate of a piezoelectric element according to an embodiment of the present invention. The ultrasonic motor includes an oscillator 201, a rotor 202 pressed against a sliding surface of the oscillator 201 by the action of a pressure spring (not shown), and an output shaft 203, which is formed integrally with the rotor 202. The oscillator 201 includes a metal elastic ring 2011, a piezoelectric element 2012 according to an embodiment of the present invention, and an organic adhesive 2013 (epoxy or cyanoacrylate) that bonds the piezoelectric element 2012 to the elastic ring 2011. Although not shown in the figure, the piezoelectric element 2012 includes a piezoelectric material between a first electrode and a second electrode.

Upon the application of two-phase alternating voltages that differ by an odd number times $\pi/2$ in phase to a piezoelectric element according to an embodiment of the present invention, a flexural traveling wave occurs in the oscillator 201, and points on the sliding surface of the oscillator 201 go through elliptical motion. The rotor 202 pressed against the sliding surface of the oscillator 201 receives friction force from the oscillator 201 and rotates in a direction opposite to the direction of the flexural traveling wave. A body to be driven (not shown) joined to the output shaft 203 is driven by the rotational force of the rotor 202. Upon the application of a voltage to a piezoelectric material, the piezoelectric material expands and contracts because of the transverse piezoelectric effect. An elastic body, such as a metal, joined to the piezoelectric element is bent with the expansion and contraction of the piezoelectric material. The ultrasonic motor described herein utilizes this principle.

FIG. 6B illustrates an ultrasonic motor that includes a multilayered piezoelectric element. The oscillator 204 includes a multilayered piezoelectric element 2042 in a tubular metal elastic body 2041. The multilayered piezoelectric element 2042 includes a plurality of layered piezoelectric materials (not shown) and includes a first electrode and a second electrode on the outer surfaces of the layered piezoelectric materials and internal electrodes within the layered piezoelectric materials. The metal elastic body 2041 is fastened with a bolt to hold the piezoelectric element 2042, thereby constituting the oscillator 204.

Upon the application of alternating voltages of different phases to the multilayered piezoelectric element 2042, the oscillator 204 causes two oscillations perpendicular to each other. The two oscillations are synthesized to form a circular oscillation for driving the tip of the oscillator 204. The oscillator 204 has an annular groove at its upper portion. The annular groove increases the oscillatory displacement for driving. A rotor 205 is pressed against the oscillator 204 by the action of a pressure spring 206 and receives friction force for driving. The rotor 205 is rotatably supported by a bearing.

(Optical Apparatus)

An optical apparatus according to an embodiment of the present invention will be described below. The optical apparatus includes a drive unit that includes the ultrasonic motor described above.

Figure 7A:
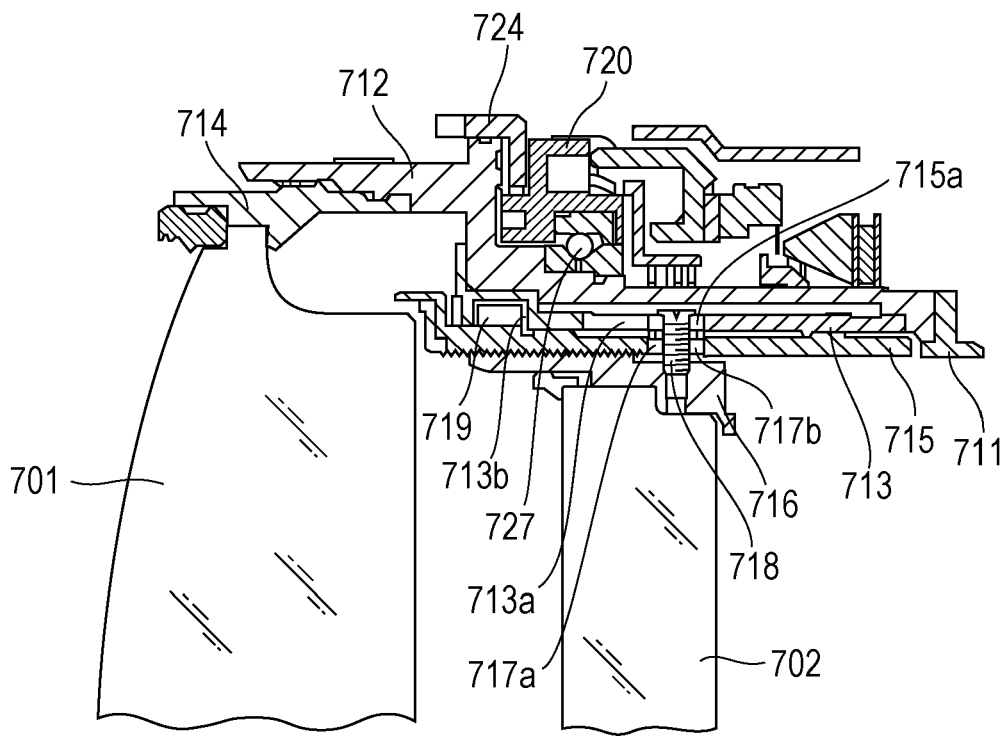
FIGS. 7A and 7B are schematic views of an optical apparatus according to an embodiment of the present invention.
Figure 7B:
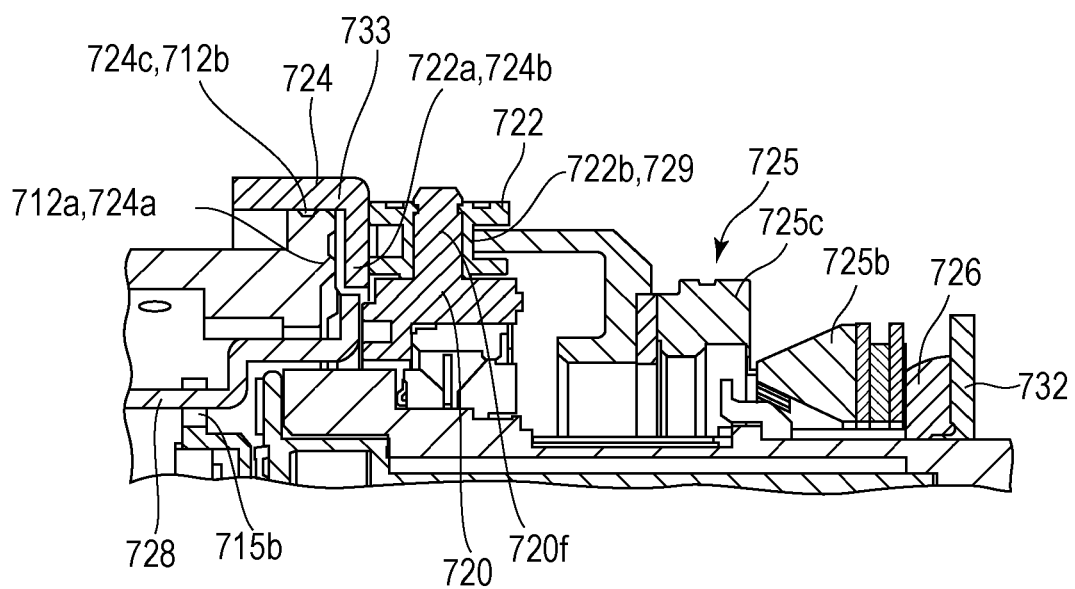
Figure 8:
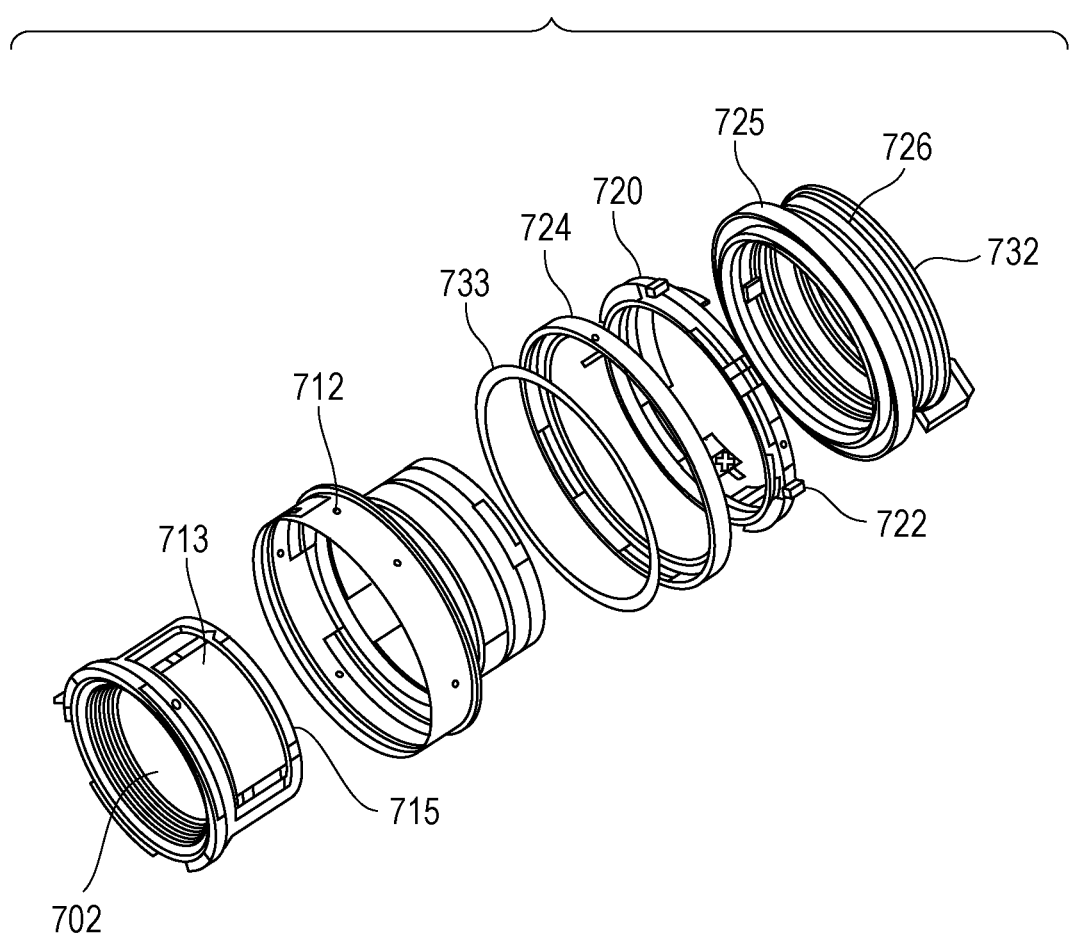
FIG. 8 is a schematic view of an optical apparatus according to an embodiment of the present invention.

FIGS. 7A and 7B are cross-sectional views of an interchangeable lens barrel of a single-lens reflex camera, which is an image pickup apparatus according to an embodiment of the present invention. FIG. 8 is an exploded perspective view of an interchangeable lens barrel of a single-lens reflex camera, which is an image pickup apparatus according to an embodiment of the present invention. A fixed barrel 712, a linear guide barrel 713, and a front lens group barrel 714 are fixed to a removable mount 711 of the camera. These components are fixed members of the interchangeable lens barrel.

The linear guide barrel 713 has a linear guide groove 713a for a focus lens 702 in the optical axis direction. The focus lens 702 is supported by a rear lens group barrel 716. Cam rollers 717a and 717b protruding outwardly in the radial direction are fixed to the rear lens group barrel 716 with a screw 718. The cam roller 717a fits in the linear guide groove 713a.

A cam ring 715 rotatably fits in the internal circumference of the linear guide barrel 713. A roller 719 fixed to the cam ring 715 is caught in an annular groove 713b of the linear guide barrel 713, thereby restricting the relative displacement of the linear guide barrel 713 and the cam ring 715 in the optical axis direction. The cam ring 715 has a cam groove 715a for the focus lens 702. The cam roller 717b also fits in the cam groove 715a.

A rotation transmitting ring 720 is rotatably held by a ball race 727 at a fixed position on the periphery of the fixed barrel 712. A driven roller 722 is rotatably held by a shaft 720f extending radially from the rotation transmitting ring 720. A large-diameter portion 722a of the driven roller 722 is in contact with a mount side end face 724b of a manual focus ring 724. A small-diameter portion 722b of the driven roller 722 is in contact with a joint 729. Six driven rollers 722 are disposed at regular intervals on the periphery of the rotation transmitting ring 720. Each of the driven rollers 722 satisfies the structural relationship described above.

A low-friction sheet (washer member) 733 is disposed on the inside of the manual focus ring 724. The low-friction sheet 733 is disposed between a mount side end face 712a of the fixed barrel 712 and a front end face 724a of the manual focus ring 724. The low-friction sheet 733 has a circular outer surface having a diameter that fits to the inner diameter 724c of the manual focus ring 724. The inner diameter 724c of the manual focus ring 724 fits to the diameter of an outer portion 712b of the fixed barrel 712. The low-friction sheet 733 can reduce friction in the rotating ring mechanism in which the manual focus ring 724 rotates about the optical axis relative to the fixed barrel 712.

The large-diameter portion 722a of the driven roller 722 is pressed against the mount side end face 724b of the manual focus ring because the wave washer 726 presses the ultrasonic motor 725 forward to the front of the lens. Likewise, because the wave washer 726 presses the ultrasonic motor 725 forward to the front of the lens, the small-diameter portion 722b of the driven roller 722 is pressed against the joint 729. The wave washer 726 is prevented from moving toward the mount by a washer 732 bayonet coupled to the fixed barrel 712. The spring force (impellent force) of the wave washer 726 is transmitted to the ultrasonic motor 725 and the driven roller 722 and furthermore presses the manual focus ring 724 against the mount side end face 712a of the fixed barrel 712. In other words, the manual focus ring 724 is pressed against the mount side end face 712a of the fixed barrel 712 via the low-friction sheet 733.

Thus, when the ultrasonic motor 725 is rotated by a control unit (not shown) relative to the fixed barrel 712, the driven roller 722 rotates about the shaft 720f because the joint 729 is in frictional contact with the small-diameter portion 722b of the driven roller 722. The rotation of the driven roller 722 about the shaft 720f causes the rotation of the rotation transmitting ring 720 about the optical axis (automatic focusing).

When a manual input unit (not shown) provides the manual focus ring 724 with rotational force about the optical axis, since the mount side end face 724b of the manual focus ring 724 is pressed against the large-diameter portion 722a of the driven roller 722, the driven roller 722 is rotated about the shaft 720f because of friction force. The rotation of the large-diameter portion 722a of the driven roller 722 about the shaft 720f causes the rotation of the rotation transmitting ring 720 about the optical axis. However, the ultrasonic motor 725 is not rotated because of the friction force between a rotor 725c and a stator 725b (manual focusing).

The rotation transmitting ring 720 is provided with two focus keys 728 facing each other. These focus keys 728 fit into notches 715b at the tip of the cam ring 715. Upon automatic focusing or manual focusing, the rotation transmitting ring 720 is rotated about the optical axis, and the rotational force is transmitted to the cam ring 715 via the focus keys 728. When the cam ring 715 is rotated about the optical axis, the cam roller 717b moves the cam roller 717a and the rear group lens barrel 716 restricted by the linear guide groove 713a forward or backward along the cam groove 715a of the cam ring 715. This drives the focus lens 702 and allows focusing.

Although an optical apparatus according to an embodiment of the present invention has been described with reference to an interchangeable lens barrel of a single-lens reflex camera, the optical apparatus may also be applied to optical apparatuses that include an ultrasonic motor in a drive unit, for example, cameras, such as compact cameras, electronic still cameras, and personal digital assistants including a camera.

(Vibratory Apparatus and Dust Removing Device)

Vibratory apparatuses for conveying or removing particles, powders, and droplets are widely used in electronic equipment.

As an example of a vibratory apparatus according to the present invention, a dust removing device that includes a piezoelectric element according to an embodiment of the present invention will be described below. A vibratory apparatus according to an embodiment of the present invention includes a vibrating member that includes the piezoelectric element or the multilayered piezoelectric element described above disposed on a diaphragm. The dust removing device includes a vibrating unit that includes the vibratory apparatus described above.

Figure 9A:
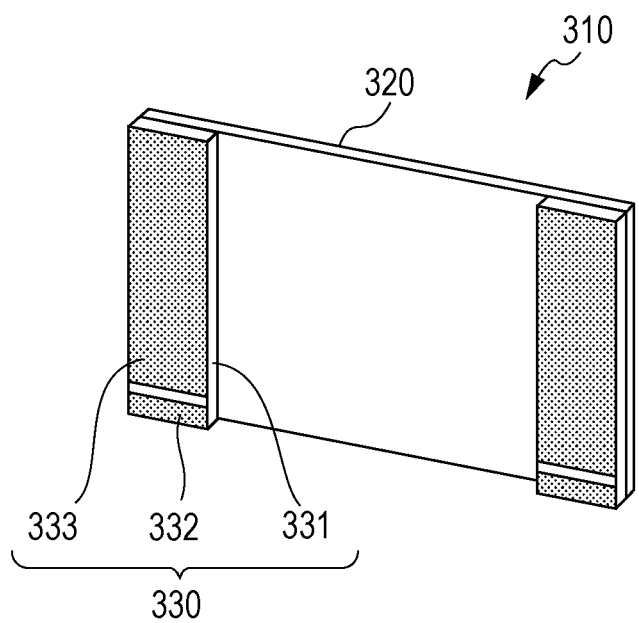
FIGS. 9A and 9B are schematic views of a dust removing device including a vibratory apparatus according to an embodiment of the present invention.
Figure 9B:
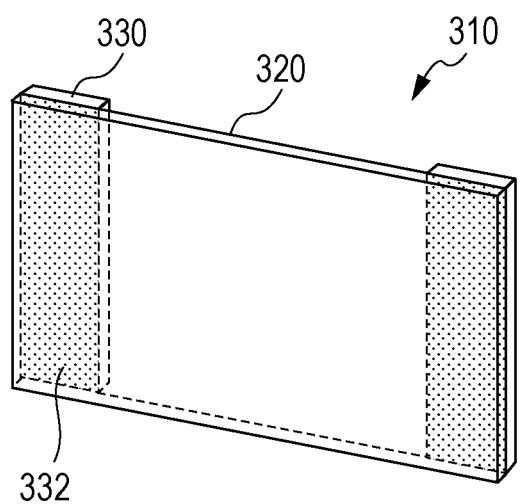

FIGS. 9A and 9B are schematic views of a dust removing device 310 according to an embodiment of the present invention. The dust removing device 310 includes a plate of the piezoelectric element 330 and the diaphragm 320. The piezoelectric element 330 may be a multilayered piezoelectric element according to an embodiment of the present invention. The diaphragm 320 may be made of any material. When the dust removing device 310 is used in optical devices, the diaphragm 320 may be made of a translucent or transparent material or a light reflective material.

Figure 10A:
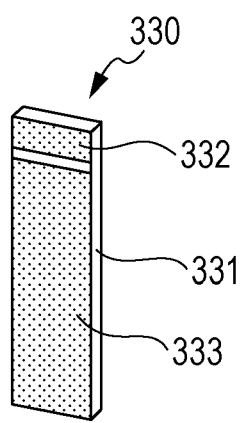
FIG. 10A is a schematic perspective view of a piezoelectric element of a dust removing device according to an embodiment of the present invention.
Figure 10B:
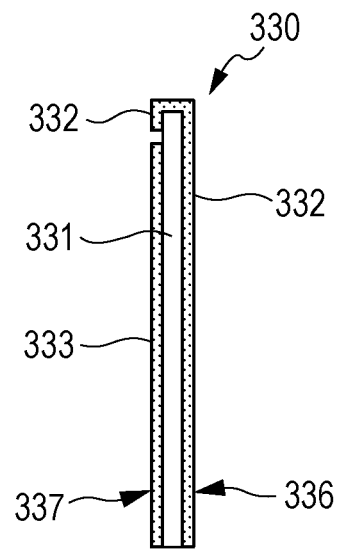
FIG. 10B is a side view of the piezoelectric element illustrated in FIG. 10A.
Figure 10C:
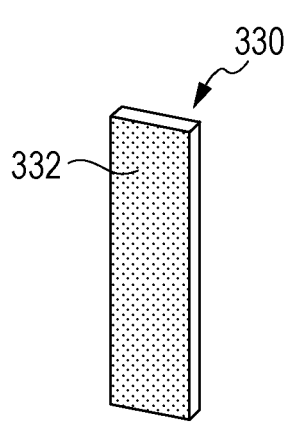
FIG. 10C is a schematic perspective view of the piezoelectric element illustrated in FIG. 10A.

FIGS. 10A to 10C are schematic views of the piezoelectric element 330 illustrated in FIGS. 9A and 9B. FIGS. 10A and 10C illustrate the front and back sides of the piezoelectric element 330. FIG. 10B is a side view of the piezoelectric element 330. As illustrated in FIGS. 9A and 9B, the piezoelectric element 330 includes a piezoelectric material 331, a first electrode 332, and a second electrode 333. The first electrode 332 and the second electrode 333 are disposed on opposite sides of the piezoelectric material 331. As in FIGS. 9A and 9B, the piezoelectric element 330 may be a multilayered piezoelectric element according to an embodiment of the present invention. In this case, the piezoelectric material 331 includes piezoelectric material layers and internal electrodes alternately stacked on top of one another. The internal electrodes are alternately connected to the first electrode 332 and the second electrode 333, thereby allowing the piezoelectric material layers to alternately have a drive waveform of a different phase. As illustrated in FIG. 10C, a surface of the piezoelectric element 330 on which the first electrode 332 is disposed is referred to as a first electrode surface 336. As illustrated in FIG. 10A, a surface of the piezoelectric element 330 on which the second electrode 333 is disposed is referred to as a second electrode surface 337.

The term "electrode surface", as used herein, refers to a surface of a piezoelectric element on which an electrode is disposed. For example, as illustrated in FIG. 10B, the first electrode 332 may round a corner and extends to the second electrode surface 337.

As illustrated in FIGS. 9A and 9B, the first electrode surface 336 of the piezoelectric element 330 is bonded to the diaphragm 320. Actuation of the piezoelectric element 330 produces a stress between the piezoelectric element 330 and the diaphragm 320, causing out-of-plane oscillations on the diaphragm 320. The dust removing device 310 removes foreign matter, such as dust, on the diaphragm 320 by the action of out-of-plane oscillations. The term "out-of-plane oscillations", as used herein, refers to elastic oscillations that cause displacements of a diaphragm in the optical axis direction or the diaphragm thickness direction.

Figure 11A:
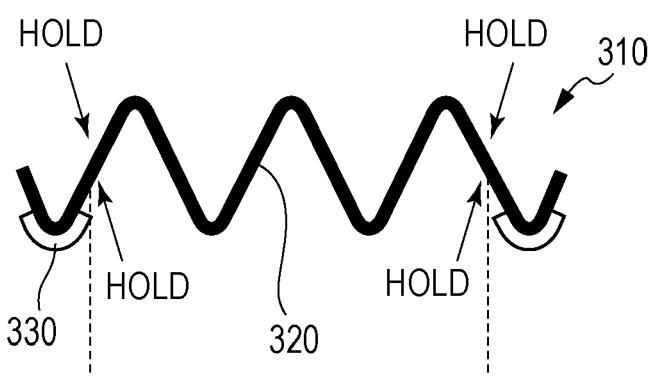
FIGS. 11A and 11B are schematic views illustrating the vibration principle of a dust removing device according to an embodiment of the present invention.
Figure 11B:
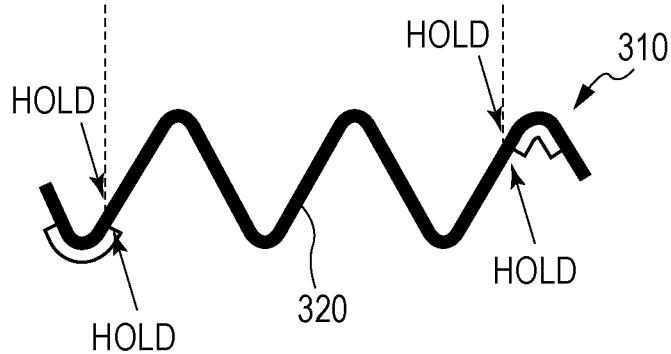

FIGS. 11A and 11B are schematic views illustrating the vibration principle of a dust removing device 310 according to an embodiment of the present invention. In FIG. 11A, an in-phase alternating electric voltage is applied to a left-and-right pair of the piezoelectric elements 330 to cause out-of-plane oscillations of the diaphragm 320. The direction of polarization of the piezoelectric material constituting the left-and-right pair of the piezoelectric elements 330 is the same as the thickness direction of the piezoelectric elements 330. The dust removing device 310 is driven in a seventh oscillation mode. In FIG. 11B, an anti-phase alternating voltage is applied to a left-and-right pair of the piezoelectric elements 330 to cause out-of-plane oscillations of the diaphragm 320. The dust removing device 310 is driven in a sixth oscillation mode. The dust removing device 310 can employ at least two oscillation modes to effectively remove dust on the surface of the diaphragm.

(Image Pickup Apparatus)

Figure 12:
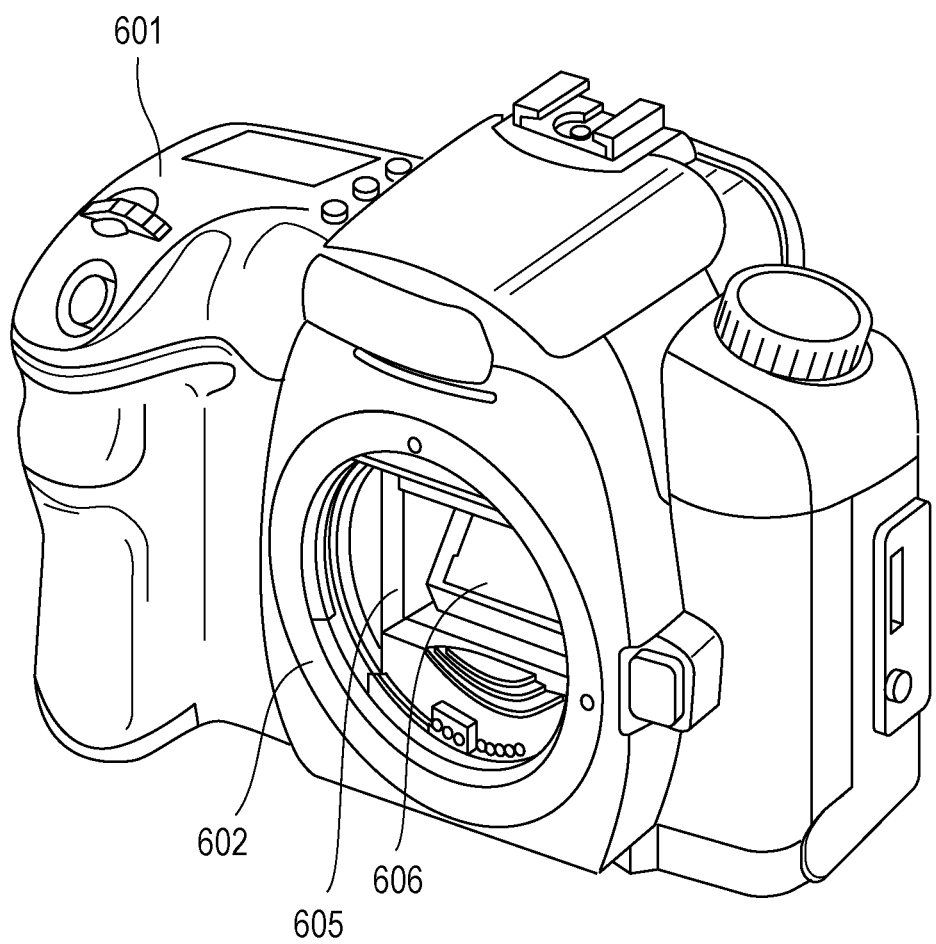
FIG. 12 is a schematic view of an image pickup apparatus according to an embodiment of the present invention.
Figure 13:
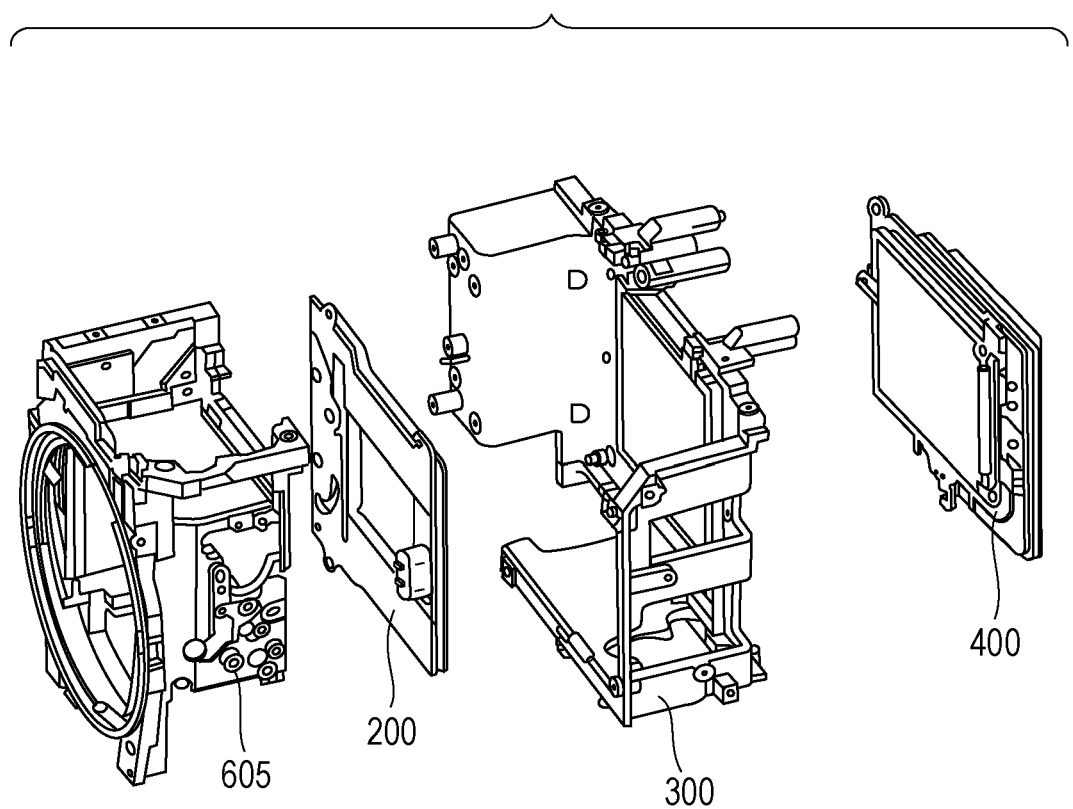
FIG. 13 is a schematic view of an image pickup apparatus according to an embodiment of the present invention.

An image pickup apparatus according to an embodiment of the present invention will be described below. The image pickup apparatus includes the dust removing device described above and an image pickup element unit, wherein the diaphragm of the dust removing device and a light-receiving surface of the image pickup element unit are disposed on the same axis, and the dust removing device faces the light-receiving surface of the image pickup element unit. FIGS. 12 and 13 illustrate a digital single-lens reflex camera, which is an image pickup apparatus according to an embodiment of the present invention.

FIG. 12 is a front perspective view of the main body 601 of the camera viewed from the object side. An imaging lens unit has been removed. FIG. 13 is an exploded perspective view of the inside of the camera, illustrating surrounding structures of a dust removing device according to an embodiment of the present invention and an image pickup unit 400.

The main body 601 of the camera includes a mirror box 605 to which an image light beam passing through an imaging lens is directed. The mirror box 605 includes a main mirror (quick return mirror) 606. The main mirror 606 can make an angle of 45 degrees with the optical axis to direct an image light beam to a penta roof mirror (not shown) or may avoid the image light beam in order to direct the image light beam to an image pickup element (not shown).

The mirror box 605 and a shutter unit 200 are disposed in front of a main body chassis 300 of the main body 601 of the camera in this order from the object side. The image pickup unit 400 is disposed on the photographer side of the main body chassis 300. The image pickup unit 400 is installed such that an image pickup surface of the image pickup element is disposed at a predetermined distance from and parallel to the surface of a mount 602 to which an imaging lens unit is to be attached.

The image pickup unit 400 includes a vibrating component of a dust removing device and an image pickup element unit. The vibrating component of the dust removing device is disposed on the same axis as the light-receiving surface of the image pickup element unit.

Although the digital single-lens reflex camera has been described as an image pickup apparatus according to an embodiment of the present invention, the image pickup apparatus may be an interchangeable-lens camera, such as a mirrorless digital interchangeable-lens camera without the mirror box 605. Among various image pickup apparatuses and electrical and electronic equipment that include image pickup apparatuses, such as interchangeable-lens video cameras, copying machines, facsimile machines, and scanners, an image pickup apparatus according to an embodiment of the present invention can particularly be applied to devices that require the removal of dust deposited on a surface of an optical component.

(Electronic Equipment)

Electronic equipment according to an embodiment of the present invention will be described below. The electronic equipment includes a piezoelectric acoustic component that includes a piezoelectric element or a multilayered piezoelectric element according to an embodiment of the present invention. The piezoelectric acoustic component may be a loudspeaker, a buzzer, a microphone, or a surface acoustic wave (SAW) device.

Figure 14:
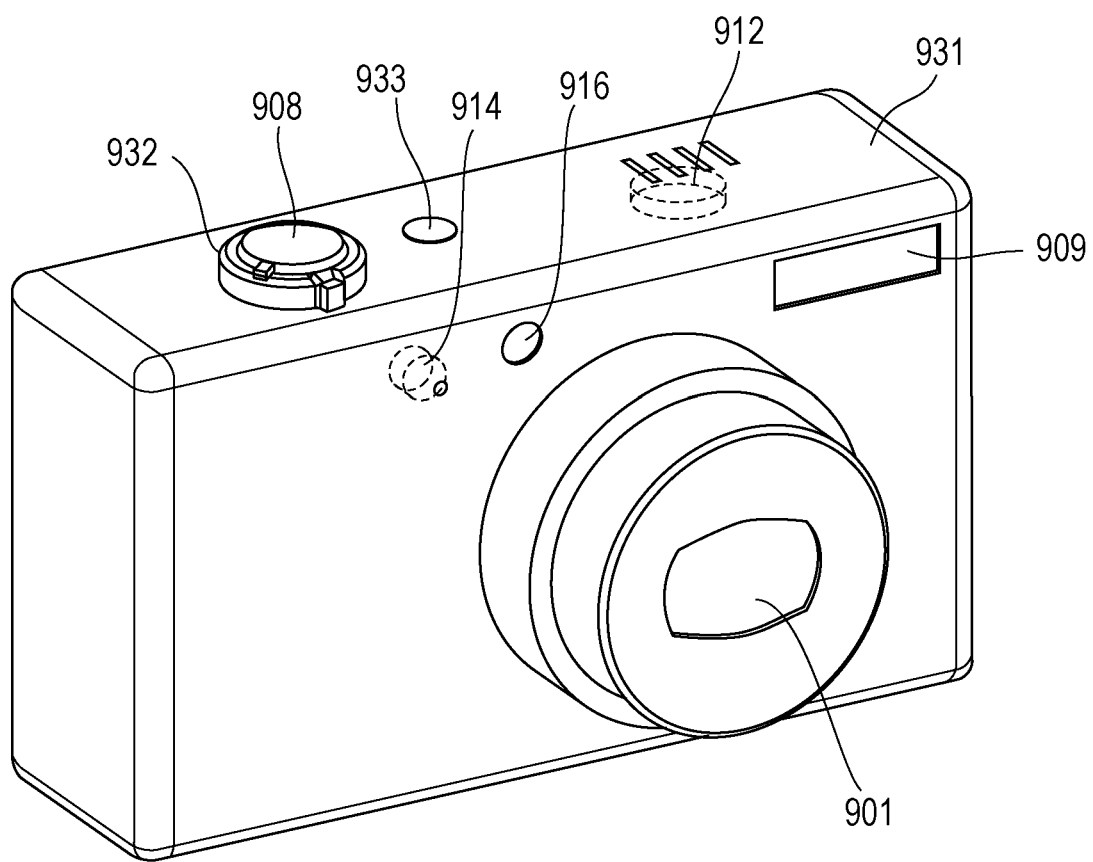
FIG. 14 is a schematic view of electronic equipment according to an embodiment of the present invention.

FIG. 14 is a perspective view of the main body 931 of a digital camera, which is electronic equipment according to an embodiment of the present invention. An optical device 901, a microphone 914, an electronic flash unit 909, and a fill light unit 916 are disposed on the front surface of the main body 931. The microphone 914 is disposed within the main body and is indicated by a broken line. An opening for catching external sound is disposed in front of the microphone 914.

A power switch 933, a loudspeaker 912, a zoom lever 932, and a release button 908 for focusing are disposed on the top surface of the main body 931. The loudspeaker 912 is disposed within the main body 931 and is indicated by a broken line. An opening for transmitting sound to the outside is disposed in front of the loudspeaker 912.

The piezoelectric acoustic component may be used in at least one of the microphone 914, the loudspeaker 912, and a surface acoustic wave device.

Although the digital camera has been described as electronic equipment according to an embodiment of the present invention, the electronic equipment may also be applied to electronic equipment that includes a piezoelectric acoustic component, such as audio-reproducing devices, audio-recording devices, mobile phones, and information terminals.

As described above, a piezoelectric element and a multilayered piezoelectric element according to an embodiment of the present invention are suitable for liquid discharge heads, liquid discharge apparatuses, ultrasonic motors, optical apparatuses, vibratory apparatuses, dust removing devices, image pickup apparatuses, and electronic equipment. A liquid discharge head manufactured by using a piezoelectric element or a multilayered piezoelectric element according to an embodiment of the present invention can have a nozzle density and a discharge velocity higher than or equal to those of liquid discharge heads manufactured by using a lead-containing piezoelectric element.

A liquid discharge apparatus manufactured by using a liquid discharge head according to an embodiment of the present invention can have a discharge velocity and discharge accuracy higher than or equal to those of liquid discharge apparatuses manufactured by using a lead-containing piezoelectric element.

An ultrasonic motor manufactured by using a piezoelectric element or a multilayered piezoelectric element according to an embodiment of the present invention can have driving force and durability higher than or equal to those of ultrasonic motors manufactured by using a lead-containing piezoelectric element.

An optical apparatus manufactured by using an ultrasonic motor according to an embodiment of the present invention can have durability and operation accuracy higher than or equal to those of optical apparatuses manufactured by using a lead-containing piezoelectric element.

A vibratory apparatus manufactured by using a piezoelectric element or a multilayered piezoelectric element according to an embodiment of the present invention can have vibratory capacity and durability higher than or equal to those of ultrasonic motors manufactured by using a lead-containing piezoelectric element.

A dust removing device manufactured by using a vibratory apparatus according to an embodiment of the present invention can have dust removal efficiency and durability higher than or equal to those of dust removing devices manufactured by using a lead-containing piezoelectric element.

An image pickup apparatus manufactured by using a dust removing device according to an embodiment of the present invention can have a dust removal function higher than or equal to those of image pickup apparatuses manufactured by using a lead-containing piezoelectric element.

A piezoelectric acoustic component that includes a piezoelectric element or a multilayered piezoelectric element according to an embodiment of the present invention can be used to provide electronic equipment that has sound production ability higher than or equal to those of electronic equipment manufactured by using a lead-containing piezoelectric element.

A piezoelectric material according to an embodiment of the present invention may be used in ultrasonic transducers, piezoelectric actuators, piezoelectric sensors, and ferroelectric memories, as well as liquid discharge heads and motors.

EXAMPLES

Although the present invention is further described in the following examples, the present invention is not limited to these examples.

A piezoelectric material according to an example of the present invention was produced as described below.
(Piezoelectric Material)
(Piezoelectric Material according to Example 1)

A raw material having the composition $(Ba_{0.900}Ca_{0.100})_{1.0111}(Ti_{0.970}Sn_{0.030})O_3$, which is represented by the general formula (1) $(Ba_{1-x}Ca_x)_a(Ti_{1-y-z}Sn_yZr_z)O_3$, wherein x=0.100, y=0.030, z=0, and a=1.0111, was weighed as described below.

Raw powders of barium titanate having an average particle size of 100 nm and a purity of 99.999% or more, calcium titanate having an average particle size of 300 nm and a purity of 99.999% or more, and barium stannate having an average particle size of 300 nm and a purity of 99.999% or more were produced by a solid phase method. These raw powders were weighed such that Ba, Ca, Ti, and Sn satisfied the composition $(Ba_{0.900}Ca_{0.100})_{1.0111}(Ti_{0.970}Sn_{0.030})O_3$. The Mg content of each of these raw powders (barium titanate, calcium titanate, and barium stannate) was 0.0001 parts by weight per 100 parts by weight of the raw powder as measured by ICP spectroscopy. The value a representing the ratio of the number of moles of Ba and Ca at the A site to the number of moles of Ti and Sn at the B site was controlled with barium oxalate and calcium oxalate.

Manganese dioxide was weighed such that the amount b (mol) of the first auxiliary component Mn was 0.0121 mol per mole of the composition $(Ba_{0.900}Ca_{0.100})_{1.0111}(Ti_{0.970}Sn_{0.030})O_3$.

These weighed powders were dry-blended in a ball mill for 24 hours. The Mg content of the mixed powder was measured by ICP spectroscopy. The Mg content was 0.0001 parts by weight per 100 parts by weight of the other raw materials based on the chemical formula $(Ba_{0.900}Ca_{0.100})_{1.0111}(Ti_{0.970}Sn_{0.030})O_3$. Three parts by weight of a PVA binder was deposited on the surface of 100 parts by weight of the mixed powder with a spray drier.

The resulting granulated powder was charged in a mold and was pressed at 200 MPa with a pressing machine to form a discoidal compact. This compact may be further pressed with a cold isostatic pressing machine.

The compact was held in an electric furnace at a maximum temperature $T_{max}$ of 1300° C. for 5 hours and was sintered in the ambient atmosphere for 24 hours in total.

The average equivalent circular diameter of the crystal grains, the percentage by number of crystal grains having an equivalent circular diameter of 25 μm or less (hereinafter referred to as D25), and the relative density of the resulting sintered body were measured. The average equivalent circular diameter was 1.27 μm, D25 was 99.7%, and the relative density was 98.3%. The crystal grains were observed mainly with a polarizing microscope. A small crystal grain size was determined with a scanning electron microscope (SEM). Photographic images taken with the polarizing microscope and the scanning electron microscope were processed to determine the average equivalent circular diameter and D25. The relative density was measurement in accordance with Archimedes' principle.

The sintered body was polished to a thickness of 0.5 mm, and the crystal structure of the sintered body was analyzed by X-ray diffraction. Only peaks corresponding to a perovskite structure were observed.

The composition of the piezoelectric material was determined by ICP spectroscopy. The piezoelectric material was mainly composed of a metal oxide having the chemical formula $(Ba_{0.900}Ca_{0.100})_{0.0111}(Ti_{0.970}Sn_{0.030})O_3$. One mol of the main component metal oxide contained 0.0121 mol of Mn. 100 parts by weight of the main component contained 0.0001 parts by weight of Mg. With respect to the other metals, the weighed composition agreed with the composition after sintering. Elements other than Ba, Ca, Ti, Sn, Mn, and Mg were below the detection limits of ICP spectroscopy.

The crystal grains were again observed. The average equivalent circular diameter was not significantly changed by polishing.
(Piezoelectric Materials According to Examples 2 to 58)

Piezoelectric materials according to Examples 2 to 58 were produced in the same manner as in Example 1. In addition to the raw materials used in Example 1, a barium zirconate powder having an average particle size of 300 nm and a purity of 99.999% or more was used if necessary. The raw powders were weighed such that Ba, Ca, Ti, Sn, and Zr had the ratio listed in Table 1. The value a representing the ratio of the number of moles of Ba and Ca at the A site to the number of moles of Ti and Sn at the B site was controlled with barium oxalate and calcium oxalate.

The raw powders were dry-blended in a ball mill for 24 hours. In order to control the Mg content in Examples 49 to 58, 100 parts by weight of barium titanate, calcium titanate, barium stannate, calcium zirconate, and barium oxalate in total based on the chemical formula $(Ba_{1-x}Ca_x)_a(Ti_{1-y-z}Sn_yZr_z)O_3$ were dry-blended with 0.0004 parts by weight (Example 49), 0.0009 parts by weight (Example 50), 0.0049 parts by weight (Example 51), 0.0099 parts by weight (Example 52), 0.0499 parts by weight (Example 53, 55, or 57), or 0.0999 parts by weight (Example 54, 56, or 58) of magnesium oxide in a ball mill for 24 hours.

These weighed powders were dry-blended in a ball mill for 24 hours. Three parts by weight of a PVA binder was deposited on the surface of 100 parts by weight of the mixed powder with a spray drier.

The resulting granulated powder was charged in a mold and was pressed at 200 MPa with a pressing machine to form a discoidal compact.

The compact was held in an electric furnace at a maximum temperature $T_{max}$ listed in Table 1 for 5 hours and was sintered in the ambient atmosphere for 24 hours in total.

TABLE 1

| | Main component | | | | | First auxiliary component | Second auxiliary component | Max temperature |
|---|---|---|---|---|---|---|---|---|
| | Ba $1-x$ | Ca $x$ | Ti $1-y-z$ | Sn $y$ | Zr $z$ | A/B $a$ | Mn $b$ | Mg Parts by weight | $T_{max}$ [° C.] |
| Example 1 | 0.900 | 0.100 | 0.970 | 0.030 | 0.000 | 1.0111 | 0.0121 | 0.0001 | 1300 |
| Example 2 | 0.935 | 0.065 | 0.960 | 0.040 | 0.000 | 1.0111 | 0.0121 | 0.0001 | 1300 |
| Example 3 | 0.870 | 0.130 | 0.960 | 0.040 | 0.000 | 1.0111 | 0.0121 | 0.0001 | 1300 |
| Example 4 | 0.800 | 0.200 | 0.960 | 0.040 | 0.000 | 1.0111 | 0.0121 | 0.0001 | 1300 |
| Example 5 | 0.920 | 0.080 | 0.965 | 0.035 | 0.000 | 1.0111 | 0.0121 | 0.0001 | 1300 |
| Example 6 | 0.830 | 0.170 | 0.965 | 0.035 | 0.000 | 1.0111 | 0.0121 | 0.0001 | 1300 |
| Example 7 | 0.920 | 0.080 | 0.970 | 0.030 | 0.000 | 1.0111 | 0.0121 | 0.0001 | 1300 |
| Example 8 | 0.870 | 0.130 | 0.970 | 0.030 | 0.000 | 1.0111 | 0.0121 | 0.0001 | 1300 |
| Example 9 | 0.920 | 0.080 | 0.980 | 0.020 | 0.000 | 1.0111 | 0.0121 | 0.0001 | 1300 |
| Example 10 | 0.870 | 0.130 | 0.980 | 0.020 | 0.000 | 1.0111 | 0.0121 | 0.0001 | 1300 |
| Example 11 | 0.920 | 0.080 | 0.985 | 0.015 | 0.000 | 1.0111 | 0.0121 | 0.0001 | 1300 |
| Example 12 | 0.830 | 0.170 | 0.985 | 0.015 | 0.000 | 1.0111 | 0.0121 | 0.0001 | 1300 |
| Example 13 | 0.946 | 0.054 | 0.990 | 0.010 | 0.000 | 1.0111 | 0.0121 | 0.0001 | 1300 |
| Example 14 | 0.800 | 0.200 | 0.990 | 0.010 | 0.000 | 1.0111 | 0.0121 | 0.0001 | 1300 |
| Example 15 | 0.924 | 0.076 | 0.930 | 0.040 | 0.030 | 1.0111 | 0.0121 | 0.0001 | 1350 |
| Example 16 | 0.800 | 0.200 | 0.930 | 0.040 | 0.030 | 1.0111 | 0.0121 | 0.0001 | 1350 |
| Example 17 | 0.920 | 0.080 | 0.935 | 0.035 | 0.030 | 1.0111 | 0.0121 | 0.0001 | 1350 |
| Example 18 | 0.830 | 0.170 | 0.935 | 0.035 | 0.030 | 1.0111 | 0.0121 | 0.0001 | 1350 |
| Example 19 | 0.920 | 0.080 | 0.940 | 0.030 | 0.030 | 1.0111 | 0.0121 | 0.0001 | 1350 |
| Example 20 | 0.900 | 0.100 | 0.940 | 0.030 | 0.030 | 1.0111 | 0.0121 | 0.0001 | 1350 |
| Example 21 | 0.870 | 0.130 | 0.940 | 0.030 | 0.030 | 1.0111 | 0.0121 | 0.0001 | 1350 |
| Example 22 | 0.920 | 0.080 | 0.950 | 0.020 | 0.030 | 1.0111 | 0.0121 | 0.0001 | 1350 |
| Example 23 | 0.870 | 0.130 | 0.950 | 0.020 | 0.030 | 1.0111 | 0.0121 | 0.0001 | 1350 |
| Example 24 | 0.920 | 0.080 | 0.955 | 0.015 | 0.030 | 1.0111 | 0.0121 | 0.0001 | 1350 |
| Example 25 | 0.830 | 0.170 | 0.955 | 0.015 | 0.030 | 1.0111 | 0.0121 | 0.0001 | 1350 |
| Example 26 | 0.935 | 0.065 | 0.960 | 0.010 | 0.030 | 1.0111 | 0.0121 | 0.0001 | 1350 |
| Example 27 | 0.800 | 0.200 | 0.960 | 0.010 | 0.030 | 1.0111 | 0.0121 | 0.0001 | 1350 |
| Example 28 | 0.920 | 0.080 | 0.920 | 0.040 | 0.040 | 1.0111 | 0.0121 | 0.0001 | 1350 |
| Example 29 | 0.800 | 0.200 | 0.920 | 0.040 | 0.040 | 1.0111 | 0.0121 | 0.0001 | 1350 |
| Example 30 | 0.920 | 0.080 | 0.925 | 0.035 | 0.040 | 1.0111 | 0.0121 | 0.0001 | 1350 |
| Example 31 | 0.830 | 0.170 | 0.925 | 0.035 | 0.040 | 1.0111 | 0.0121 | 0.0001 | 1350 |
| Example 32 | 0.920 | 0.080 | 0.930 | 0.030 | 0.040 | 1.0111 | 0.0121 | 0.0001 | 1350 |
| Example 33 | 0.900 | 0.100 | 0.930 | 0.030 | 0.040 | 1.0111 | 0.0121 | 0.0001 | 1350 |
| Example 34 | 0.870 | 0.130 | 0.930 | 0.030 | 0.040 | 1.0111 | 0.0121 | 0.0001 | 1350 |
| Example 35 | 0.920 | 0.080 | 0.940 | 0.020 | 0.040 | 1.0111 | 0.0121 | 0.0001 | 1350 |
| Example 36 | 0.870 | 0.130 | 0.940 | 0.020 | 0.040 | 1.0111 | 0.0121 | 0.0001 | 1350 |
| Example 37 | 0.920 | 0.080 | 0.945 | 0.015 | 0.040 | 1.0111 | 0.0121 | 0.0001 | 1350 |
| Example 38 | 0.830 | 0.170 | 0.945 | 0.015 | 0.040 | 1.0111 | 0.0121 | 0.0001 | 1350 |
| Example 39 | 0.931 | 0.069 | 0.950 | 0.010 | 0.040 | 1.0111 | 0.0121 | 0.0001 | 1350 |
| Example 40 | 0.800 | 0.200 | 0.950 | 0.010 | 0.040 | 1.0111 | 0.0121 | 0.0001 | 1350 |
| Example 41 | 0.800 | 0.200 | 0.990 | 0.010 | 0.000 | 1.0111 | 0.0121 | 0.0001 | 1450 |
| Example 42 | 0.800 | 0.200 | 0.990 | 0.010 | 0.000 | 1.0111 | 0.0121 | 0.0001 | 1400 |
| Example 43 | 0.800 | 0.200 | 0.990 | 0.010 | 0.000 | 1.0111 | 0.0121 | 0.0001 | 1350 |
| Example 44 | 0.900 | 0.100 | 0.970 | 0.030 | 0.000 | 1.0046 | 0.0121 | 0.0001 | 1300 |
| Example 45 | 0.900 | 0.100 | 0.970 | 0.030 | 0.000 | 1.0146 | 0.0121 | 0.0001 | 1300 |
| Example 46 | 0.900 | 0.100 | 0.970 | 0.030 | 0.000 | 1.0038 | 0.0048 | 0.0001 | 1300 |
| Example 47 | 0.900 | 0.100 | 0.970 | 0.030 | 0.000 | 1.0230 | 0.0240 | 0.0001 | 1300 |
| Example 48 | 0.900 | 0.100 | 0.970 | 0.030 | 0.000 | 1.0390 | 0.0400 | 0.0001 | 1300 |
| Example 49 | 0.900 | 0.100 | 0.970 | 0.030 | 0.000 | 1.0111 | 0.0121 | 0.0005 | 1300 |
| Example 50 | 0.900 | 0.100 | 0.970 | 0.030 | 0.000 | 1.0111 | 0.0121 | 0.0010 | 1300 |
| Example 51 | 0.900 | 0.100 | 0.970 | 0.030 | 0.000 | 1.0111 | 0.0121 | 0.0050 | 1300 |
| Example 52 | 0.900 | 0.100 | 0.970 | 0.030 | 0.000 | 1.0111 | 0.0121 | 0.0100 | 1300 |
| Example 53 | 0.900 | 0.100 | 0.970 | 0.030 | 0.000 | 1.0111 | 0.0121 | 0.0500 | 1300 |
| Example 54 | 0.900 | 0.100 | 0.970 | 0.030 | 0.000 | 1.0111 | 0.0121 | 0.1000 | 1300 |
| Example 55 | 0.920 | 0.080 | 0.950 | 0.020 | 0.030 | 1.0111 | 0.0121 | 0.0500 | 1350 |
| Example 56 | 0.920 | 0.080 | 0.950 | 0.020 | 0.030 | 1.0111 | 0.0121 | 0.1000 | 1350 |
| Example 57 | 0.830 | 0.170 | 0.945 | 0.015 | 0.040 | 1.0111 | 0.0121 | 0.0500 | 1350 |
| Example 58 | 0.830 | 0.170 | 0.945 | 0.015 | 0.040 | 1.0111 | 0.0121 | 0.1000 | 1350 |
| Comparative example 1 | 0.960 | 0.040 | 0.930 | 0.070 | 0.000 | 1.0111 | 0.0121 | 0.0001 | 1300 |
| Comparative example 2 | 0.750 | 0.250 | 0.930 | 0.070 | 0.000 | 1.0111 | 0.0121 | 0.0001 | 1300 |
| Comparative example 3 | 0.960 | 0.040 | 0.960 | 0.040 | 0.000 | 1.0111 | 0.0121 | 0.0001 | 1300 |
| Comparative example 4 | 0.750 | 0.250 | 0.990 | 0.010 | 0.000 | 1.0111 | 0.0121 | 0.0001 | 1300 |
| Comparative example 5 | 0.960 | 0.040 | 0.995 | 0.005 | 0.000 | 1.0111 | 0.0121 | 0.0001 | 1300 |
| Comparative example 6 | 0.750 | 0.250 | 0.995 | 0.005 | 0.000 | 1.0111 | 0.0121 | 0.0001 | 1300 |
| Comparative example 7 | 0.960 | 0.040 | 0.900 | 0.070 | 0.030 | 1.0111 | 0.0121 | 0.0001 | 1300 |
| Comparative example 8 | 0.750 | 0.250 | 0.900 | 0.070 | 0.030 | 1.0111 | 0.0121 | 0.0001 | 1300 |
| Comparative example 9 | 0.906 | 0.040 | 0.930 | 0.040 | 0.030 | 1.0111 | 0.0121 | 0.0001 | 1300 |
| Comparative example 10 | 0.750 | 0.250 | 0.960 | 0.010 | 0.030 | 1.0111 | 0.0121 | 0.0001 | 1300 |
| Comparative example 11 | 0.960 | 0.040 | 0.965 | 0.005 | 0.030 | 1.0111 | 0.0121 | 0.0001 | 1300 |

TABLE 1-continued

|  | Main component | | | | | | First auxiliary component | Second auxiliary component | Max temperature |
| --- | --- | --- | --- | --- | --- | --- | --- | --- | --- |
|  | Ba 1 − x | Ca x | Ti 1 − y − z | Sn y | Zr z | A/B a | Mn b | Mg Parts by weight | $T_{max}$ [° C.] |
| Comparative example 12 | 0.750 | 0.250 | 0.965 | 0.005 | 0.030 | 1.0111 | 0.0121 | 0.0001 | 1300 |
| Comparative example 13 | 0.960 | 0.040 | 0.890 | 0.070 | 0.040 | 1.0111 | 0.0121 | 0.0001 | 1300 |
| Comparative example 14 | 0.750 | 0.250 | 0.890 | 0.070 | 0.040 | 1.0111 | 0.0121 | 0.0001 | 1300 |
| Comparative example 15 | 0.960 | 0.040 | 0.920 | 0.040 | 0.040 | 1.0111 | 0.0121 | 0.0001 | 1300 |
| Comparative example 16 | 0.750 | 0.250 | 0.950 | 0.010 | 0.040 | 1.0111 | 0.0121 | 0.0001 | 1300 |
| Comparative example 17 | 0.960 | 0.040 | 0.955 | 0.005 | 0.040 | 1.0111 | 0.0121 | 0.0001 | 1300 |
| Comparative example 18 | 0.750 | 0.250 | 0.955 | 0.005 | 0.040 | 1.0111 | 0.0121 | 0.0001 | 1300 |
| Comparative example 19 | 0.990 | 0.010 | 0.910 | 0.040 | 0.050 | 1.0111 | 0.0121 | 0.0001 | 1300 |
| Comparative example 20 | 0.900 | 0.100 | 0.970 | 0.030 | 0.000 | 1.0031 | 0.0121 | 0.0001 | 1300 |
| Comparative example 21 | 0.900 | 0.100 | 0.970 | 0.030 | 0.000 | 1.0161 | 0.0121 | 0.0001 | 1300 |
| Comparative example 22 | 0.900 | 0.100 | 0.970 | 0.030 | 0.000 | 1.0020 | 0.0030 | 0.0001 | 1300 |
| Comparative example 23 | 0.900 | 0.100 | 0.970 | 0.030 | 0.000 | 1.0440 | 0.0450 | 0.0001 | 1300 |
| Comparative example 24 | 0.900 | 0.100 | 0.970 | 0.030 | 0.000 | 1.0111 | 0.0121 | 0.1200 | 1300 |

The average equivalent circular diameter, D25, and the relative density were determined in the same manner as in Example 1. Table 2 shows the results.

TABLE 2-1

|  | Average equivalent circular diameter [μm] | D25 [%] | Relative density [%] |
| --- | --- | --- | --- |
| Example 1 | 1.27 | 99.7 | 98.3 |
| Example 2 | 1.25 | 99.9 | 92.8 |
| Example 3 | 1.78 | 99.7 | 92.5 |
| Example 4 | 2.79 | 99.9 | 92.1 |
| Example 5 | 1.25 | 99.5 | 94.5 |
| Example 6 | 2.33 | 99.6 | 93.8 |
| Example 7 | 1.29 | 100.0 | 98.1 |
| Example 8 | 1.62 | 99.8 | 97.7 |
| Example 9 | 1.96 | 99.7 | 98.5 |
| Example 10 | 1.89 | 99.8 | 96.1 |
| Example 11 | 2.21 | 99.5 | 94.6 |
| Example 12 | 2.56 | 99.5 | 94.5 |
| Example 13 | 2.34 | 99.5 | 92.9 |
| Example 14 | 2.60 | 99.6 | 91.5 |
| Example 15 | 2.15 | 99.7 | 92.7 |
| Example 16 | 3.66 | 99.4 | 91.3 |
| Example 17 | 2.20 | 99.6 | 93.4 |
| Example 18 | 3.31 | 99.5 | 94.2 |
| Example 19 | 2.22 | 99.8 | 96.2 |
| Example 20 | 2.39 | 99.9 | 98.0 |
| Example 21 | 2.62 | 99.6 | 96.7 |
| Example 22 | 2.88 | 99.8 | 97.4 |
| Example 23 | 3.05 | 99.5 | 95.9 |
| Example 24 | 2.94 | 99.7 | 94.9 |
| Example 25 | 3.68 | 99.3 | 93.5 |
| Example 26 | 3.11 | 99.5 | 92.3 |
| Example 27 | 3.60 | 99.4 | 90.9 |
| Example 28 | 2.10 | 99.6 | 91.9 |
| Example 29 | 3.49 | 99.4 | 91.7 |
| Example 30 | 2.18 | 99.6 | 93.1 |
| Example 31 | 3.06 | 99.5 | 93.4 |
| Example 32 | 2.21 | 99.8 | 96.7 |
| Example 33 | 2.08 | 99.6 | 97.5 |
| Example 34 | 2.18 | 99.6 | 97.2 |
| Example 35 | 2.73 | 99.7 | 96.6 |
| Example 36 | 2.99 | 99.6 | 95.8 |
| Example 37 | 2.95 | 99.8 | 93.3 |
| Example 38 | 3.60 | 99.5 | 93.2 |
| Example 39 | 2.67 | 99.6 | 91.5 |
| Example 40 | 3.92 | 99.4 | 90.9 |
| Example 41 | 14.90 | 86.9 | 89.5 |
| Example 42 | 9.78 | 99.0 | 90.4 |
| Example 43 | 4.45 | 99.2 | 92.7 |
| Example 44 | 4.47 | 99.2 | 95.5 |
| Example 45 | 1.58 | 99.7 | 95.0 |
| Example 46 | 2.22 | 99.7 | 96.3 |
| Example 47 | 2.56 | 99.8 | 95.9 |
| Example 48 | 2.84 | 99.8 | 95.7 |
| Example 49 | 1.27 | 99.7 | 98.3 |
| Example 50 | 1.26 | 99.6 | 98.0 |
| Example 51 | 1.25 | 99.7 | 97.4 |
| Example 52 | 1.21 | 99.7 | 97.0 |
| Example 53 | 1.19 | 99.8 | 95.9 |
| Example 54 | 1.12 | 99.8 | 95.1 |
| Example 55 | 2.20 | 99.7 | 96.6 |
| Example 56 | 2.06 | 99.7 | 95.2 |
| Example 57 | 3.30 | 99.6 | 93.2 |
| Example 58 | 3.08 | 99.5 | 93.1 |
| Comparative example 1 | 1.30 | 99.1 | 94.3 |
| Comparative example 2 | 1.22 | 99.2 | 93.7 |
| Comparative example 3 | 1.54 | 99.3 | 91.5 |
| Comparative example 4 | 1.42 | 99.2 | 92.0 |
| Comparative example 5 | 1.25 | 99.4 | 93.4 |
| Comparative example 6 | 1.19 | 99.3 | 92.3 |
| Comparative example 7 | 1.39 | 99.4 | 91.0 |
| Comparative example 8 | 1.34 | 99.3 | 90.5 |
| Comparative example 9 | 1.29 | 99.2 | 93.2 |
| Comparative example 10 | 1.30 | 99.3 | 91.2 |
| Comparative example 11 | 1.20 | 99.1 | 90.1 |
| Comparative example 12 | 1.36 | 99.2 | 90.8 |
| Comparative example 13 | 1.27 | 99.2 | 91.3 |
| Comparative example 14 | 1.28 | 99.2 | 90.3 |
| Comparative example 15 | 1.15 | 99.0 | 92.0 |
| Comparative example 16 | 0.92 | 99.4 | 90.6 |
| Comparative example 17 | 0.94 | 99.4 | 92.3 |
| Comparative example 18 | 1.04 | 99.1 | 91.9 |
| Comparative example 19 | 0.86 | 99.4 | 78.6 |
| Comparative example 20 | 17.70 | 76.8 | 91.2 |

TABLE 2-1-continued

| | Average equivalent circular diameter [μm] | D25 [%] | Relative density [%] |
|---|---|---|---|
| Comparative example 21 | 0.86 | 99.1 | 78.9 |
| Comparative example 22 | 1.24 | 99.4 | 93.5 |
| Comparative example 23 | 5.56 | 99.0 | 91.6 |
| Comparative example 24 | 1.11 | 99.7 | 91.9 |

The composition analysis was performed in the same manner as in Example 1. Table 3 shows the results. The fourth auxiliary component in the table is an element other than Ba, Ca, Ti, Zr, Sn, Mn, and Mg. Zero in the following table means that the corresponding component was below the detection limit of ICP spectroscopy. 0.0001 parts by weight of the Mg component was derived from high-purity raw materials. With respect to the other metals, the weighed composition agreed with the composition after sintering.

(Metal Oxide Materials According to Comparative Examples 1 to 24)

Comparative metal oxide materials were produced in the same manner as in Example 1. Table 1 listed the main components, the first auxiliary component and the second auxiliary component, the A/B site ratio, and the maximum temperature $T_{max}$ in sintering.

The average equivalent circular diameter and the relative density were determined in the same manner as in Example 1. Table 2 shows the results.

The composition analysis was performed in the same manner as in Example 1. Table 3 shows the results. The fourth auxiliary component in the table is an element other than Ba, Ca, Ti, Zr, Sn, Mn, and Mg. Zero means that the corresponding component was below the detection limit of ICP spectroscopy. 0.0001 parts by weight of the Mg component was probably derived from high-purity raw materials. With respect to the other metals, the weighed composition agreed with the composition after sintering. In order to control the Mg content in Comparative Example 24, 100 parts by weight of barium titanate, calcium titanate, barium stannate, and barium oxalate in total based on the chemical formula $(Ba_{0.900}Ca_{0.100})_{1.0111}(Ti_{0.970}Sn_{0.030})O_3$ were dry-blended with 0.1199 parts by weight of magnesium oxide in a ball mill for 24 hours.

TABLE 3

| | Main component | | | | | | First auxiliary component | Second auxiliary component Mg | Fourth auxiliary component |
|---|---|---|---|---|---|---|---|---|---|
| | Ba 1 − x | Ca x | Ti 1 − y − z | Sn y | Zr z | A/B a | Mn b | Parts by weight | |
| Example 1 | 0.900 | 0.100 | 0.970 | 0.030 | 0 | 1.0111 | 0.0121 | 0.0001 | 0 |
| Example 2 | 0.935 | 0.065 | 0.960 | 0.040 | 0 | 1.0111 | 0.0121 | 0.0001 | 0 |
| Example 3 | 0.870 | 0.130 | 0.960 | 0.040 | 0 | 1.0111 | 0.0121 | 0.0001 | 0 |
| Example 4 | 0.800 | 0.200 | 0.960 | 0.040 | 0 | 1.0111 | 0.0121 | 0.0001 | 0 |
| Example 5 | 0.920 | 0.080 | 0.965 | 0.035 | 0 | 1.0111 | 0.0121 | 0.0001 | 0 |
| Example 6 | 0.830 | 0.170 | 0.965 | 0.035 | 0 | 1.0111 | 0.0121 | 0.0001 | 0 |
| Example 7 | 0.920 | 0.080 | 0.970 | 0.030 | 0 | 1.0111 | 0.0121 | 0.0001 | 0 |
| Example 8 | 0.870 | 0.130 | 0.970 | 0.030 | 0 | 1.0111 | 0.0121 | 0.0001 | 0 |
| Example 9 | 0.920 | 0.080 | 0.980 | 0.020 | 0 | 1.0111 | 0.0121 | 0.0001 | 0 |
| Example 10 | 0.870 | 0.130 | 0.980 | 0.020 | 0 | 1.0111 | 0.0121 | 0.0001 | 0 |
| Example 11 | 0.920 | 0.080 | 0.985 | 0.015 | 0 | 1.0111 | 0.0121 | 0.0001 | 0 |
| Example 12 | 0.830 | 0.170 | 0.985 | 0.015 | 0 | 1.0111 | 0.0121 | 0.0001 | 0 |
| Example 13 | 0.946 | 0.054 | 0.990 | 0.010 | 0 | 1.0111 | 0.0121 | 0.0001 | 0 |
| Example 14 | 0.800 | 0.200 | 0.990 | 0.010 | 0 | 1.0111 | 0.0121 | 0.0001 | 0 |
| Example 15 | 0.924 | 0.076 | 0.930 | 0.040 | 0.030 | 1.0111 | 0.0121 | 0.0001 | 0 |
| Example 16 | 0.800 | 0.200 | 0.930 | 0.040 | 0.030 | 1.0111 | 0.0121 | 0.0001 | 0 |
| Example 17 | 0.920 | 0.080 | 0.935 | 0.035 | 0.030 | 1.0111 | 0.0121 | 0.0001 | 0 |
| Example 18 | 0.830 | 0.170 | 0.935 | 0.035 | 0.030 | 1.0111 | 0.0121 | 0.0001 | 0 |
| Example 19 | 0.920 | 0.080 | 0.940 | 0.030 | 0.030 | 1.0111 | 0.0121 | 0.0001 | 0 |
| Example 20 | 0.900 | 0.100 | 0.940 | 0.030 | 0.030 | 1.0111 | 0.0121 | 0.0001 | 0 |
| Example 21 | 0.870 | 0.130 | 0.940 | 0.030 | 0.030 | 1.0111 | 0.0121 | 0.0001 | 0 |
| Example 22 | 0.920 | 0.080 | 0.950 | 0.020 | 0.030 | 1.0111 | 0.0121 | 0.0001 | 0 |
| Example 23 | 0.870 | 0.130 | 0.950 | 0.020 | 0.030 | 1.0111 | 0.0121 | 0.0001 | 0 |
| Example 24 | 0.920 | 0.080 | 0.955 | 0.015 | 0.030 | 1.0111 | 0.0121 | 0.0001 | 0 |
| Example 25 | 0.830 | 0.170 | 0.955 | 0.015 | 0.030 | 1.0111 | 0.0121 | 0.0001 | 0 |
| Example 26 | 0.935 | 0.065 | 0.960 | 0.010 | 0.030 | 1.0111 | 0.0121 | 0.0001 | 0 |
| Example 27 | 0.800 | 0.200 | 0.960 | 0.010 | 0.030 | 1.0111 | 0.0121 | 0.0001 | 0 |
| Example 28 | 0.920 | 0.080 | 0.920 | 0.040 | 0.040 | 1.0111 | 0.0121 | 0.0001 | 0 |
| Example 29 | 0.800 | 0.200 | 0.920 | 0.040 | 0.040 | 1.0111 | 0.0121 | 0.0001 | 0 |
| Example 30 | 0.920 | 0.080 | 0.925 | 0.035 | 0.040 | 1.0111 | 0.0121 | 0.0001 | 0 |
| Example 31 | 0.830 | 0.170 | 0.925 | 0.035 | 0.040 | 1.0111 | 0.0121 | 0.0001 | 0 |
| Example 32 | 0.920 | 0.080 | 0.930 | 0.030 | 0.040 | 1.0111 | 0.0121 | 0.0001 | 0 |
| Example 33 | 0.900 | 0.100 | 0.930 | 0.030 | 0.040 | 1.0111 | 0.0121 | 0.0001 | 0 |
| Example 34 | 0.870 | 0.130 | 0.930 | 0.030 | 0.040 | 1.0111 | 0.0121 | 0.0001 | 0 |
| Example 35 | 0.920 | 0.080 | 0.940 | 0.020 | 0.040 | 1.0111 | 0.0121 | 0.0001 | 0 |
| Example 36 | 0.870 | 0.130 | 0.940 | 0.020 | 0.040 | 1.0111 | 0.0121 | 0.0001 | 0 |
| Example 37 | 0.920 | 0.080 | 0.945 | 0.015 | 0.040 | 1.0111 | 0.0121 | 0.0001 | 0 |
| Example 38 | 0.830 | 0.170 | 0.945 | 0.015 | 0.040 | 1.0111 | 0.0121 | 0.0001 | 0 |
| Example 39 | 0.931 | 0.069 | 0.950 | 0.010 | 0.040 | 1.0111 | 0.0121 | 0.0001 | 0 |
| Example 40 | 0.800 | 0.200 | 0.950 | 0.010 | 0.040 | 1.0111 | 0.0121 | 0.0001 | 0 |
| Example 41 | 0.800 | 0.200 | 0.990 | 0.010 | 0 | 1.0111 | 0.0121 | 0.0001 | 0 |

TABLE 3-continued

| | Main component | | | | | First auxiliary component | Second auxiliary component Mg | Fourth auxiliary component |
| | Ba $1-x$ | Ca $x$ | Ti $1-y-z$ | Sn $y$ | Zr $z$ | A/B $a$ | Mn $b$ | Parts by weight | |
|---|---|---|---|---|---|---|---|---|---|
| Example 42 | 0.800 | 0.200 | 0.990 | 0.010 | 0 | 1.0111 | 0.0121 | 0.0001 | 0 |
| Example 43 | 0.800 | 0.200 | 0.990 | 0.010 | 0 | 1.0111 | 0.0121 | 0.0001 | 0 |
| Example 44 | 0.900 | 0.100 | 0.970 | 0.030 | 0 | 1.0046 | 0.0121 | 0.0001 | 0 |
| Example 45 | 0.900 | 0.100 | 0.970 | 0.030 | 0 | 1.0146 | 0.0121 | 0.0001 | 0 |
| Example 46 | 0.900 | 0.100 | 0.970 | 0.030 | 0 | 1.0038 | 0.0048 | 0.0001 | 0 |
| Example 47 | 0.900 | 0.100 | 0.970 | 0.030 | 0 | 1.0230 | 0.0240 | 0.0001 | 0 |
| Example 48 | 0.900 | 0.100 | 0.970 | 0.030 | 0 | 1.0390 | 0.0400 | 0.0001 | 0 |
| Example 49 | 0.900 | 0.100 | 0.970 | 0.030 | 0 | 1.0111 | 0.0121 | 0.0005 | 0 |
| Example 50 | 0.900 | 0.100 | 0.970 | 0.030 | 0 | 1.0111 | 0.0121 | 0.0010 | 0 |
| Example 51 | 0.900 | 0.100 | 0.970 | 0.030 | 0 | 1.0111 | 0.0121 | 0.0050 | 0 |
| Example 52 | 0.900 | 0.100 | 0.970 | 0.030 | 0 | 1.0111 | 0.0121 | 0.0100 | 0 |
| Example 53 | 0.900 | 0.100 | 0.970 | 0.030 | 0 | 1.0111 | 0.0121 | 0.0500 | 0 |
| Example 54 | 0.900 | 0.100 | 0.970 | 0.030 | 0 | 1.0111 | 0.0121 | 0.1000 | 0 |
| Example 55 | 0.920 | 0.080 | 0.950 | 0.020 | 0.030 | 1.0111 | 0.0121 | 0.0500 | 0 |
| Example 56 | 0.920 | 0.080 | 0.950 | 0.020 | 0.030 | 1.0111 | 0.0121 | 0.1000 | 0 |
| Example 57 | 0.830 | 0.170 | 0.945 | 0.015 | 0.040 | 1.0111 | 0.0121 | 0.0500 | 0 |
| Example 58 | 0.830 | 0.170 | 0.945 | 0.015 | 0.040 | 1.0111 | 0.0121 | 0.1000 | 0 |
| Comparative example 1 | 0.960 | 0.040 | 0.930 | 0.070 | 0 | 1.0111 | 0.0121 | 0.0001 | 0 |
| Comparative example 2 | 0.750 | 0.250 | 0.930 | 0.070 | 0 | 1.0111 | 0.0121 | 0.0001 | 0 |
| Comparative example 3 | 0.960 | 0.040 | 0.960 | 0.040 | 0 | 1.0111 | 0.0121 | 0.0001 | 0 |
| Comparative example 4 | 0.750 | 0.250 | 0.990 | 0.010 | 0 | 1.0111 | 0.0121 | 0.0001 | 0 |
| Comparative example 5 | 0.960 | 0.040 | 0.995 | 0.005 | 0 | 1.0111 | 0.0121 | 0.0001 | 0 |
| Comparative example 6 | 0.750 | 0.250 | 0.995 | 0.005 | 0 | 1.0111 | 0.0121 | 0.0001 | 0 |
| Comparative example 7 | 0.960 | 0.040 | 0.900 | 0.070 | 0.030 | 1.0111 | 0.0121 | 0.0001 | 0 |
| Comparative example 8 | 0.750 | 0.250 | 0.900 | 0.070 | 0.030 | 1.0111 | 0.0121 | 0.0001 | 0 |
| Comparative example 9 | 0.960 | 0.040 | 0.930 | 0.040 | 0.030 | 1.0111 | 0.0121 | 0.0001 | 0 |
| Comparative example 10 | 0.750 | 0.250 | 0.960 | 0.010 | 0.030 | 1.0111 | 0.0121 | 0.0001 | 0 |
| Comparative example 11 | 0.960 | 0.040 | 0.965 | 0.005 | 0.030 | 1.0111 | 0.0121 | 0.0001 | 0 |
| Comparative example 12 | 0.750 | 0.250 | 0.965 | 0.005 | 0.030 | 1.0111 | 0.0121 | 0.0001 | 0 |
| Comparative example 13 | 0.960 | 0.040 | 0.890 | 0.070 | 0.040 | 1.0111 | 0.0121 | 0.0001 | 0 |
| Comparative example 14 | 0.750 | 0.250 | 0.890 | 0.070 | 0.040 | 1.0111 | 0.0121 | 0.0001 | 0 |
| Comparative example 15 | 0.960 | 0.040 | 0.920 | 0.040 | 0.040 | 1.0111 | 0.0121 | 0.0001 | 0 |
| Comparative example 16 | 0.750 | 0.250 | 0.950 | 0.010 | 0.040 | 1.0111 | 0.0121 | 0.0001 | 0 |
| Comparative example 17 | 0.960 | 0.040 | 0.955 | 0.005 | 0.040 | 1.0111 | 0.0121 | 0.0001 | 0 |
| Comparative example 18 | 0.750 | 0.250 | 0.955 | 0.005 | 0.040 | 1.0111 | 0.0121 | 0.0001 | 0 |
| Comparative example 19 | 0.990 | 0.010 | 0.910 | 0.040 | 0.050 | 1.0111 | 0.0121 | 0.0001 | 0 |
| Comparative example 20 | 0.900 | 0.100 | 0.970 | 0.030 | 0 | 1.0031 | 0.0121 | 0.0001 | 0 |
| Comparative example 21 | 0.900 | 0.100 | 0.970 | 0.030 | 0 | 1.0161 | 0.0121 | 0.0001 | 0 |
| Comparative example 22 | 0.900 | 0.100 | 0.970 | 0.030 | 0 | 1.0020 | 0.0030 | 0.0001 | 0 |
| Comparative example 23 | 0.900 | 0.100 | 0.970 | 0.030 | 0 | 1.0440 | 0.0450 | 0.0001 | 0 |
| Comparative example 24 | 0.900 | 0.100 | 0.970 | 0.030 | 0 | 1.0111 | 0.0121 | 0.1200 | 0 |

Example 59

Barium titanate, calcium titanate, barium stannate, barium zirconate, and barium oxalate raw powders used in Examples 1 to 58 were weighed such that the main components Ba, Ca, Ti, Zr, and Sn of the metal oxide having the general formula (1) $(Ba_{1-x}Ca_x)_a(Ti_{1-y-z}Sn_yZr_z)O_3$ had the ratio listed in Table 4. Manganese dioxide was weighed such that the ratio of the first auxiliary component Mn to 1 mol of the main component metal oxide satisfied the ratio listed in Table 4. Silicon dioxide and boron oxide were weighed such that the ratios of the third auxiliary components Si and B on a metal basis to 100 parts by weight of the main component metal oxide satisfied the ratios listed in Table 4. These weighed powders were mixed and granulated in the same manner as in Example 1. The powders were fired at the maximum temperature $T_{max}$ listed in Table 4 in the same manner as in Example 1. The average equivalent circular diameter, D25, and the relative density were determined in the same manner as in Example 1. Table 5 shows the results. The composition was determined in the same manner as in Example 1. Table 6 shows the results.

(Piezoelectric Materials According to Examples 60 to 91)

Piezoelectric materials were produced in the same manner as in Example 59. Table 4 listed the ratios and the maximum temperature $T_{max}$. The raw material of Cu was copper (II) oxide. The average equivalent circular diameter, D25, and the relative density were determined. Table 5 shows the results. The composition was determined in the same manner as in Example 1. Table 6 shows the results. The fourth auxiliary component in Table 6 is an element other than Ba, Ca, Ti, Zr, Sn, Mn, Mg, Cu, Si, and B. Zero means that the corresponding component was below the detection limit of ICP spectroscopy. With respect to the other metals, the weighed composition agreed with the composition after sintering.

Figure 15A:
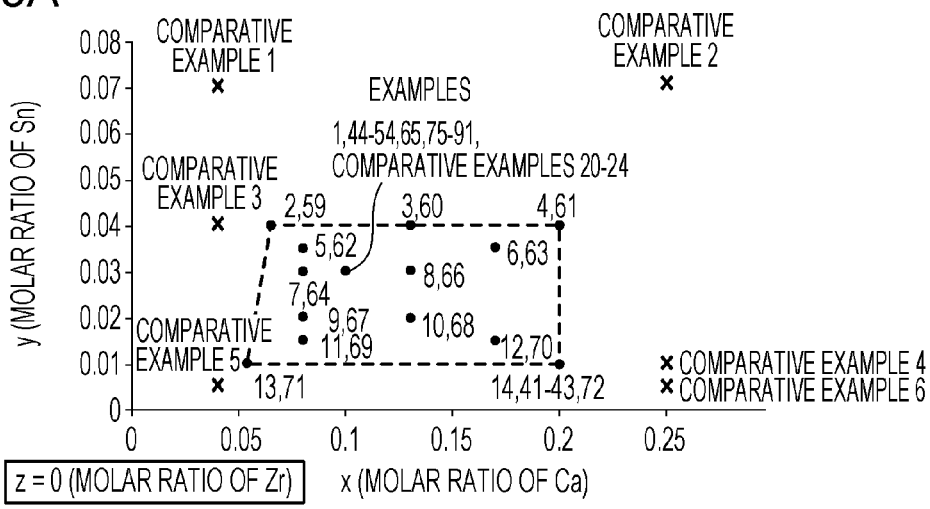
FIGS. 15A to 15C are phase diagrams illustrating the relationship between the x-values, the y-values, and the z-values of piezoelectric materials according to examples and metal oxide materials according to comparative examples of the present invention.
Figure 15B:
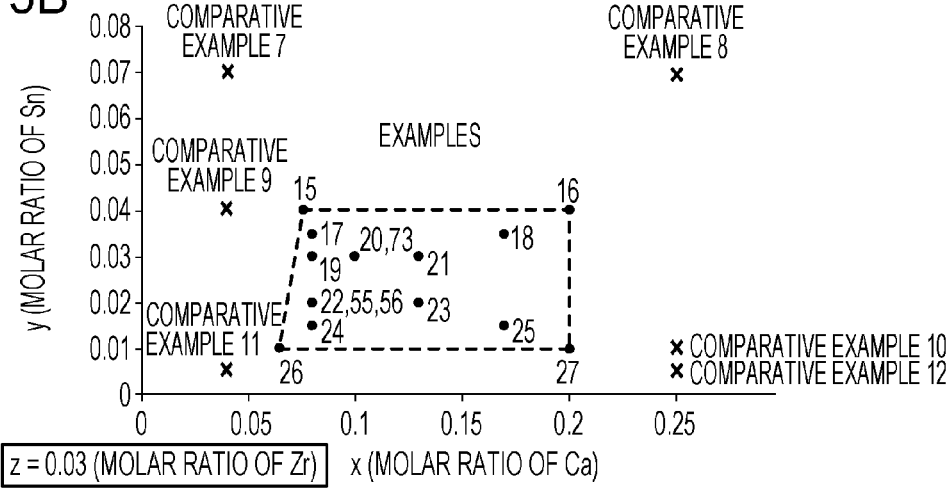
Figure 15C:
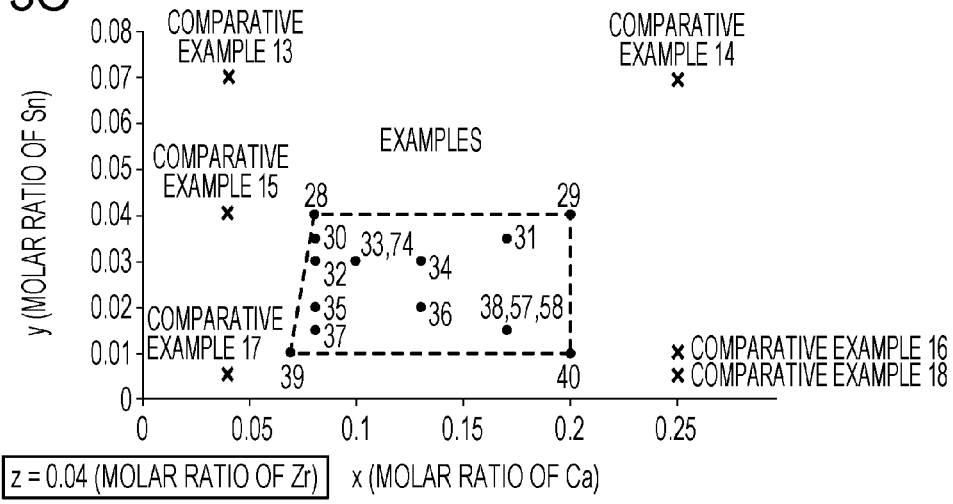

FIGS. 15A to 15C are phase diagrams illustrating the relationship between the x-values, the y-values, and the z-values of the piezoelectric materials according to Examples 1 to 91 and the metal oxide materials according to Comparative Examples 1 to 24. The regions surrounded by the dotted lines indicate the ranges of the x and y values in the general formula (1). x denotes the molar ratio of Ca and is in the range of 0.050≤x≤0.200. y denotes the molar ratio of Sn and is in the range of 0.010≤y≤0.040. FIG. 15A corresponds to z=0. FIG. 15B corresponds to z=0.030. FIG. 15C corresponds to z=0.040.

TABLE 4

| | Main component | | | | | | First auxiliary component | Second auxiliary component Mg | Third auxiliary component | | | | Max temperature |
| | Ba $1-x$ | Ca $x$ | Ti $1-y-z$ | Sn $y$ | Zr $z$ | A/B $a$ | Mn $b$ | Parts by weight | Cu Parts by weight | Si Parts by weight | B Parts by weight | Total Parts by weight | $T_{max}$ [° C.] |
|---|---|---|---|---|---|---|---|---|---|---|---|---|---|
| Example 59 | 0.935 | 0.065 | 0.960 | 0.040 | 0 | 1.0111 | 0.0121 | 0.0001 | 0 | 0.0140 | 0.0066 | 0.0206 | 1200 |
| Example 60 | 0.870 | 0.130 | 0.960 | 0.040 | 0 | 1.0111 | 0.0121 | 0.0001 | 0 | 0.0140 | 0.0066 | 0.0206 | 1200 |
| Example 61 | 0.800 | 0.200 | 0.960 | 0.040 | 0 | 1.0111 | 0.0121 | 0.0001 | 0 | 0.0140 | 0.0066 | 0.0206 | 1200 |
| Example 62 | 0.920 | 0.080 | 0.965 | 0.035 | 0 | 1.0111 | 0.0121 | 0.0001 | 0 | 0.0140 | 0.0066 | 0.0206 | 1200 |
| Example 63 | 0.830 | 0.170 | 0.965 | 0.035 | 0 | 1.0111 | 0.0121 | 0.0001 | 0 | 0.0140 | 0.0066 | 0.0206 | 1200 |
| Example 64 | 0.920 | 0.080 | 0.970 | 0.030 | 0 | 1.0111 | 0.0121 | 0.0001 | 0 | 0.0140 | 0.0066 | 0.0206 | 1200 |
| Example 65 | 0.900 | 0.100 | 0.970 | 0.030 | 0 | 1.0111 | 0.0121 | 0.0001 | 0 | 0.0140 | 0.0066 | 0.0206 | 1200 |
| Example 66 | 0.870 | 0.130 | 0.970 | 0.030 | 0 | 1.0111 | 0.0121 | 0.0001 | 0 | 0.0140 | 0.0066 | 0.0206 | 1200 |
| Example 67 | 0.920 | 0.080 | 0.980 | 0.020 | 0 | 1.0111 | 0.0121 | 0.0001 | 0 | 0.0140 | 0.0066 | 0.0206 | 1200 |
| Example 68 | 0.870 | 0.130 | 0.980 | 0.020 | 0 | 1.0111 | 0.0121 | 0.0001 | 0 | 0.0140 | 0.0066 | 0.0206 | 1200 |
| Example 69 | 0.920 | 0.080 | 0.985 | 0.015 | 0 | 1.0111 | 0.0121 | 0.0001 | 0 | 0.0140 | 0.0066 | 0.0206 | 1200 |
| Example 70 | 0.830 | 0.170 | 0.985 | 0.015 | 0 | 1.0111 | 0.0121 | 0.0001 | 0 | 0.0140 | 0.0066 | 0.0206 | 1200 |
| Example 71 | 0.946 | 0.054 | 0.990 | 0.010 | 0 | 1.0111 | 0.0121 | 0.0001 | 0 | 0.0140 | 0.0066 | 0.0206 | 1200 |
| Example 72 | 0.800 | 0.200 | 0.990 | 0.010 | 0 | 1.0111 | 0.0121 | 0.0001 | 0 | 0.0140 | 0.0066 | 0.0206 | 1200 |
| Example 73 | 0.900 | 0.100 | 0.940 | 0.030 | 0.030 | 1.0111 | 0.0121 | 0.0001 | 0 | 0.0140 | 0.0066 | 0.0206 | 1200 |
| Example 74 | 0.900 | 0.100 | 0.930 | 0.030 | 0.040 | 1.0111 | 0.0121 | 0.0001 | 0 | 0.0140 | 0.0066 | 0.0206 | 1200 |
| Example 75 | 0.900 | 0.100 | 0.970 | 0.030 | 0 | 1.0111 | 0.0121 | 0.0001 | 0.0010 | 0 | 0 | 0.0010 | 1200 |
| Example 76 | 0.900 | 0.100 | 0.970 | 0.030 | 0 | 1.0111 | 0.0121 | 0.0001 | 4.0000 | 0 | 0 | 4.0000 | 1200 |
| Example 77 | 0.900 | 0.100 | 0.970 | 0.030 | 0 | 1.0111 | 0.0121 | 0.0001 | 0 | 0.0010 | 0 | 0.0010 | 1200 |
| Example 78 | 0.900 | 0.100 | 0.970 | 0.030 | 0 | 1.0111 | 0.0121 | 0.0001 | 0 | 4.0000 | 0 | 4.0000 | 1200 |
| Example 79 | 0.900 | 0.100 | 0.970 | 0.030 | 0 | 1.0111 | 0.0121 | 0.0001 | 0 | 0.0000 | 0.0010 | 0.0010 | 1200 |
| Example 80 | 0.900 | 0.100 | 0.970 | 0.030 | 0 | 1.0111 | 0.0121 | 0.0001 | 0 | 0.0000 | 4.0000 | 4.0000 | 1200 |
| Example 81 | 0.900 | 0.100 | 0.970 | 0.030 | 0 | 1.0111 | 0.0121 | 0.0001 | 0 | 0.0005 | 0.0005 | 0.0010 | 1200 |
| Example 82 | 0.900 | 0.100 | 0.970 | 0.030 | 0 | 1.0111 | 0.0121 | 0.0001 | 0 | 0.0100 | 0.0066 | 0.0166 | 1200 |
| Example 83 | 0.900 | 0.100 | 0.970 | 0.030 | 0 | 1.0111 | 0.0121 | 0.0001 | 0 | 0.0250 | 0.0066 | 0.0316 | 1200 |
| Example 84 | 0.900 | 0.100 | 0.970 | 0.030 | 0 | 1.0111 | 0.0121 | 0.0001 | 0 | 0.0300 | 0.0066 | 0.0366 | 1200 |
| Example 85 | 0.900 | 0.100 | 0.970 | 0.030 | 0 | 1.0111 | 0.0121 | 0.0001 | 0 | 2.0000 | 2.0000 | 4.0000 | 1200 |
| Example 86 | 0.900 | 0.100 | 0.970 | 0.030 | 0 | 1.0111 | 0.0121 | 0.0001 | 0.0005 | 0.0005 | 0 | 0.0010 | 1200 |
| Example 87 | 0.900 | 0.100 | 0.970 | 0.030 | 0 | 1.0111 | 0.0121 | 0.0001 | 2.0000 | 2.0000 | 0 | 4.0000 | 1200 |
| Example 88 | 0.900 | 0.100 | 0.970 | 0.030 | 0 | 1.0111 | 0.0121 | 0.0001 | 0.0005 | 0 | 0.0005 | 0.0010 | 1200 |
| Example 89 | 0.900 | 0.100 | 0.970 | 0.030 | 0 | 1.0111 | 0.0121 | 0.0001 | 2.0000 | 0 | 2.0000 | 4.0000 | 1200 |
| Example 90 | 0.900 | 0.100 | 0.970 | 0.030 | 0 | 1.0111 | 0.0121 | 0.0001 | 0.0034 | 0.0034 | 0.0034 | 0.0102 | 1200 |
| Example 91 | 0.900 | 0.100 | 0.970 | 0.030 | 0 | 1.0111 | 0.0121 | 0.0001 | 1.3000 | 1.3000 | 1.3000 | 3.9000 | 1200 |

TABLE 5

| | Average equivalent circular diameter [μm] | D25 [%] | Relative density [%] |
|---|---|---|---|
| Example 59 | 1.18 | 99.9 | 92.9 |
| Example 60 | 1.69 | 99.8 | 92.5 |
| Example 61 | 1.99 | 99.8 | 91.6 |
| Example 62 | 1.23 | 99.9 | 93.9 |
| Example 63 | 1.27 | 100.0 | 94.3 |
| Example 64 | 1.30 | 99.9 | 96.5 |
| Example 65 | 1.22 | 100.0 | 97.5 |
| Example 66 | 1.44 | 99.9 | 96.3 |
| Example 67 | 1.89 | 99.8 | 96.1 |
| Example 68 | 1.75 | 99.8 | 95.5 |
| Example 69 | 1.86 | 99.8 | 94.0 |
| Example 70 | 1.86 | 99.7 | 94.3 |
| Example 71 | 1.58 | 99.9 | 92.0 |
| Example 72 | 2.00 | 99.7 | 91.4 |
| Example 73 | 2.01 | 99.7 | 97.6 |
| Example 74 | 1.95 | 99.8 | 96.9 |
| Example 75 | 1.45 | 99.9 | 96.5 |
| Example 76 | 1.52 | 99.9 | 95.2 |
| Example 77 | 1.47 | 100.0 | 96.2 |
| Example 78 | 1.50 | 99.6 | 95.9 |
| Example 79 | 1.48 | 99.8 | 95.6 |
| Example 80 | 1.47 | 99.9 | 95.7 |
| Example 81 | 1.55 | 99.8 | 96.4 |
| Example 82 | 1.39 | 99.9 | 95.7 |
| Example 83 | 1.51 | 99.8 | 97.0 |
| Example 84 | 1.53 | 99.9 | 95.8 |
| Example 85 | 1.46 | 99.9 | 95.2 |
| Example 86 | 1.55 | 99.8 | 95.8 |
| Example 87 | 1.57 | 99.6 | 96.2 |
| Example 88 | 1.47 | 99.9 | 96.2 |
| Example 89 | 1.48 | 100.0 | 95.6 |
| Example 90 | 1.54 | 99.8 | 96.6 |
| Example 91 | 1.49 | 99.9 | 96.0 |

TABLE 6

| | Main component | | | | | | First auxiliary component | Second auxiliary component Mg | Third auxiliary component | | | | Fourth auxiliary component |
|---|---|---|---|---|---|---|---|---|---|---|---|---|---|
| | Ba $1-x$ | Ca $x$ | Ti $1-y-z$ | Sn $y$ | Zr $z$ | A/B $a$ | Mn $b$ | Parts by weight | Cu Parts by weight | Si Parts by weight | B Parts by weight | Total Parts by weight | |
| Example 59 | 0.935 | 0.065 | 0.960 | 0.040 | 0 | 1.0111 | 0.0121 | 0.0001 | 0 | 0.0140 | 0.0066 | 0.0206 | 0 |
| Example 60 | 0.870 | 0.130 | 0.960 | 0.040 | 0 | 1.0111 | 0.0121 | 0.0001 | 0 | 0.0140 | 0.0066 | 0.0206 | 0 |
| Example 61 | 0.800 | 0.200 | 0.960 | 0.040 | 0 | 1.0111 | 0.0121 | 0.0001 | 0 | 0.0140 | 0.0066 | 0.0206 | 0 |
| Example 62 | 0.920 | 0.080 | 0.965 | 0.035 | 0 | 1.0111 | 0.0121 | 0.0001 | 0 | 0.0140 | 0.0066 | 0.0206 | 0 |
| Example 63 | 0.830 | 0.170 | 0.965 | 0.035 | 0 | 1.0111 | 0.0121 | 0.0001 | 0 | 0.0140 | 0.0066 | 0.0206 | 0 |
| Example 64 | 0.920 | 0.080 | 0.970 | 0.030 | 0 | 1.0111 | 0.0121 | 0.0001 | 0 | 0.0140 | 0.0066 | 0.0206 | 0 |
| Example 65 | 0.900 | 0.100 | 0.970 | 0.030 | 0 | 1.0111 | 0.0121 | 0.0001 | 0 | 0.0140 | 0.0066 | 0.0206 | 0 |
| Example 66 | 0.870 | 0.130 | 0.970 | 0.030 | 0 | 1.0111 | 0.0121 | 0.0001 | 0 | 0.0140 | 0.0066 | 0.0206 | 0 |
| Example 67 | 0.920 | 0.080 | 0.980 | 0.020 | 0 | 1.0111 | 0.0121 | 0.0001 | 0 | 0.0140 | 0.0066 | 0.0206 | 0 |
| Example 68 | 0.870 | 0.130 | 0.980 | 0.020 | 0 | 1.0111 | 0.0121 | 0.0001 | 0 | 0.0140 | 0.0066 | 0.0206 | 0 |
| Example 69 | 0.920 | 0.080 | 0.985 | 0.015 | 0 | 1.0111 | 0.0121 | 0.0001 | 0 | 0.0140 | 0.0066 | 0.0206 | 0 |
| Example 70 | 0.830 | 0.170 | 0.985 | 0.015 | 0 | 1.0111 | 0.0121 | 0.0001 | 0 | 0.0140 | 0.0066 | 0.0206 | 0 |
| Example 71 | 0.946 | 0.054 | 0.990 | 0.010 | 0 | 1.0111 | 0.0121 | 0.0001 | 0 | 0.0140 | 0.0066 | 0.0206 | 0 |
| Example 72 | 0.800 | 0.200 | 0.990 | 0.010 | 0 | 1.0111 | 0.0121 | 0.0001 | 0 | 0.0140 | 0.0066 | 0.0206 | 0 |
| Example 73 | 0.900 | 0.100 | 0.940 | 0.030 | 0.030 | 1.0111 | 0.0121 | 0.0001 | 0 | 0.0140 | 0.0066 | 0.0206 | 0 |
| Example 74 | 0.900 | 0.100 | 0.930 | 0.030 | 0.040 | 1.0111 | 0.0121 | 0.0001 | 0 | 0.0140 | 0.0066 | 0.0206 | 0 |
| Example 75 | 0.900 | 0.100 | 0.970 | 0.030 | 0 | 1.0111 | 0.0121 | 0.0001 | 0.0010 | 0 | 0 | 0.0010 | 0 |
| Example 76 | 0.900 | 0.100 | 0.970 | 0.030 | 0 | 1.0111 | 0.0121 | 0.0001 | 4.0000 | 0 | 0 | 4.0000 | 0 |
| Example 77 | 0.900 | 0.100 | 0.970 | 0.030 | 0 | 1.0111 | 0.0121 | 0.0001 | 0 | 0.0010 | 0 | 0.0010 | 0 |
| Example 78 | 0.900 | 0.100 | 0.970 | 0.030 | 0 | 1.0111 | 0.0121 | 0.0001 | 0 | 4.0000 | 0 | 4.0000 | 0 |
| Example 79 | 0.900 | 0.100 | 0.970 | 0.030 | 0 | 1.0111 | 0.0121 | 0.0001 | 0 | 0 | 0.0010 | 0.0010 | 0 |
| Example 80 | 0.900 | 0.100 | 0.970 | 0.030 | 0 | 1.0111 | 0.0121 | 0.0001 | 0 | 0 | 4.0000 | 4.0000 | 0 |
| Example 81 | 0.900 | 0.100 | 0.970 | 0.030 | 0 | 1.0111 | 0.0121 | 0.0001 | 0 | 0.0005 | 0.0005 | 0.0010 | 0 |
| Example 82 | 0.900 | 0.100 | 0.970 | 0.030 | 0 | 1.0111 | 0.0121 | 0.0001 | 0 | 0.0100 | 0.0066 | 0.0166 | 0 |
| Example 83 | 0.900 | 0.100 | 0.970 | 0.030 | 0 | 1.0111 | 0.0121 | 0.0001 | 0 | 0.0250 | 0.0066 | 0.0316 | 0 |
| Example 84 | 0.900 | 0.100 | 0.970 | 0.030 | 0 | 1.0111 | 0.0121 | 0.0001 | 0 | 0.0300 | 0.0066 | 0.0366 | 0 |
| Example 85 | 0.900 | 0.100 | 0.970 | 0.030 | 0 | 1.0111 | 0.0121 | 0.0001 | 0 | 2.0000 | 2.0000 | 4.0000 | 0 |
| Example 86 | 0.900 | 0.100 | 0.970 | 0.030 | 0 | 1.0111 | 0.0121 | 0.0001 | 0.0005 | 0.0005 | 0 | 0.0010 | 0 |
| Example 87 | 0.900 | 0.100 | 0.970 | 0.030 | 0 | 1.0111 | 0.0121 | 0.0001 | 2.0000 | 2.0000 | 0 | 4.0000 | 0 |
| Example 88 | 0.900 | 0.100 | 0.970 | 0.030 | 0 | 1.0111 | 0.0121 | 0.0001 | 0.0005 | 0 | 0.0005 | 0.0010 | 0 |
| Example 89 | 0.900 | 0.100 | 0.970 | 0.030 | 0 | 1.0111 | 0.0121 | 0.0001 | 2.0000 | 0 | 2.0000 | 4.0000 | 0 |
| Example 90 | 0.900 | 0.100 | 0.970 | 0.030 | 0 | 1.0111 | 0.0121 | 0.0001 | 0.0034 | 0.0034 | 0.0034 | 0.0102 | 0 |
| Example 91 | 0.900 | 0.100 | 0.970 | 0.030 | 0 | 1.0111 | 0.0121 | 0.0001 | 1.3000 | 1.3000 | 1.3000 | 3.9000 | 0 |

A piezoelectric element according to an example of the present invention was then manufactured.

(Manufacture and Characterization of Piezoelectric Element)

(Piezoelectric Elements according to Examples 1 to 91)

The piezoelectric materials according to Examples 1 to 91 were used to manufacture piezoelectric elements.

A gold electrode having a thickness of 400 nm was formed on the front and back sides of a discoidal ceramic (piezoelectric material) by DC sputtering. A titanium film having a thickness of 30 nm was formed as an adhesion layer between the electrode and the ceramic. The ceramic having the electrodes was cut into a 10 mm×2.5 mm×0.5 mm plate-like piezoelectric element.

A 1.0 kV/mm electric field was applied to the piezoelectric element on a hot plate at a temperature in the range of 60° C. to 150° C. for 30 minutes to perform polarization treatment.

The Curie temperature, the piezoelectric constant $d_{31}$, and the mechanical quality factor (Qm) of each of the piezoelectric elements manufactured using piezoelectric materials according to examples and comparative examples of the present invention were measured after polarization treatment. Table 7 shows the results.

The "phase transition temperature" in the table indicates the presence of a phase transition temperature in the range of 0° C. to 90° C. "Yes" means the presence of a maximum dielectric constant in a very small alternating electric field at a frequency of 1 kHz at a measurement temperature from 0° C. to 90° C. "No" means the absence of the maximum dielectric constant.

The Curie temperature was a temperature at which the relative dielectric constant reached its maximum in a very small alternating electric field at a frequency of 1 kHz.

The piezoelectric constant $d_{31}$ was measured by a resonance-antiresonance method. Table 4 shows its absolute value.

The mechanical quality factor Qm was measured by the resonance-antiresonance method.

Resistivity was measured as a measure of the insulation property. Resistivity was measured using a non-polarizing piezoelectric element. Twenty seconds after a 10 V direct current bias was applied between two electrodes of a piezoelectric element, the resistivity of the piezoelectric element was measured from the leakage current. Table 7 shows the results.

When the resistivity is $1 \times 10^9$ Ω·cm or more, preferably $100 \times 10^9$ Ω·cm or more, the piezoelectric material and the piezoelectric element have a satisfactory practical insulation property. The resistivity [GΩ·cm] in the table represents [$10^9$ Ω·cm].

In all the examples, even when the electrodes were made of baked silver paste, the same characteristics as in the case of the gold electrode were obtained.

Comparative Examples 1 to 24

The comparative metal oxide materials according to Comparative Examples 1 to 24 were used to manufacture comparative elements in the same manner as in Examples 1 to 91.

The elements were tested in the same manner as in Examples 1 to 91. Table 7 shows the results. X in the table means that the comparative element had too low resistivity to evaluate the corresponding item.

TABLE 7-1

|  | $|d_{31}|$ [pm/V] | Qm | Curie temperature [° C.] | Phase transition temperature | Resistivity [GΩ · cm] |
|---|---|---|---|---|---|
| Example 1 | 71.9 | 1362 | 108 | No | 77 |
| Example 2 | 82.9 | 1385 | 102 | No | 73 |
| Example 3 | 73.1 | 1364 | 103 | No | 72 |
| Example 4 | 68.0 | 1379 | 103 | No | 72 |
| Example 5 | 81.2 | 1407 | 105 | No | 75 |
| Example 6 | 74.6 | 1398 | 105 | No | 76 |
| Example 7 | 80.5 | 1369 | 109 | No | 75 |
| Example 8 | 69.5 | 1498 | 108 | No | 77 |
| Example 9 | 72.4 | 1377 | 114 | No | 74 |
| Example 10 | 68.6 | 1402 | 113 | No | 75 |
| Example 11 | 71.2 | 1485 | 116 | No | 74 |
| Example 12 | 60.3 | 1418 | 116 | No | 75 |
| Example 13 | 68.7 | 1350 | 119 | No | 73 |
| Example 14 | 60.1 | 1359 | 120 | No | 73 |
| Example 15 | 79.1 | 1387 | 100 | No | 72 |
| Example 16 | 70.0 | 1356 | 100 | No | 72 |
| Example 17 | 80.9 | 1452 | 102 | No | 76 |
| Example 18 | 70.5 | 1390 | 102 | No | 75 |
| Example 19 | 79.9 | 1413 | 104 | No | 78 |
| Example 20 | 69.0 | 1411 | 104 | No | 75 |
| Example 21 | 64.0 | 1469 | 104 | No | 75 |
| Example 22 | 76.1 | 1351 | 109 | No | 79 |
| Example 23 | 62.3 | 1621 | 110 | No | 79 |
| Example 24 | 72.0 | 1364 | 113 | No | 77 |
| Example 25 | 69.9 | 1444 | 113 | No | 75 |
| Example 26 | 71.1 | 1388 | 115 | No | 72 |
| Example 27 | 60.9 | 1372 | 116 | No | 71 |
| Example 28 | 77.0 | 1409 | 96 | No | 72 |
| Example 29 | 69.2 | 1365 | 97 | No | 73 |
| Example 30 | 81.6 | 1399 | 100 | No | 74 |
| Example 31 | 74.8 | 1413 | 101 | No | 76 |
| Example 32 | 80.7 | 1566 | 102 | No | 73 |
| Example 33 | 69.0 | 1397 | 102 | No | 77 |
| Example 34 | 65.0 | 1380 | 103 | No | 75 |
| Example 35 | 72.8 | 1408 | 107 | No | 79 |
| Example 36 | 61.3 | 1408 | 108 | No | 79 |
| Example 37 | 73.3 | 1485 | 110 | No | 77 |
| Example 38 | 61.2 | 1369 | 111 | No | 76 |
| Example 39 | 68.1 | 1337 | 115 | No | 74 |
| Example 40 | 60.5 | 1511 | 115 | No | 76 |
| Example 41 | 60.2 | 1466 | 120 | No | 70 |
| Example 42 | 60.2 | 1403 | 120 | No | 70 |
| Example 43 | 60.1 | 1386 | 121 | No | 71 |
| Example 44 | 60.5 | 1389 | 107 | No | 75 |
| Example 45 | 72.6 | 1470 | 108 | No | 71 |
| Example 46 | 68.8 | 1002 | 108 | No | 77 |
| Example 47 | 67.5 | 1571 | 108 | No | 77 |
| Example 48 | 61.1 | 1822 | 108 | No | 78 |
| Example 49 | 71.9 | 1530 | 108 | No | 79 |
| Example 50 | 72.1 | 1311 | 108 | No | 78 |
| Example 51 | 72.5 | 1244 | 109 | No | 78 |
| Example 52 | 72.9 | 1201 | 109 | No | 78 |
| Example 53 | 75.0 | 989 | 109 | No | 77 |
| Example 54 | 77.1 | 976 | 109 | No | 77 |
| Example 55 | 78.2 | 1351 | 109 | No | 79 |
| Example 56 | 79.3 | 1003 | 109 | No | 78 |
| Example 57 | 62.4 | 1117 | 111 | No | 76 |
| Example 58 | 66.1 | 998 | 111 | No | 75 |
| Example 59 | 73.4 | 1215 | 102 | No | 102 |
| Example 60 | 70.0 | 1155 | 102 | No | 104 |
| Example 61 | 73.7 | 1190 | 103 | No | 107 |
| Example 62 | 78.0 | 1200 | 105 | No | 115 |
| Example 63 | 73.6 | 1222 | 105 | No | 120 |
| Example 64 | 74.3 | 1225 | 108 | No | 103 |
| Example 65 | 71.5 | 1211 | 108 | No | 106 |
| Example 66 | 69.9 | 1139 | 108 | No | 102 |
| Example 67 | 69.0 | 1160 | 114 | No | 107 |
| Example 68 | 67.9 | 1149 | 113 | No | 105 |
| Example 69 | 68.0 | 1184 | 116 | No | 108 |
| Example 70 | 63.1 | 1129 | 117 | No | 110 |
| Example 71 | 61.8 | 1172 | 120 | No | 106 |
| Example 72 | 60.8 | 1126 | 120 | No | 104 |
| Example 73 | 68.4 | 1109 | 106 | No | 107 |
| Example 74 | 67.7 | 1226 | 104 | No | 109 |
| Example 75 | 66.8 | 1167 | 108 | No | 81 |
| Example 76 | 60.1 | 1143 | 108 | No | 89 |
| Example 77 | 68.1 | 1128 | 108 | No | 82 |
| Example 78 | 61.0 | 1152 | 108 | No | 89 |
| Example 79 | 67.4 | 1113 | 108 | No | 81 |
| Example 80 | 61.7 | 1101 | 108 | No | 87 |
| Example 81 | 66.9 | 1109 | 108 | No | 81 |
| Example 82 | 67.4 | 1139 | 108 | No | 82 |
| Example 83 | 64.4 | 1111 | 108 | No | 121 |
| Example 84 | 62.4 | 1132 | 108 | No | 82 |
| Example 85 | 62.4 | 1146 | 108 | No | 82 |
| Example 86 | 69.0 | 1120 | 108 | No | 82 |
| Example 87 | 62.0 | 1116 | 108 | No | 86 |
| Example 88 | 67.4 | 1139 | 108 | No | 81 |
| Example 89 | 62.1 | 1170 | 108 | No | 85 |
| Example 90 | 66.9 | 1162 | 108 | No | 84 |
| Example 91 | 62.2 | 1147 | 108 | No | 86 |
| Comparative example 1 | 73.1 | 651 | 78 | Yes | 69 |
| Comparative example 2 | 73.1 | 679 | 77 | Yes | 61 |
| Comparative example 3 | 63.0 | 717 | 100 | Yes | 55 |
| Comparative example 4 | 30.2 | 844 | 118 | No | 64 |
| Comparative example 5 | 34.4 | 860 | 124 | No | 62 |
| Comparative example 6 | 27.0 | 857 | 124 | No | 68 |
| Comparative example 7 | 73.9 | 809 | 69 | Yes | 66 |
| Comparative example 8 | 74.9 | 698 | 70 | Yes | 59 |
| Comparative example 9 | 67.3 | 732 | 91 | Yes | 68 |
| Comparative example 10 | 33.5 | 642 | 111 | No | 62 |
| Comparative example 11 | 37.7 | 801 | 113 | Yes | 67 |
| Comparative example 12 | 29.0 | 716 | 114 | No | 60 |
| Comparative example 13 | 77.0 | 621 | 62 | Yes | 62 |
| Comparative example 14 | 77.1 | 599 | 65 | Yes | 55 |
| Comparative example 15 | 67.8 | 683 | 88 | Yes | 68 |
| Comparative example 16 | 34.3 | 755 | 104 | No | 69 |
| Comparative example 17 | 39.0 | 868 | 110 | No | 65 |
| Comparative example 18 | 29.7 | 792 | 110 | No | 61 |
| Comparative example 19 | X | X | X | X | 0.9 |
| Comparative example 20 | 59.1 | 819 | 107 | No | 43 |
| Comparative example 21 | X | X | X | X | 0.8 |
| Comparative example 22 | 70.6 | 294 | 108 | No | 66 |

TABLE 7-1-continued

| | $|d_{31}|$ [pm/V] | Qm | Curie temperature [° C.] | Phase transition temperature | Resistivity [GΩ · cm] |
|---|---|---|---|---|---|
| Comparative example 23 | X | X | X | X | 0.9 |
| Comparative example 24 | 78.2 | 256 | 108 | No | 71 |

The results in Table 7 will be described below.

The piezoelectric elements according to Comparative Examples 1, 2, 7, 8, 13, and 14, which had y of more than 0.04 and a Curie temperature of 80° C. or less, had lower durability than the piezoelectric elements according to Examples 1 to 91.

The piezoelectric elements according to Comparative Examples 3, 9, and 15, which had x of less than 0.05 and a phase transition temperature in the range of 0° C. to 90° C., had lower durability than the piezoelectric elements according to Examples 1 to 91.

The piezoelectric elements according to Comparative Examples 4, 10, and 16, which had x of more than 0.20, had $d_{31}$ of less than 50 [pm/V], which was lower than $d_{31}$ in Examples 1 to 91.

The piezoelectric elements according to Comparative Examples 5, 6, 11, 12, 17, and 18, which had y of less than 0.01, had $d_{31}$ of less than 50 [pm/V], which was lower than $d_{31}$ in Examples 1 to 91.

The piezoelectric element according to Comparative Example 19, which had z of more than 0.04, had a higher sintering temperature and a lower relative density than the piezoelectric elements according to Examples 1 to 91. Thus, the piezoelectric element according to Comparative Example 19 had reduced resistivity and could not be subjected to polarization treatment.

The piezoelectric element according to Comparative Example 20, which had a lower than 0.9925+b, had an average equivalent circular diameter of 17.70 w, which was greater than the average equivalent circular diameters in Examples 1 to 91, indicating the growth of abnormal grains. Thus, the piezoelectric element according to Comparative Example 20 had very low mechanical strength.

The piezoelectric element according to Comparative Example 21, which had a higher than 1.0025+b, had excessively lower grain growth and a lower relative density than the piezoelectric elements according to Examples 1 to 91. Thus, the piezoelectric element according to Comparative Example 21 had low resistivity and could not be subjected to polarization treatment.

The piezoelectric element according to Comparative Example 22, which had b of less than 0.0048, had Qm of much less than 400, which was lower than Qm in Examples 1 to 91. Thus, the piezoelectric element according to Comparative Example 22 had very low operation efficiency.

The piezoelectric element according to Comparative Example 23, which had b of more than 0.0400, had much lower resistivity than the piezoelectric elements according to Examples 1 to 91. Thus, the piezoelectric element according to Comparative Example 23 could not be subjected to polarization treatment. This is because of the occurrence of a heterophase that does not contribute to the piezoelectric property.

The piezoelectric element according to Comparative Example 24, which had a Mg content of much more than 0.1000 parts by weight, had Qm of much less than 400, which was lower than Qm in Examples 1 to 91. Thus, the piezoelectric element according to Comparative Example 24 had very low operation efficiency.

The piezoelectric elements according to Examples 59 to 91, which contained the third auxiliary component, had a resistivity of $80 \times 10^9$ Ω·cm or more, which was higher than the resistivity of the piezoelectric elements according to Examples 1 to 58, which did not contain the third auxiliary component. Thus, the piezoelectric elements according to Examples 59 to 91 are desired piezoelectric elements.

The piezoelectric elements according to Examples 59 to 74 and 83, which had a weight ratio G1/G2 of the weight G1 of Si to the weight G2 of B of the third auxiliary component in the range of 2.0≤G1/G2≤3.8, had a resistivity of $100 \times 10^9$ Ω·cm or more, which was higher than the resistivity of the piezoelectric elements according to Examples 75 to 82 and 84 to 91. Thus, the piezoelectric elements according to Examples 59 to 74 and 83 are suitable piezoelectric elements.

Examples 1 to 14 and 44 to 54, which had a relatively low maximum sintering temperature of 1300° C., can provide satisfactory piezoelectric materials and piezoelectric elements. This is probably because z=0 results in a high grain growth rate.

(Evaluation of Durability of Piezoelectric Element)

In order to examine the durability of a piezoelectric element, the piezoelectric elements according to Examples 1 to 14, 20, 33, 65, 73, and 74 and Comparative Examples 1, 3, 7, 9, 11, 13, and 15 were subjected to a cycle test in a thermostat. A hundred of temperature cycles of 25° C.→0° C.→50° C.→25° C. were performed. Table 8 shows the rate of change in piezoelectric constant $d_{31}$ in the cycle test.

The rate of change was calculated by {[(piezoelectric constant after cycle test)−(piezoelectric constant before cycle test)]/(piezoelectric constant before cycle test)}×100.

TABLE 8

| | Phase transition temperature | Piezoelectric constant before cycle test $|d_{31}|$ [pC/N] | Piezoelectric constant after cycle test $|d_{31}|$ [pC/N] | Rate of change [%] |
|---|---|---|---|---|
| Example 1 | No | 71.9 | 69.9 | −2.8 |
| Example 2 | No | 82.9 | 80.0 | −3.5 |
| Example 3 | No | 73.1 | 71.3 | −2.4 |
| Example 4 | No | 68.0 | 65.6 | −3.5 |
| Example 5 | No | 81.2 | 78.6 | −3.2 |
| Example 6 | No | 74.6 | 71.5 | −4.1 |
| Example 7 | No | 80.5 | 76.9 | −4.5 |
| Example 8 | No | 69.5 | 66.8 | −3.8 |
| Example 9 | No | 72.4 | 69.6 | −3.8 |
| Example 10 | No | 68.6 | 65.9 | −4.0 |
| Example 11 | No | 71.2 | 68.6 | −3.6 |
| Example 12 | No | 60.3 | 58.4 | −3.1 |
| Example 13 | No | 68.7 | 65.8 | −4.2 |
| Example 14 | No | 60.1 | 57.8 | −3.9 |
| Example 20 | No | 69.0 | 66.4 | −3.7 |
| Example 33 | No | 69.0 | 65.8 | −4.6 |
| Example 65 | No | 71.5 | 68.1 | −4.8 |
| Example 73 | No | 68.4 | 66.1 | −3.3 |
| Example 74 | No | 67.7 | 65.5 | −3.2 |
| Comparative example 1 | Yes | 73.1 | 54.5 | −25.5 |
| Comparative example 3 | Yes | 63.0 | 46.9 | −25.6 |
| Comparative example 7 | Yes | 73.9 | 56.6 | −23.4 |
| Comparative example 9 | Yes | 67.3 | 50.9 | −24.4 |

TABLE 8-continued

| | Phase transition temperature | Piezoelectric constant before cycle test $|d_{31}|$ [pC/N] | Piezoelectric constant after cycle test $|d_{31}|$ [pC/N] | Rate of change [%] |
|---|---|---|---|---|
| Comparative example 11 | Yes | 37.7 | 29.6 | −21.6 |
| Comparative example 13 | Yes | 77.0 | 61.4 | −20.3 |
| Comparative example 15 | Yes | 67.8 | 52.5 | −22.5 |

The rate of change in piezoelectric constant of each of the piezoelectric elements according to Comparative Examples 1, 3, 7, 9, 11, 13, and 15 was much more than −10%, which was much greater than the rates of change in piezoelectric constant of the piezoelectric elements according to Examples 1 to 14, 20, 33, 65, 73, and 74. Thus, the piezoelectric elements according to Comparative Examples 1, 3, 7, 9, 11, 13, and 15 had insufficient durability.

(Manufacture and Evaluation of Multilayered Piezoelectric Element)

A multilayered piezoelectric element according to an example of the present invention was manufactured.

Example 92

A raw material having the composition $(Ba_{0.900}Ca_{0.100})_{1.0111}(Ti_{0.970}Sn_{0.030})O_3$, which is represented by the general formula $(Ba_{1-x}Ca_x)_a(Ti_{1-y-z}Sn_yZr_z)O_3$, wherein x=0.100, y=0.030, z=0, and a=1.0111, was weighed as described below.

Barium carbonate having a purity of 99.999% or more, calcium carbonate having a purity of 99.999% or more, titanium oxide having a purity of 99.999% or more, and tin oxide having a purity of 99.999% or more were weighed as raw materials of the main component such that Ba, Ca, Ti, and Sn satisfied the composition $(Ba_{0.900}Ca_{0.100})_{1.0111}(Ti_{0.970}Sn_{0.030})O_3$.

Manganese dioxide was weighed such that the amount b (mol) of the first auxiliary component Mn on a metal basis was 0.0121 mol per mole of the composition $(Ba_{0.900}Ca_{0.100})_{1.0111}(Ti_{0.970}Sn_{0.030})O_3$.

Silicon dioxide was weighed as a third auxiliary component such that the amount of Si on a metal basis was 0.0140 parts by weight per 100 parts by weight of the composition $(Ba_{0.900}Ca_{0.100})_{1.0111}(Ti_{0.970}Sn_{0.030})O_3$. Boron oxide was weighed as a third auxiliary component such that the amount of B on a metal basis was 0.0066 parts by weight per 100 parts by weight of the composition $(Ba_{0.900}Ca_{0.100})_{1.0111}(Ti_{0.970}Sn_{0.030})O_3$.

The weighed powders were mixed with PVB and were formed into a green sheet having a thickness of 50 μm by a doctor blade method.

An electrically conductive paste for an internal electrode was applied to the green sheet. The electrically conductive paste was a 70% Ag-30% Pd alloy (Ag/Pd=2.33) paste. Nine green sheets to which the electrically conductive paste had been applied were stacked and were fired at 1200° C. for five hours to yield a sintered body.

The composition of the piezoelectric material of the sintered body thus produced was analyzed by ICP spectroscopy. The piezoelectric material was mainly composed of a metal oxide having the chemical formula $(Ba_{0.900}Ca_{0.100})_{1.0111}(Ti_{0.970}Sn_{0.030})O_3$. One mol of the main component contained 0.0121 mol of Mn. 100 parts by weight of the main component contained 0.0001 parts by weight of Mg.

With respect to the other metals, the weighed composition agreed with the composition after sintering. Elements other than Ba, Ca, Ti, Sn, Mn, Mg, Si, and B were below the detection limits of ICP spectroscopy.

The sintered body was cut into a 10 mm×2.5 mm piece. The side surface of the piece was polished. A pair of external electrodes (a first electrode and a second electrode) for alternately connecting internal electrodes were formed by Au sputtering. Thus, a multilayered piezoelectric element as illustrated in FIG. 2B was manufactured. The multilayered piezoelectric element included nine piezoelectric material layers and eight internal electrodes.

The observation of the internal electrodes of the multilayered piezoelectric element showed that the electrode material Ag—Pd and the piezoelectric material were alternately stacked on top of one another.

Before the evaluation of piezoelectricity, a sample was subjected to polarization treatment. More specifically, the sample was heated to a temperature in the range of 100° C. to 150° C. on a hot plate. While a voltage of 1.4 kV/mm was applied between the first electrode and the second electrode for 30 minutes, the sample was cooled to room temperature.

The evaluation of the piezoelectricity of the multilayered piezoelectric element showed that the multilayered piezoelectric element had a satisfactory insulation property and had a satisfactory piezoelectric property similar to the piezoelectric material according to Example 1.

Example 93

A multilayered piezoelectric element was manufactured in the same manner as in Example 92 except that the raw materials of the main component were barium titanate having a purity of 99.999% or more, calcium titanate having a purity of 99.999% or more, and barium stannate having a purity of 99.999% or more. The value a representing the ratio of the number of moles of Ba and Ca at the A site to the number of moles of Ti and Sn at the B site was controlled with barium oxalate and calcium oxalate.

The composition of the piezoelectric material of the sintered body produced during the manufacture of the multilayered piezoelectric element was analyzed by ICP spectroscopy. The piezoelectric material was mainly composed of a metal oxide having the chemical formula $(Ba_{0.900}Ca_{0.100})_{1.0111}(Ti_{0.970}Sn_{0.030})O_3$. One mol of the main component contained 0.0121 mol of Mn. 100 parts by weight of the main component contained 0.0001 parts by weight of Mg. With respect to the other metals, the weighed composition agreed with the composition after sintering. Elements other than Ba, Ca, Ti, Sn, Mn, and Mg were below the detection limits of ICP spectroscopy.

The multilayered piezoelectric element included nine piezoelectric material layers and eight internal electrodes. The evaluation of the piezoelectricity of the multilayered piezoelectric element showed that the multilayered piezoelectric element had satisfactory insulation property and better piezoelectric property than Example 92 by 5% or more. This is probably because the raw materials were perovskite type metal oxides, which promoted grain growth, resulting in the high-density multilayered piezoelectric element.

Comparative Example 25

A multilayered piezoelectric element was manufactured in the same manner as in Example 92 except that the composition was the same as in Comparative Example 19, the firing temperature was 1300° C., and the internal electrodes were made of a 95% Ag-5% Pd alloy (Ag/Pd=19).

The internal electrodes were observed with a scanning electron microscope. The observation showed that the internal electrodes were melted and interspersed as islands. Thus, the internal electrodes were not conductive, and the multilayered piezoelectric element was not polarized. Thus, the piezoelectric constant could not be measured.

Comparative Example 26

A multilayered piezoelectric element was manufactured in the same manner as in Comparative Example 25 except that the internal electrodes were made of a 5% Ag-95% Pd alloy (Ag/Pd=0.05).

The internal electrodes were observed with a scanning electron microscope. The observation showed that sintering of the electrode material Ag—Pd was insufficient. Thus, the internal electrodes were not conductive, and the multilayered piezoelectric element was not polarized. Thus, the piezoelectric constant could not be measured.

Comparative Example 27

A multilayered piezoelectric element was manufactured in the same manner as in Comparative Example 25 except that the internal electrodes were made of a 70% Ag-30% Pd alloy (Ag/Pd=2.33).

The internal electrodes were observed with a scanning electron microscope. Although the electrode material Ag—Pd and the piezoelectric material were alternately stacked on top of one another, resistivity between a pair of external electrodes of the multilayered piezoelectric element was as low as $1 \times 10^8$ Ω·cm or less because of insufficient sintering of the piezoelectric material. Thus, the multilayered piezoelectric element was not polarized, and the piezoelectric constant could not be measured.

Example 94

A liquid discharge head illustrated in FIGS. 3A and 3B was manufactured using a piezoelectric element manufactured using the piezoelectric material according to Example 1. An ink was discharged in response to the input of an electric signal.

Example 95

A liquid discharge apparatus illustrated in FIG. 4 was manufactured using the liquid discharge head according to Example 94. An ink was discharged onto a recording medium in response to the input of an electric signal.

Example 96

An ultrasonic motor illustrated in FIG. 6A was manufactured using a piezoelectric element manufactured using the piezoelectric material according to Example 1. Upon the application of an alternating voltage, the motor rotated.

Example 97

An optical apparatus illustrated in FIGS. 7A and 7B was manufactured using the ultrasonic motor according to Example 96. Upon the application of an alternating voltage, automatic focusing was observed.

Example 98

A dust removing device illustrated in FIGS. 9A and 9B was manufactured using a piezoelectric element manufactured using the piezoelectric material according to Example 1. Upon the application of an alternating voltage after plastic beads were scattered, satisfactory dust removing efficiency was observed.

Example 99

An image pickup apparatus illustrated in FIG. 12 was manufactured using the dust removing device according to Example 98. Dust on a surface of an image pickup element unit was satisfactorily removed, and images free of dust defects were obtained.

Example 100

A liquid discharge head illustrated in FIGS. 3A and 3B was manufactured using the multilayered piezoelectric element according to Example 92. An ink was discharged in response to the input of an electric signal.

Example 101

A liquid discharge apparatus illustrated in FIG. 4 was manufactured using the liquid discharge head according to Example 100. An ink was discharged onto a recording medium in response to the input of an electric signal.

Example 102

An ultrasonic motor illustrated in FIG. 6B was manufactured using the multilayered piezoelectric element according to Example 92. Upon the application of an alternating voltage, the motor rotated.

Example 103

An optical apparatus illustrated in FIGS. 7A and 7B was manufactured using the ultrasonic motor according to Example 102. Upon the application of an alternating voltage, automatic focusing was observed.

Example 104

A dust removing device illustrated in FIGS. 9A and 9B was manufactured using the multilayered piezoelectric element according to Example 92. Upon the application of an alternating voltage after plastic beads were scattered, satisfactory dust removing efficiency was observed.

Example 105

An image pickup apparatus illustrated in FIG. 12 was manufactured using the dust removing device according to Example 104. Dust on a surface of an image pickup element unit was satisfactorily removed, and images free of dust defects were obtained.

Example 106

An electronic device illustrated in FIG. 14 was manufactured using the multilayered piezoelectric element according to Example 92. Upon the application of an alternating voltage, a loudspeaker operated.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-242895, filed Nov. 2, 2012, which is hereby incorporated by reference herein in its entirety.

INDUSTRIAL APPLICABILITY

A piezoelectric material according to an embodiment of the present invention has a high and stable piezoelectric constant and a high mechanical quality factor in a wide operating temperature range. The piezoelectric ceramic contains no lead and can reduce the load on the environment. Thus, the piezoelectric material can be used for apparatuses manufactured using a large amount of piezoelectric material, such as liquid discharge heads, ultrasonic motors, and dust removing devices, without problems.

REFERENCE SIGNS LIST 1 first electrode
2 piezoelectric material
3 second electrode
101 piezoelectric element
102 individual liquid chamber
103 diaphragm
104 liquid chamber partition wall
105 discharge port
106 communicating hole
107 common liquid chamber
108 buffer layer
1011 first electrode
1012 piezoelectric material
1013 second electrode
201 oscillator
202 rotor
203 output shaft
204 oscillator
205 rotor
206 spring
2011 elastic ring
2012 piezoelectric element
2013 organic adhesive
2041 metal elastic body
2042 multilayered piezoelectric element
310 dust removing device
320 diaphragm
330 piezoelectric element
331 piezoelectric material
332 first electrode
333 second electrode
336 first electrode surface
337 second electrode surface
51 first electrode
53 second electrode
54 piezoelectric material layer
55 internal electrode
56 multilayered body
501 first electrode
503 second electrode
504 piezoelectric material layer
505a internal electrode
505b internal electrode
506a external electrode
506b external electrode
601 camera main body
602 mount
605 mirror box
606 main mirror
200 shutter unit
300 main body chassis
400 image pickup element unit
701 front lens group lens
702 rear lens group lens (focus lens)
711 removable mount
712 fixed barrel
713 linear guide barrel
714 front lens group barrel
715 cam ring
716 rear lens group barrel
717 cam roller
718 screw
719 roller
720 rotation transmitting ring
722 driven roller
724 manual focus ring
725 ultrasonic motor
726 wave washer
727 ball race
728 focus key
729 joint member
732 washer
733 low-friction sheet
881 liquid discharge apparatus
882 exterior
883 exterior
884 exterior
885 exterior
887 exterior
890 recovering section
891 recording portion
892 carriage
896 main body of apparatus
897 automatic feeder
898 outlet
899 conveying unit
901 optical device
908 release button
909 electronic flash unit
912 loudspeaker
914 microphone
916 fill light unit
931 main body
932 zoom lever
933 power switch Advantageous Effects of Invention The present invention can provide a lead-free piezoelectric material having a high and stable piezoelectric constant and a high mechanical quality factor in a wide operating temperature range.

The present invention can also provide a piezoelectric element, a multilayered piezoelectric element, a liquid discharge head, a liquid discharge apparatus, an ultrasonic motor, an optical apparatus, a vibratory apparatus, a dust removing device, an image pickup apparatus, and electronic equipment, each including the piezoelectric material.

The invention claimed is:

1. A piezoelectric material, comprising:
a perovskite type metal oxide having the following general formula (1);
an Mn content; and
an Mg content,
wherein b is a number of moles of the Mn content on a metal basis per mole of the perovskite type metal oxide, b is in the range of 0.0048≤b≤0.0400, and the Mg content on a metal basis per 100 parts by weight of the perovskite type metal oxide is 0.100 parts by weight or less, except 0 parts by weight

$$(Ba_{1-x}Ca_x)_a(Ti_{1-y-z}Sn_yZr_z)O_3 \quad (1)$$

wherein x is in the range of 0.050≤x≤0.200, y is in the range of 0.010≤y≤0.040, and z is in the range of 0≤z≤0.040, provided that x≥0.375(y+z)+0.050, and a is in the range of 0.9925+b≤a≤1.0025+b, provided that b is in the range of 0.0048≤b≤0.0400.

2. The piezoelectric material according to claim 1, wherein the perovskite type metal oxide has the following general formula (2), which corresponds to the general formula (1) in which z=0

$$(Ba_{1-x}Ca_x)_a(Ti_{1-y}Sn_y)O_3 \quad (2)$$

wherein x is in the range of 0.050≤x≤0.200, and y is in the range of 0.010≤y≤0.040, provided that x≥0.375y+0.050, and a is in the range of 0.9925+b≤a≤1.0025+b, provided that b is in the range of 0.0048≤b≤0.0400.

3. The piezoelectric material according to claim 1, further comprising an auxiliary component containing at least one selected from the group consisting of Cu, B, and Si, wherein the auxiliary component content on a metal basis is 0.001 parts by weight or more and 4.000 parts by weight or less per 100 parts by weight of the perovskite type metal oxide.

4. The piezoelectric material according to claim 1, wherein the piezoelectric material contains crystal grains having an average equivalent circular diameter of 1 μm or more and 10 μm or less, and crystal grains having an equivalent circular diameter of 25 μm or less constitute 99 percent by number or more of the total crystal grains.

5. The piezoelectric material according to claim 1, wherein the piezoelectric material has a relative density of 90% or more and 100% or less.

6. A piezoelectric element, comprising: a first electrode; a piezoelectric material; and a second electrode, wherein the piezoelectric material is the piezoelectric material according to claim 1.

7. A liquid discharge head, comprising: a liquid chamber; and a discharge port in communication with the liquid chamber, wherein the liquid chamber has a vibrating unit that includes the piezoelectric element according to claim 6.

8. A liquid discharge apparatus, comprising: a recording medium conveying unit; and the liquid discharge head according to claim 7.

9. An ultrasonic motor, comprising: a vibrating member that includes the piezoelectric element according to claim 6; and a moving body in contact with the vibrating member.

10. An optical apparatus, comprising a drive unit that includes the ultrasonic motor according to claim 9.

11. A vibratory apparatus, comprising a vibrating member that includes the piezoelectric element according to claim 6.

12. A dust removing device, comprising a vibrating unit that includes the vibratory apparatus according to claim 11 disposed on a diaphragm.

13. An image pickup apparatus, comprising: the dust removing device according to claim 12; and an image pickup element unit, wherein the diaphragm of the dust removing device and a light-receiving surface of the image pickup element unit are disposed on the same axis, and the dust removing device faces the light-receiving surface of the image pickup element unit.

14. Electronic equipment, comprising a piezoelectric acoustic component that includes the piezoelectric element according to claim 6.

15. A multilayered piezoelectric element, comprising: piezoelectric material layers and electrode layers alternately stacked on top of one another, the electrode layers including an internal electrode, wherein the piezoelectric material layers are made of the piezoelectric material according to claim 1.

16. The multilayered piezoelectric element according to claim 15, wherein the internal electrode contains Ag and Pd, and the weight ratio M1/M2 of the weight M1 of Ag to the weight M2 of Pd is in the range of 1.5≤M1/M2≤9.0.

17. A liquid discharge head, comprising: a liquid chamber; and a discharge port in communication with the liquid chamber, wherein the liquid chamber has a vibrating unit that includes the multilayered piezoelectric element according to claim 15.

18. A liquid discharge apparatus, comprising: a recording medium conveying unit; and the liquid discharge head according to claim 17.

19. An ultrasonic motor, comprising: a vibrating member that includes the multilayered piezoelectric element according to claim 15; and a moving body in contact with the vibrating member.

20. An optical apparatus, comprising a drive unit that includes the ultrasonic motor according to claim 19.

21. A vibratory apparatus, comprising a vibrating member that includes the multilayered piezoelectric element according to claim 15.

22. A dust removing device, comprising a vibrating unit that includes the vibratory apparatus according to claim 21 disposed on a diaphragm.

23. An image pickup apparatus, comprising: the dust removing device according to claim 22; and an image pickup element unit, wherein the diaphragm of the dust removing device and a light-receiving surface of the image pickup element unit are disposed on the same axis, and the dust removing device faces the light-receiving surface of the image pickup element unit.

24. Electronic equipment, comprising a piezoelectric acoustic component that includes the multilayered piezoelectric element according to claim 15.

25. A piezoelectric material, comprising:
an oxide containing Ba, Ca, Ti, Sn, and Zr, or an oxide containing Ba, Ca, Ti and Sn;
an Mn content; and
an Mg content,
wherein a value x, which is a molar ratio of Ca to the sum of the number of moles of Ba and Ca, is in a range of 0.050≤x≤0.200,
a value y, which is a molar ratio of Sn to the sum of the number of moles of Ti, Sn, and Zr, is in a range of 0.010<y≤0.040, and
a value z, which is a molar ratio of Zr to the sum of the number of moles of Ti, Sn, and Zr, is in a range of 0≤z≤0.040,
wherein a value b, which is a number of moles of the Mn content on a metal basis per mole of the oxide containing Ba, Ca, Ti, Sn, and Zr or the oxide containing Ba, Ca and Ti, is in a range of 0.0048≤x≤0.0400, wherein the Mg content is 0.100 parts by weight or less, except 0 parts by weight on an oxide basis per 100 parts by weight of the oxide containing Ba, Ca, Ti, Sn, and Zr or the oxide containing Ba, Ca and Ti, and wherein $x \geq 0.375(y+z)+0.050$.

26. A piezoelectric element comprising:
a first electrode;
a piezoelectric material portion; and
a second electrode,
wherein the piezoelectric material portion comprises the piezoelectric material according to claim 25.

27. An electronic apparatus comprising:
the piezoelectric element according to claim 26.

28. A multilayered piezoelectric element comprising:
piezoelectric material layers; and
electrode layers including an internal electrode,
wherein the piezoelectric material layers and the electrode layers are alternately stacked, and
the piezoelectric material layers comprise the piezoelectric material according to claim 25.

29. An electronic apparatus comprising:
the multilayered piezoelectric element according to claim 28.

* * * * *